(12) United States Patent
Jung et al.

(10) Patent No.: US 12,509,627 B2
(45) Date of Patent: Dec. 30, 2025

(54) NANO COMPOSITE, A NANOPARTICLE INK COMPOSITION INCLUDING SAME, AND A LIGHT-EMITTING DEVICE INCLUDING THE NANOPARTICLE INK COMPOSITION

(71) Applicant: Samsung Display Co., Ltd., Yongin-si (KR)

(72) Inventors: Yunku Jung, Yongin-si (KR); Hyunmi Doh, Yongin-si (KR); Jaekook Ha, Yongin-si (KR); Sungwoon Kim, Yongin-si (KR); Jongwoo Shin, Yongin-si (KR); Hyekyoung Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1042 days.

(21) Appl. No.: 17/561,604

(22) Filed: Dec. 23, 2021

(65) Prior Publication Data

US 2022/0204837 A1 Jun. 30, 2022

(30) Foreign Application Priority Data

Dec. 24, 2020 (KR) .......................... 10-2020-0183705

(51) Int. Cl.
*C09K 11/02* (2006.01)
*B82Y 20/00* (2011.01)
(Continued)

(52) U.S. Cl.
CPC .............. *C09K 11/025* (2013.01); *C01G 9/02* (2013.01); *C09D 11/033* (2013.01);
(Continued)

(58) Field of Classification Search
CPC ......... B82Y 20/00; B82Y 30/00; B82Y 40/00; C09D 11/033; C09D 11/037; H10K 50/115
See application file for complete search history.

(56) References Cited

U.S. PATENT DOCUMENTS 12,173,209 B2 * 12/2024 Jung .................... H10K 50/115
2004/0225122 A1 11/2004 Thummel et al.
(Continued)

FOREIGN PATENT DOCUMENTS

CN 109599496 A 4/2019
JP 2021005479 A * 1/2021
(Continued)

OTHER PUBLICATIONS

Hu et al., Analytica Chimica Acta 812 (2014) 191-198.*
(Continued)

*Primary Examiner* — Vu A Nguyen
(74) *Attorney, Agent, or Firm* — Womble Bond Dickinson (US) LLP

(57) ABSTRACT

A nano composite, a nanoparticle ink composition including a solvent and the nanocomposite, and a light-emitting device including a first electrode, a second electrode facing the first electrode, and an interlayer between the first electrode and the second electrode, wherein the interlayer includes an emission layer, and at least one layer included in the interlayer is made from the nanoparticle ink composition. The nano composite includes: a metal oxide nanoparticle; and a chelating ligand bonded to a surface of the nanoparticle and including a cyclic moiety.

22 Claims, 6 Drawing Sheets

(51) Int. Cl.
- *B82Y 40/00* (2011.01)
- *C01G 9/02* (2006.01)
- *C09D 11/033* (2014.01)
- *C09D 11/037* (2014.01)
- *C09D 11/50* (2014.01)
- *C09K 11/54* (2006.01)
- *H10K 50/115* (2023.01)
- *H10K 50/16* (2023.01)

(52) U.S. Cl.
CPC ............ *C09D 11/037* (2013.01); *C09D 11/50* (2013.01); *C09K 11/54* (2013.01); *H10K 50/115* (2023.02); *H10K 50/16* (2023.02); *B82Y 20/00* (2013.01); *B82Y 40/00* (2013.01)

(56) References Cited

U.S. PATENT DOCUMENTS

| | | | |
|---|---|---|---|
| 2008/0176986 A1* | 7/2008 | Burgard | C01G 9/02 524/432 |
| 2018/0346741 A1* | 12/2018 | Pan | C09D 11/037 |
| 2021/0040388 A1* | 2/2021 | Won | C09K 11/70 |

FOREIGN PATENT DOCUMENTS

| | | | |
|---|---|---|---|
| JP | 2021024873 A | * | 2/2021 |
| JP | 2021096947 A | * | 6/2021 |
| KR | 10-2012-0028670 A | | 3/2012 |
| KR | 10-2015-0121355 A | | 10/2015 |
| KR | 101740429 B1 | | 5/2017 |
| KR | 10-2020-0026163 A | | 3/2020 |
| KR | 10-2020-0136244 A | | 12/2020 |
| KR | 20200136244 A | * | 12/2020 |
| WO | WO-2017028640 A1 | * | 2/2017 ............ C09D 11/03 |

OTHER PUBLICATIONS

Machine-generated English-language translation of JP-2021096947-A.*
Machine-generated English-language translation of KR 10-20200136244-A.*
Choi et al., Journal of the Korean Physical Society, vol. 76, No. 12, Jun. 2020, pp. 1121-1126.*
Son et al., Nanomaterials 2020, 10, 2498.*
Ritchhart et al., Langmuir 2020, 36, 9944-9951.*
Singh, A.K., et al. "Synthesis, Effect of Capping Agents, Structural, Optical and Photoluminescence Properties of Zno Nanoparticles." Journal of Luminescence, vol. 129, No. 8, 2009, pp. 874-878.
Xu, Hui, et al. "Recent Progress in Metal-Organic Complexes for Optoelectronic Applications." Chem. Soc. Rev., vol. 43, No. 10, 2014, pp. 3259-3302.

* cited by examiner

NANO COMPOSITE, A NANOPARTICLE INK COMPOSITION INCLUDING SAME, AND A LIGHT-EMITTING DEVICE INCLUDING THE NANOPARTICLE INK COMPOSITION

CROSS-REFERENCE TO RELATED APPLICATION

This application claims priority from and the benefit of Korean Patent Application No. 10-2020-0183705, filed on Dec. 24, 2020, which is hereby incorporated by reference for all purposes as if fully set forth herein.

BACKGROUND

Field

Embodiments of the invention relate generally to display devices and, more particularly, to a nano composite, a nanoparticle ink composition including the same, and a light-emitting device including the nanoparticle ink composition.

Discussion of the Background

Light-emitting devices convert electrical energy into light energy. Examples of the light-emitting devices include an organic light-emitting device in which a light-emitting material is an organic material, a quantum dot light-emitting device in which a light-emitting material is a quantum dot, and the like.

A light-emitting device may have a structure in which a first electrode, a hole transport region, an emission layer, an electron transport region, and a second electrode are sequentially formed. Holes provided from the first electrode may move toward the emission layer through the hole transport region, and electrons provided from the second electrode may move toward the emission layer through the electron transport region. The holes and the electrons recombine in the emission layer to produce excitons. These excitons transition from an excited state to a ground state to thereby generate light.

The above information disclosed in this Background section is only for understanding of the background of the inventive concepts, and, therefore, it may contain information that does not constitute prior art.

SUMMARY

A nano composite, and a nanoparticle ink composition including the same and a light-emitting device including the nanoparticle ink composition constructed according to the principles and illustrative implementations of the invention are capable of providing stable ink compositions, which are particularly advantageous for use in a light-emitting device having a high possibility of quantum dot quenching. Stability may be secured by introducing a chelating ligand including an anchoring site having strong binding force with a metal oxide nanoparticle into the nano composite to prevent aggregation of metal oxide nanoparticles. Accordingly, direct contact between the quantum dot and the nano composite is minimized to suppress quantum dot quenching.

Additional features of the inventive concepts will be set forth in the description which follows, and in part will be apparent from the description, or may be learned by practice of the inventive concepts.

According to one aspect of the invention, a nano composite includes: a metal oxide nanoparticle; and a chelating ligand bonded to a surface of the nanoparticle and including a cyclic moiety.

The cyclic moiety may be a delocalized group.

The cyclic moiety may be a π electron-deficient nitrogen-containing $C_1$-$C_{60}$ cyclic group.

The chelating ligand may include two or more anchoring sites bonded to the surface of the nanoparticle.

The chelating ligand may be a group of Formulae 1-1 to 1-4, as defined herein.

The chelating ligand may be at least one of a Ligand 1 to Ligand 6, as described herein.

The chelating ligand may have length of about 1.5 nm or less.

The nano composite may further include a monodentate ligand bonded to the surface of the nanoparticle.

The monodentate ligand may include a pyridine group, an imidazole group, an oxazole group, or any combination thereof.

The metal oxide nanoparticle may include ZnO, ZnMgO, ZnAlO, $TiO_2$, or any combination thereof.

A nanoparticle ink composition may include: a solvent; and the nano composite as described above, wherein the nano composite may be substantially dispersed in the solvent.

The solvent may include an alcohol-based solvent, an ether-based solvent, an aliphatic hydrocarbon solvent, an aromatic hydrocarbon solvent, or any combination thereof.

The nanoparticle ink composition may have a viscosity at 25° C. of about 1 cP or more and about 10 cP or less.

The nanoparticle ink composition at 25° C. may have a surface tension from about 20 dyne/cm to about 40 dyne/cm.

A light-emitting device may include: a first electrode; a second electrode facing the first electrode; and an interlayer between the first electrode and the second electrode, wherein the interlayer may include an emission layer, and at least one layer included in the interlayer is made from the nanoparticle ink composition as described above.

The interlayer further may include a hole transport region between the first electrode and the emission layer and an electron transport region between the emission layer and the second electrode.

The hole transport region may include a hole injection layer, a hole transport layer, an emission auxiliary layer, an electron blocking layer, or any combination thereof, the electron transport region may include a buffer layer, a hole blocking layer, an electron control layer, an electron transport layer, an electron injection layer, or any combination thereof, and at least one layer included in the hole transport region and the electron transport region may be made from the nanoparticle ink composition.

The electron transport region may include an electron transport layer, and the electron transport layer is made from the nanoparticle ink composition.

The emission layer may include a quantum dot.

The quantum dot may include a semiconductor compound of Groups III-VI, a semiconductor compound of Groups II-VI, a semiconductor compound of Groups III-V, a semiconductor compound of Groups I-III-VI, a semiconductor compound of Groups IV-VI, an element or a compound of Group IV, or any combination thereof.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
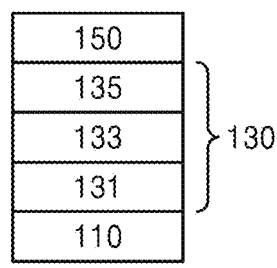
FIG. 1 is a schematic cross-sectional view of an embodiment of a light-emitting device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, or a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. The term "consist of" used herein refers to the existence of only the corresponding component while excluding the possibility that other components are added. For example, the wording "consist of A, B and C" refers to the existence of only A, B and C. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Nano Composite

A nano composite according to an aspect may include: a metal oxide nanoparticle; and a chelating ligand bonded to a surface of the nanoparticle (i.e., metal oxide nanoparticle) and including a cyclic moiety. The cyclic moiety may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, the cyclic moiety may be a delocalized group. In an embodiment, the cyclic moiety may be a $C_6$-$C_{60}$ aryl group unsubstituted or substituted with at least one $R_{10a}$ or a $C_1$-$C_{60}$ heteroaryl group unsubstituted or substituted with at least one $R_{10a}$. In an embodiment, the cyclic moiety may be a π electron-deficient nitrogen-containing $C_1$-$C_{60}$ cyclic group. The π electron-deficient nitrogen-containing $C_1$-$C_{60}$ cyclic group is the same as described herein.

In an embodiment, the chelating ligand may include two or more anchoring sites bonded to the surface of the nanoparticle. Here, the anchoring site is a site that allows a ligand to be adsorbed onto a nanoparticle when the ligand is coordinated to the nanoparticle. In an embodiment, the anchoring site may be a moiety represented by *=N—*', *—N=*', *—OH, or trivalent N. The chelating ligand may include two or more moieties represented by *=N—*', *—N=*', *—OH, or trivalent N.

In an embodiment, the chelating ligand may be selected from groups represented by Formulae 1-1 to 1-4.

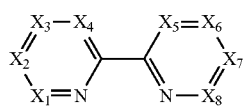

Formula 1-1

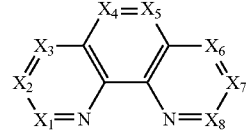

Formula 1-2

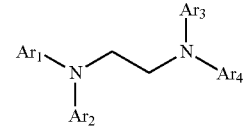

Formula 1-3

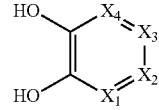

Formula 1-4 wherein, in Formulae 1-1 to 1-4, $X_1$ may be $C(R_1)$ or N, $X_2$ may be $C(R_2)$ or N, $X_3$ may be $C(R_3)$ or N, $X_4$ may be $C(R_4)$ or N, $X_5$ may be $C(R_5)$ or N, $X_6$ may be $C(R_6)$ or N, $X_7$ may be $C(R_7)$ or N, and $X_8$ may be $C(R_8)$ or N, $R_1$ to $R_8$ and $Ar_1$ to $Ar_4$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si$(Q_1)(Q_2)(Q_3)$, —N$(Q_1)(Q_2)$, —B$(Q_1)(Q_2)$, —C(=O)$(Q_1)$, —S(=O)$_2(Q_1)$, or —P(=O)$(Q_1)(Q_2)$, at least one of $Ar_1$ to $Ar_4$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be: deuterium (-D), —F, —Cl, —Br, —I, a hydroxyl group, a cyano group, or a nitro group;

a $C_1$-$C_{00}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{00}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof; a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{00}$ alkyl group, a $C_2$-$C_{60}$ alkenyl group, a $C_2$-$C_{60}$ alkynyl group, a $C_1$-$C_{00}$ alkoxy group, a $C_3$-$C_{60}$ carbocyclic group, a $C_1$-$C_{00}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or any combination thereof; or —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof. In an embodiment, the chelating ligand may be at least one selected from the following Ligand 1 to Ligand 6:

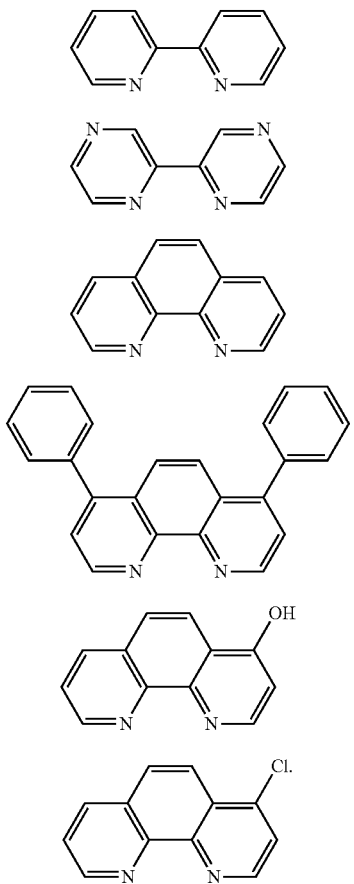

In an embodiment, a length of the chelating ligand may be about 1.5 nm or less. In an embodiment, the nano composite may further include a monodentate ligand bonded to the surface of the nanoparticle. In an embodiment, the monodentate ligand may include a pyridine group, an imidazole group, an oxazole group, or any combination thereof. In an embodiment, the metal oxide nanoparticle may include ZnO, ZnMgO, ZnAlO, $TiO_2$, or any combination thereof.

In the related art, a ligand is not introduced to a surface of a nanoparticle, particularly, a metal oxide nanoparticle (e.g., a zinc oxide (ZnO)) used in an electron transport layer, to secure an appropriate level of electron mobility, and accordingly, there was a problem with long-term stability. In addition, there has been a difficulty in selecting a solvent in preparing the ZnO ink that should have specific physical properties, and clogging of an inkjet printer head due to the ink has been triggered.

Accordingly, in a light-emitting device having a quantum dot, there is a high possibility of quantum dot quenching due to direct contact between the quantum dot and ZnO, and when a long-chain ligand such as a quantum dot is introduced, the quantum dot and ZnO may be mixed due to solubility. Stability may be secured by introducing a chelating ligand including an anchoring site having strong binding force with a metal oxide nanoparticle into the nano composite to prevent aggregation of metal oxide nanoparticles.

In addition, when the nano composite is applied to a light-emitting device including the quantum dot, direct contact between the quantum dot and the nano composite is minimized to suppress the quantum dot quenching. Furthermore, a chelating ligand is introduced into the nano composite to change the state of a surface of a metal oxide nanoparticle, and thus a solvent for preparing an ink composition may be variously selected. In an embodiment, in addition to hydrophilic solvents of the related art, the range of solvents in which solubility is securable is increased, and an ink composition that may be prepared is varied.

In a case of forming a layer included in a light-emitting device by using the nano composite, charge injection characteristics may be appropriately adjusted. The nano composite may be optionally include a delocalized cyclic moiety to further improve electron conductivity.

The nano composite may be prepared by any method known in the related art. In an embodiment, introduction of a chelating ligand to the surface of the metal oxide nanoparticle may be performed by an ultrasonic method, a heating method, or the like.

Nanoparticle Ink Composition

A nanoparticle ink composition according to another aspect may include: a solvent; and the above-described nano composite dispersed in the solvent. In an embodiment, the solvent may include an alcohol-based solvent, an ether-based solvent, an aliphatic hydrocarbon solvent, an aromatic hydrocarbon solvent, or any combination thereof. In an embodiment, the solvent may include methanol, ethanol, propanol, butanol, pentanol, hexanol, heptanol, octanol, nonanol, decanol, n-octane, n-nonane, n-decane, n-undecane, n-dodecane, n-tridecane, n-tetradecane, n-pentadecane, n-hexadecane, 2-methylheptane, 3-methylheptane, 4-methylheptane, 2,2-dimethylhexane, 2,3-dimethylhexane, 2,4-dimethylhexane, 2,5-dimethylhexane, 3,3-dimethylhexane, 3-ethylhexane, 2,2,4-trimethylpentane, 2-methyloctane, 2-methylnonane, 2-methyldecane, 2-methylundecane, 2-methyldodecane, 2-methyltridecane, methylcyclohexane, ethylcyclohexane, 1,1-dimethylcyclohexane, 1,2-dimethylcyclohexane, cycloheptane, methylcycloheptane, bicyclohexyl, decaline, toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, propylanisole, 1-ethylnaphthalene, 2-ethylnaphthalene, 2-ethylbiphenyl, octylbenzene, 1,3-dipropoxybenzene, 4-methoxybenzaldehyde-dimethyl-acetal, 4,4'-difluorodiphenylmethane, diphenylether, 1,2-dimethoxy-4-(1-propenyl)benzene, 2-phenoxytoluene, diphenylmethane, 2-phenylpyridine, dimethyl benzyl ether, 3-phenoxytoluene, 3-phenylpyridine, 2-phenylanisole, 2-phenoxytetrahydropuran, 1-propyl-4-phenyl benzene, 2-phenoxy-1,4-dimethyl benzene, ethyl-2-naphtyl-ether, dodecylbenzene, 2,2,5-tri-methyl diphenyl ether, dibenzyl-ether, 2,3,5-tri-methyl diphenyl ether, N-methyldiphenylamine, 4-isopropylbiphenyl, α,α-dichlorodiphenylmethane, 4-(3-phenylpropyl)pyridine, methyl benzoate, ethyl benzoate, n-propyl benzoate, isopropyl benzoate, t-butyl benzoate, benzyl-benzoate, 1,1-bis(3,4-dimethylphenyl)ethane, diethylene glycol butylmethyl ether (DEGBMEf), diethylene glycol monomethyl ether (DEGME), diethylene glycol ethylmethyl ether (DEGEME), diethylene glycol dibutyl ether (DEGDBE), propylene glycol methyl ether acetate (PGMEA), triethylene glycol monomethyl ether (TGME), diethylene glycol monobutyl ether (DGBE), cyclohexylbenzene, or any combination thereof, but embodiments are not limited thereto.

In an embodiment, a viscosity of the nanoparticle ink composition at 25° C. may be about 1 centipoise (cP) or more and about 10 cP or less. In an embodiment, a viscosity of the nanoparticle ink composition at 25° C. may be from about 2 cP to about 7 cP, but embodiments are not limited thereto. The nanoparticle ink composition satisfying the range of the viscosity may be appropriate for manufacturing an electron transport layer of a light-emitting device by a soluble process. As a method of measuring a viscosity, a method commonly known to those skilled in the art may be utilized, and for example, a rheometer (e.g., a rheometer sold under the trade designation DV-I by Brookfield AMETEK of Middleboro, Massachusetts, U.S.) may be utilized to measure the viscosity.

In an embodiment, a surface tension of the nanoparticle ink composition at 25° C. may be from about 20 dyne per centimeter (dyne/cm) to about 40 dyne/cm. In an embodiment, a surface tension of the nanoparticle ink composition at 25° C. may be from about 25 dyne/cm to about 35 dyne/cm, but embodiments are not limited thereto. The nanoparticle ink composition satisfying the range of the surface tension may be appropriate for manufacturing an electron transport layer of a light-emitting device by a soluble process. As a method of measuring a surface tension, a method commonly known to those skilled in the art may be utilized, and for example, a tension meter (e.g., SITA bubble pressure tension meter) may be utilized to measure the surface tension.

In an embodiment, a vapor pressure of the nanoparticle ink composition at 25° C. may be about $10^{-2}$ mmHg or less. In an embodiment, a vapor pressure of the nanoparticle ink composition at 25° C. may be from about $10^{-5}$ mmHg to about $10^{-2}$ mmHg, but embodiments are not limited thereto. The nanoparticle ink composition satisfying the range of the vapor pressure may be appropriate for manufacturing an electron transport layer of a light-emitting device by a soluble process. The amount of the nano composite in the nanoparticle ink composition may be about 0.5 weight percent (wt %) or more and about 15 wt % or less, for example, about 1 wt % or more and about 10 wt % or less, based on the total weight of the nanoparticle ink composition, but embodiments are not limited thereto.

Additive

The nanoparticle ink composition may further include an additive for the purpose of controlling an energy band level, controlling charge mobility, improving coating uniformity, or the like. The additive may include a dispersant, an adhesion promoter, a leveling agent, an antioxidant, an ultraviolet ray absorbent, or any combination thereof. In an embodiment, the nanoparticle ink composition may further include a dispersant to improve a dispersity of the nano composite. The dispersant may be used to prevent aggregation of nano composites in the nanoparticle ink composition and to impart a role of a protective layer of the nanoparticle ink composition during a soluble process.

The dispersant may include anionic, cationic, and nonionic polymer materials. The amount of the dispersant may be from about 10 wt % to about 50 wt %, for example, about 15 wt % to about 30 wt %, based on 100 wt % of the nano composite. When the amount of the dispersant is within the above-described range, the aggregation of nano composites in the nanoparticle ink composition may be substantially prevented and the dispersant may perform the role of a protective layer of the nano composite.

The adhesion promoter may be added to improve adhesion to a substrate and may include a silane coupling agent having a reactive substituent selected from the group consisting of a carboxyl group, a methacryloyl group, an isocyanate group, an epoxy group, and a combination thereof, but embodiments are not limited thereto. In an embodiment, the silane coupling agent may include trimethoxysilylbenzoic acid, γ-methacryloxypropyltrimethoxysilane, vinyltriacetoxysilane, vinyltrimethoxysilane, γ-isocyanate propyl triethoxysilane, γ-glycidoxypropyltrimethoxysilane, β-(3,4-epoxycyclohexyl) ethyltrimethoxysilane, or any combination thereof.

The leveling agent may be added to improve coating properties of the nanoparticle ink composition. The leveling agent may include, for example, a silicon-based compound, a fluorine-based compound, a siloxane-based compound, an nonionic surfactant, an ionic surfactant, a titanate coupling agent, and the like, but embodiments are not limited thereto. In an embodiment, the leveling agent may include a silicon-based compound, a fluorine-based compound, or any combination thereof.

The silicon-based compound is not particularly limited, and may include a dimethyl silicon, a methyl silicon, a phenyl silicon, a methyl phenyl silicon, an alkyl modified silicon, an alkoxy modified silicon, a polyether modified silicon, and the like. In an embodiment, as the silicon-based compound, dimethyl silicon, methyl phenyl silicon, or the like may be utilized.

The fluorine-based compound is not particularly limited, and may include a polytetrafluoroethylene, a polyvinylidene fluoride, a fluoro alkylmethacrylate, a perfluoropolyether, a perfluoro alkylethylene oxide, and the like. In an embodiment, as the fluorine-based compound, a polytetrafluoroethylene may be utilized.

The siloxane-based compound is not particularly limited, and may include a dimethyl siloxane compound. Suitable siloxane products are sold under the trade designation KF96L-1, KF96L-5, KF96L-10, KF96L-100 by Shin-Etsu Silicone Co., Ltd. of Tokyo, Japan.

The above-described leveling agent may be used alone or may be used in combination of two or more types of leveling agent. The amount of the leveling agent may vary according to a desired performance, and may be from about 0.001 wt % to about 5 wt %, for example, from about 0.001 wt % to about 1 wt %, based on the total weight of the nanoparticle ink composition. When the amount of the leveling agent is within the above-described range, fluidity and film uniformity of the nanoparticle ink composition may be improved.

The nanoparticle ink composition may be utilized to manufacture a light-emitting device. The nanoparticle ink composition has excellent inkjet discharging stability, and thus, may be, for example, a nanoparticle ink composition for inkjet printing, but is not limited thereto.

Light-Emitting Device

A light-emitting device according to another aspect includes: a first electrode; a second electrode facing the first electrode; and an interlayer between the first electrode and the second electrode, wherein the interlayer includes an emission layer, and at least one layer included in the interlayer may be formed using the above-described nanoparticle ink composition.

Description of FIG. 1

FIG. 1 is a schematic cross-sectional view of an embodiment of a light-emitting device constructed according to the principles of the invention.

The light-emitting device 10 includes a first electrode 110, an interlayer 130, and a second electrode 150, and the interlayer 130 includes an emission layer 133. In an embodiment, the interlayer 130 may further include a hole transport region 131 between the first electrode 110 and the emission layer 133 and an electron transport region 135 between the emission layer 133 and the second electrode 150. In an embodiment, the hole transport region 131 may include a hole injection layer, a hole transport layer, an emission auxiliary layer, an electron blocking layer, or any combination thereof, the electron transport region 135 may include a buffer layer, a hole blocking layer, an electron control layer, an electron transport layer, an electron injection layer, or any combination thereof, and at least one layer included in the hole transport region 131 and the electron transport region 135 may be formed using the nanoparticle ink composition. Hereinafter, a structure of the light-emitting device 10 according to an embodiment and an illustrative method of manufacturing the light-emitting device 10 will be described in connection with FIG. 1.

First Electrode 110

In FIG. 1, a substrate may be additionally located under the first electrode 110 or above the second electrode 150. As the substrate, a glass substrate or a plastic substrate may be used. In an embodiment, the substrate may be a flexible substrate, and may include plastics with excellent heat resistance and durability, such as a polyimide, a polyethylene terephthalate (PET), a polycarbonate, a polyethylene naphthalate, a polyarylate (PAR), a polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include an indium tin oxide (ITO), an indium zinc oxide (IZO), a tin oxide ($SnO_2$), a zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode 110. The first electrode 110 may have a single-layered structure consisting of a single layer or a multilayer structure including a plurality of layers. In an embodiment, the first electrode 110 may have a three-layered structure of an ITO/Ag/ITO.

Interlayer 130

The interlayer 130 may be located on the first electrode 110. The interlayer 130 may include the emission layer 133. The interlayer 130 may further include the hole transport region 131 between the first electrode 110 and the emission layer 133 and an electron transport region 135 between the emission layer 133 and the second electrode 150. The interlayer 130 may further include metal-containing compounds such as organometallic compounds, inorganic materials such as quantum dots, and the like, in addition to various organic materials.

In one or more embodiments, the interlayer 130 may include i) two or more emitting units sequentially stacked between the first electrode 110 and the second electrode 150 and ii) a charge generation layer located between the two emitting units. When the interlayer 130 includes the emitting unit and the charge generation layer as described above, the light-emitting device 10 may be a tandem light-emitting device.

Hole Transport Region 131 in Interlayer 130

The hole transport region 131 may have: i) a single-layered structure consisting of a single layer consisting of a single material, ii) a single-layered structure consisting of a single layer consisting of a plurality of different materials, or iii) a multi-layered structure including a plurality of layers including different materials.

The hole transport region 131 may include a hole injection layer, a hole transport layer, an emission auxiliary layer, an electron blocking layer, or any combination thereof. For example, the hole transport region 131 may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region 131 may include a compound represented by Formula 201, a compound represented by Formula 202, or any combination thereof:

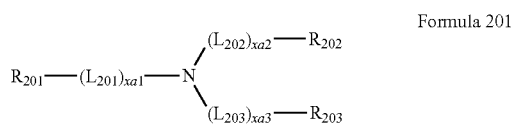

Formula 201

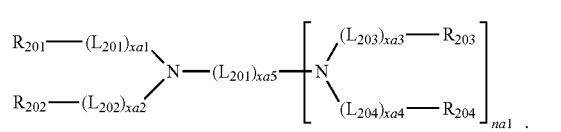

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, R201 and R202 may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), R203 and R204 may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may include at least one of groups represented by Formulae CY201 to CY217.

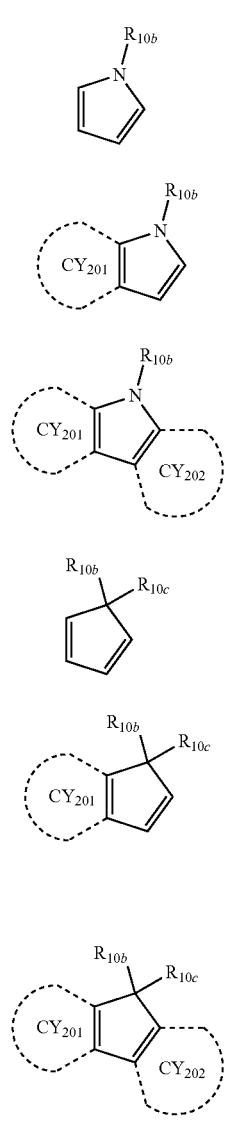

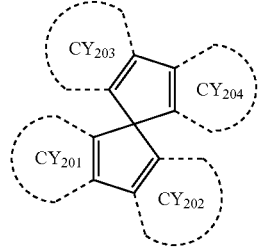

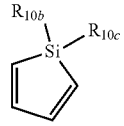

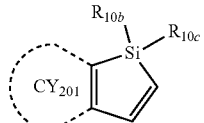

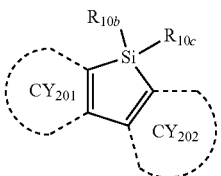

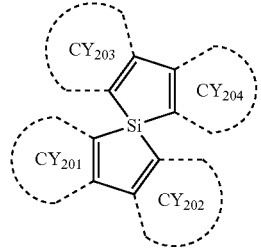

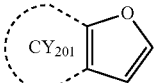

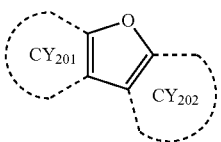

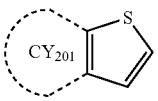

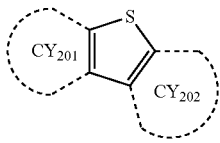

CY217

$R_{10b}$ and $R_{10c}$ in Formulae CY201 to CY217 are each the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group. In an embodiment, each of Formulae 201 and 202 may include at least one of groups represented by Formulae CY201 to CY203. In an embodiment, Formula 201 may include at least one of groups represented by Formulae CY201 to CY203 and at least one of groups represented by Formulae CY204 to CY217.

In an embodiment, xa1 in Formula 201 may be 1, $R_{201}$ may be a group represented by one of Formulae CY201 to CY203, xa2 may be 0, and $R_{202}$ may be a group represented by one of Formulae CY204 to CY207. In an embodiment, each of Formulae 201 and 202 may not include a group represented by one of Formulae CY201 to CY203. In an embodiment, each of Formulae 201 and 202 may not include groups represented by Formulae CY201 to CY203, and may include at least one of groups represented by Formulae CY204 to CY217. In an embodiment, each of Formulae 201 and 202 may not include groups represented by Formulae CY201 to CY217.

In an embodiment, the hole transport region 131 may include one of Compounds HT1 to HT44, 4,4',4"-tris[phenyl (m-tolyl)amino]triphenylamine (m-MTDATA), 1-N,1-N-bis [4-(diphenylamino)phenyl]-4-N,4-N-diphenylbenzene-1,4-diamine (TDATA), 4,4',4"-tris[2-naphthyl(phenyl)amino] triphenylamine (2-TNATA), bis(naphthalen-1-yl)-N,N'-bis (phenyl)benzidine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (spiro-TPD), N2,N7-di-1-naphthalenyl-N2,N7-diphenyl-9,9'-spirobi[9H-fluorene]-2,7-diamine (spiro-NPB), N,N'-di(1-naphthyl)-N,N'-diphenyl-2,2'-dimethyl-(1,1'-biphenyl)-4,4'-diamine (methylated NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

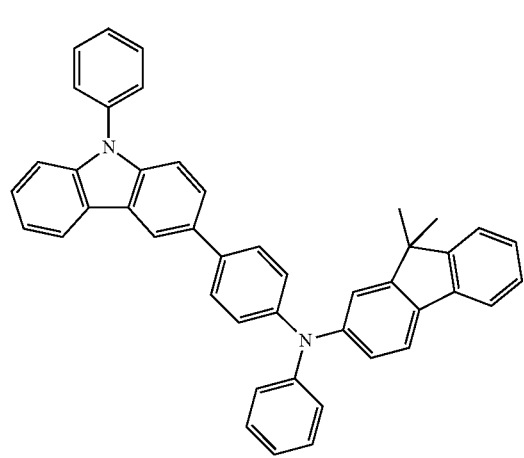

HT1

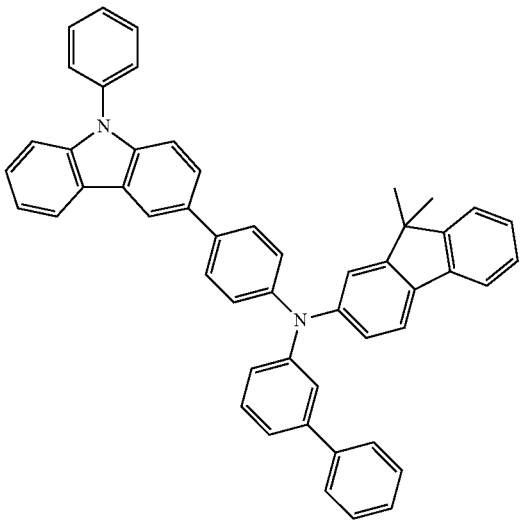

HT2

-continued
HT3
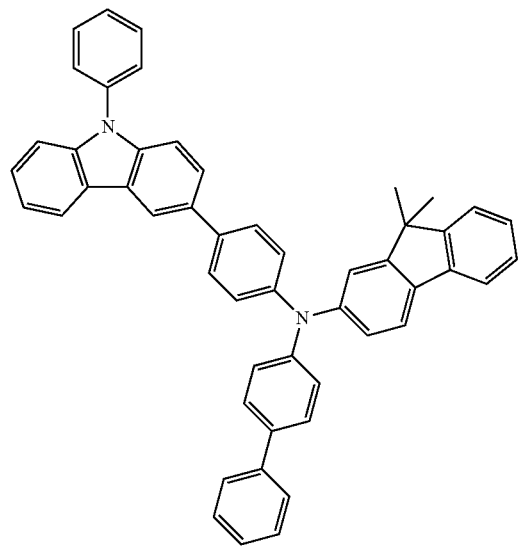
HT4
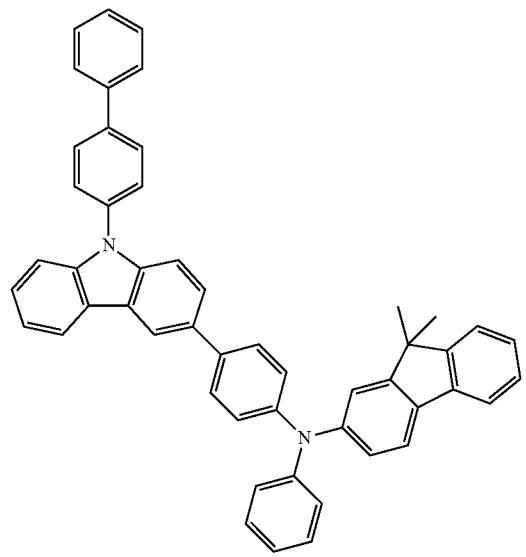
HT5
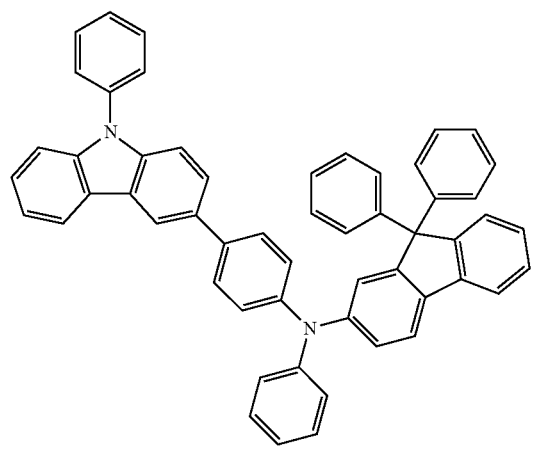
HT6
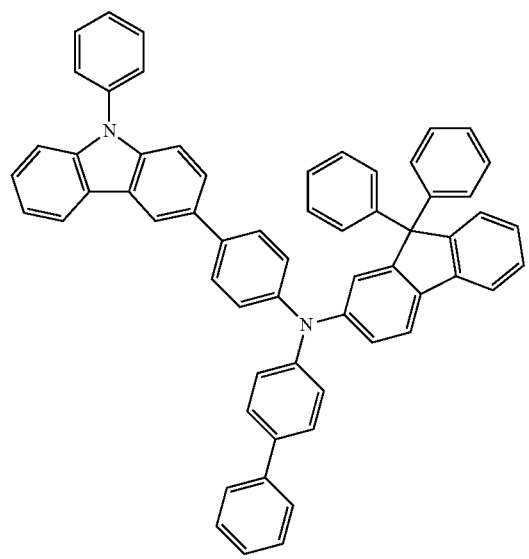
HT7
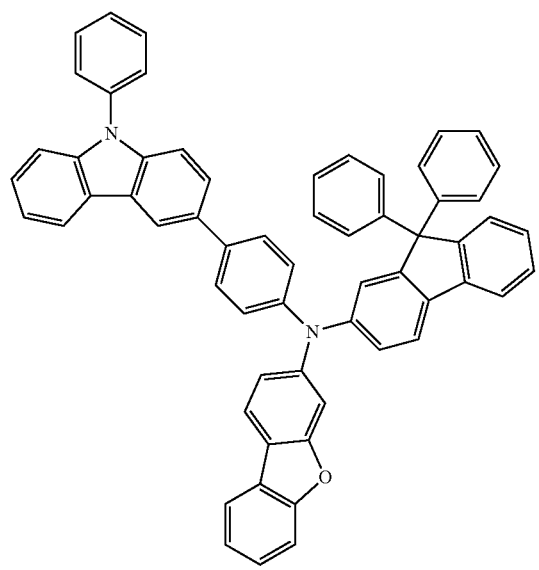
HT8
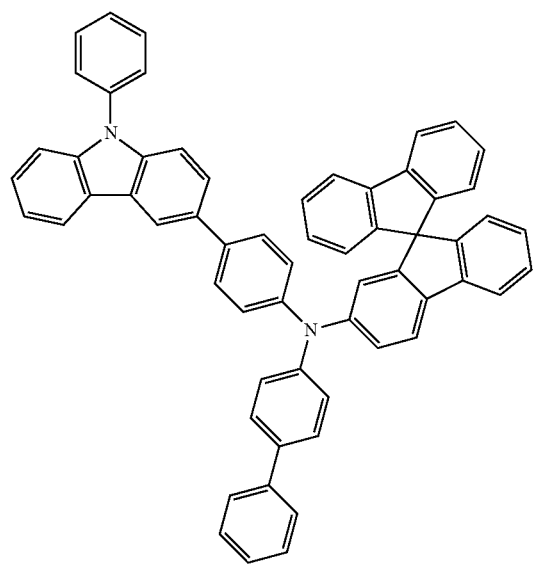

-continued
HT9
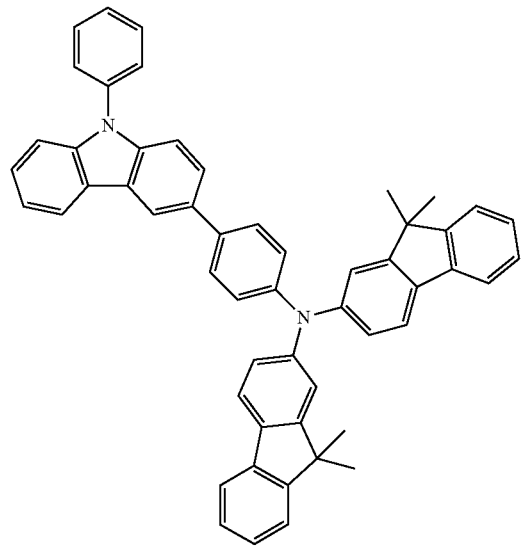
HT10
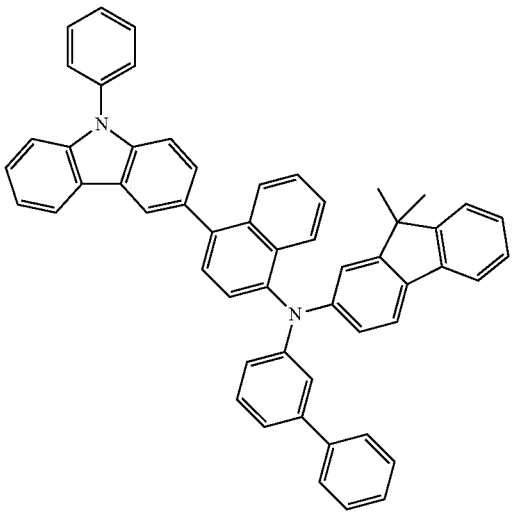
HT11
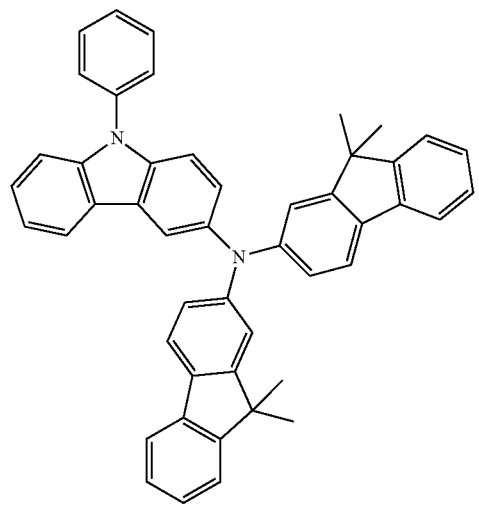
HT12
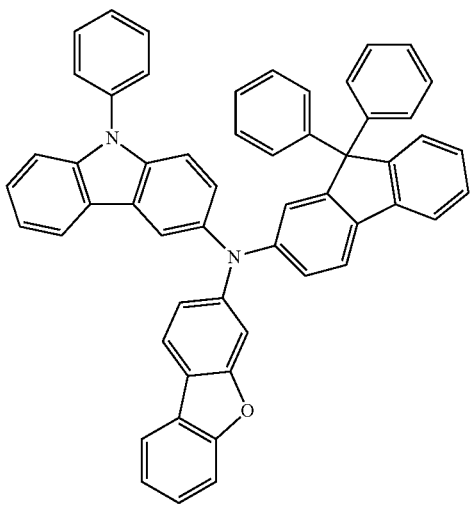
HT13
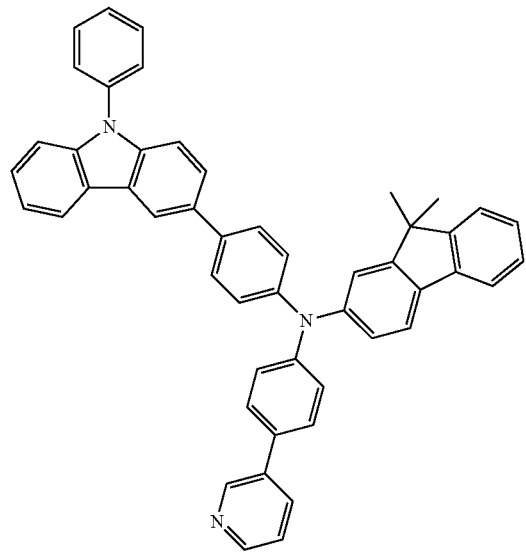
HT14
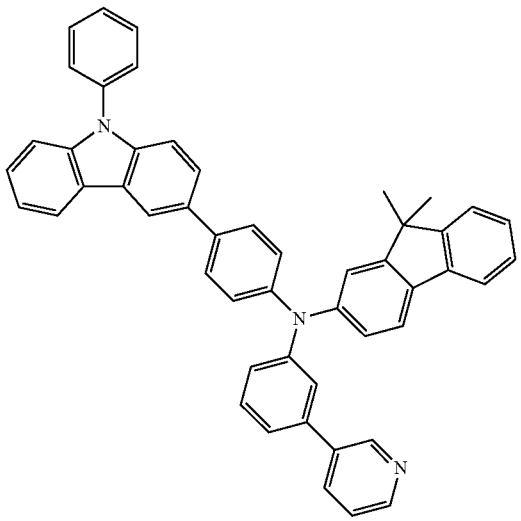

-continued
HT15
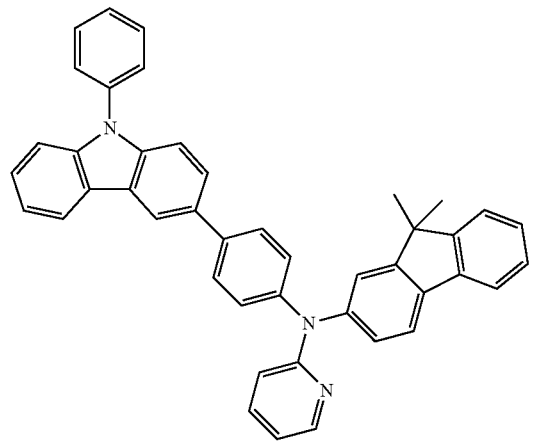
HT16
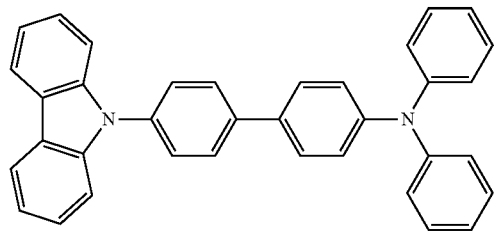
HT17
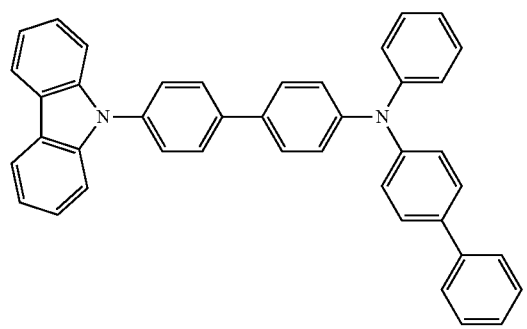
HT18
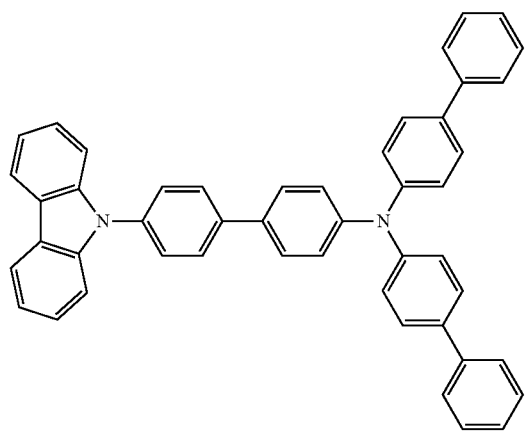
HT19
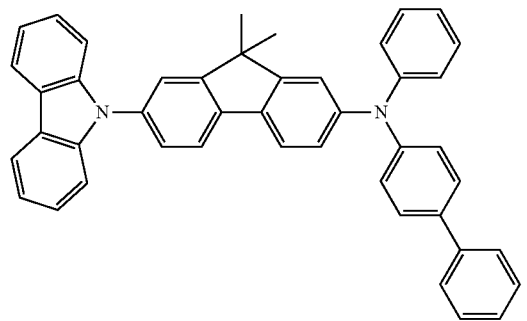
HT20
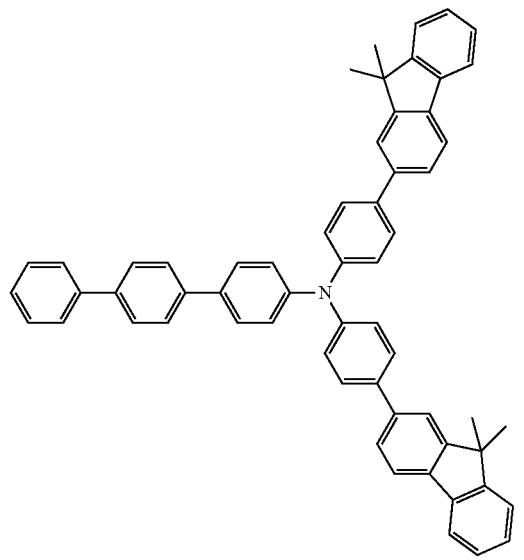

HT21
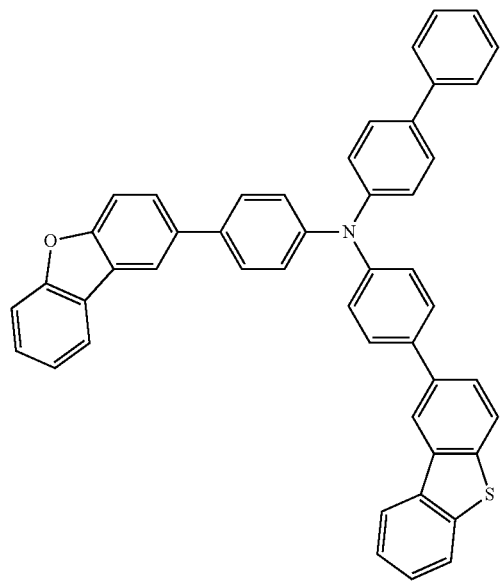
HT22
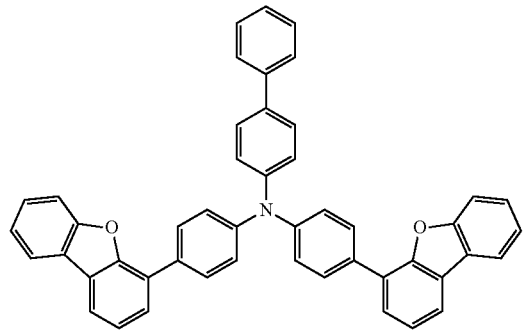
HT23
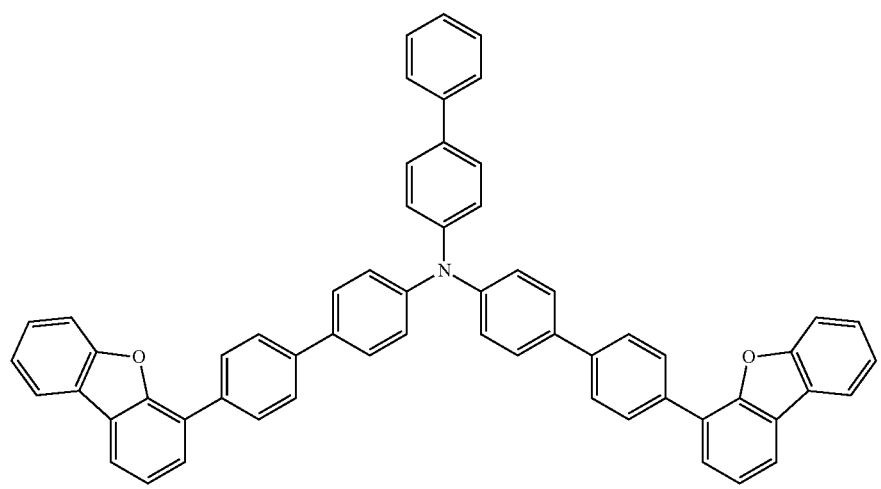
HT24
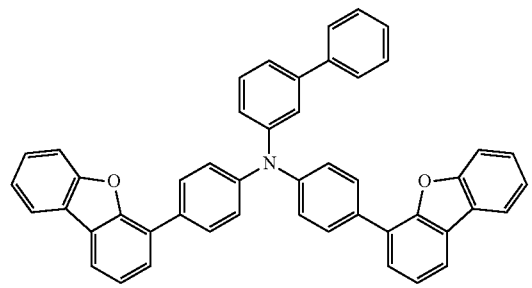
HT25
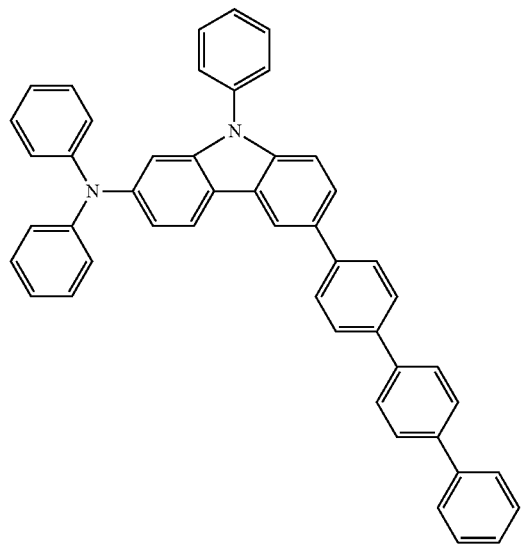

-continued
HT26
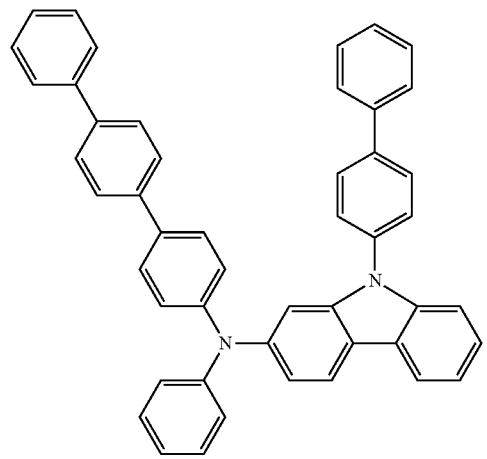
HT27
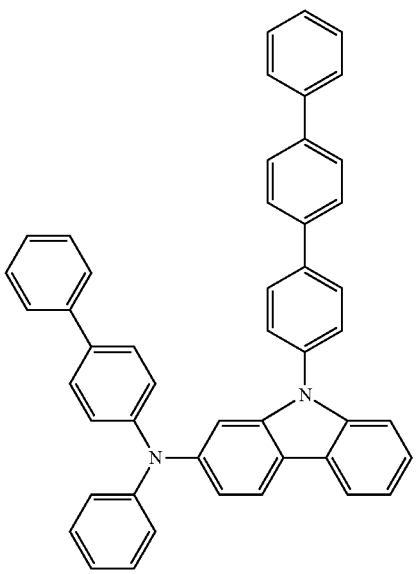
HT28
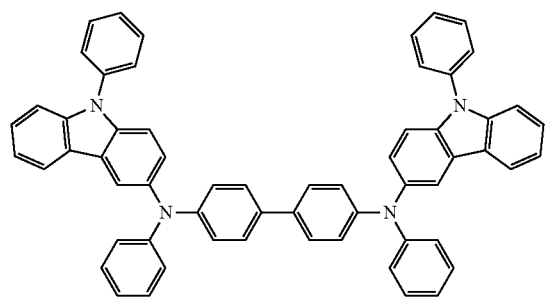
HT29
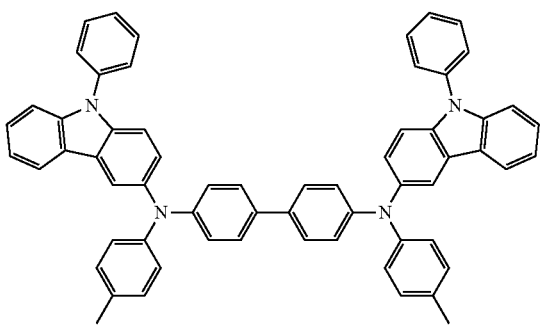
HT30
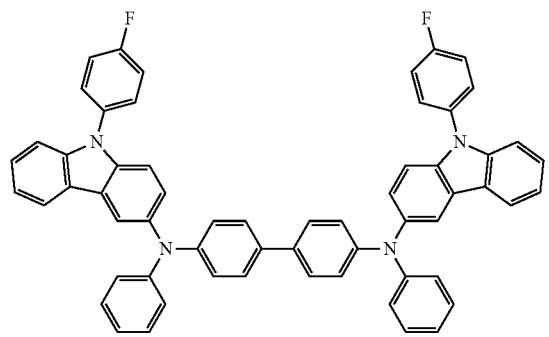
HT31
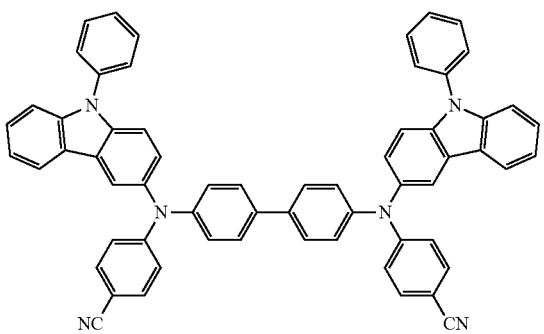

-continued
HT32
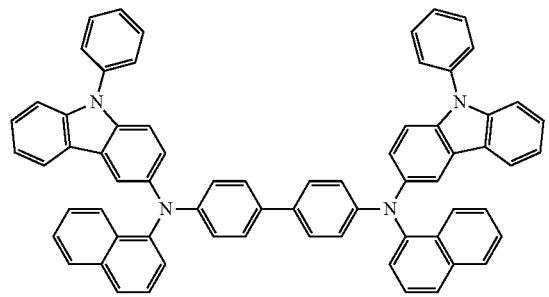
HT33
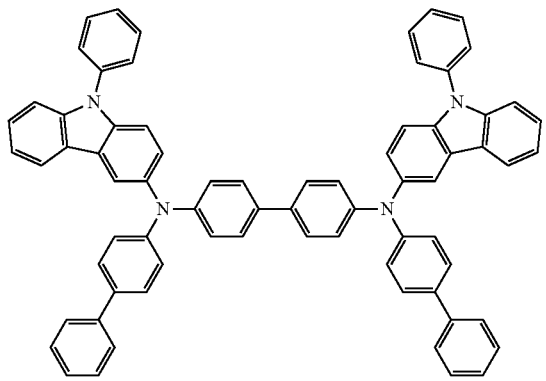
HT34
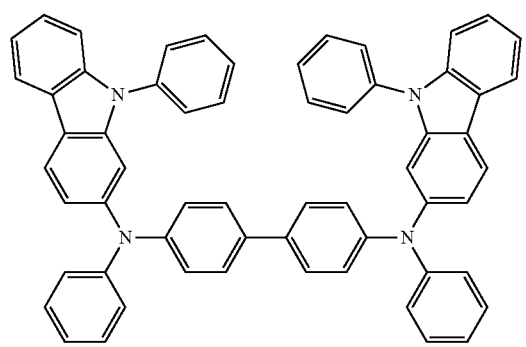
HT35
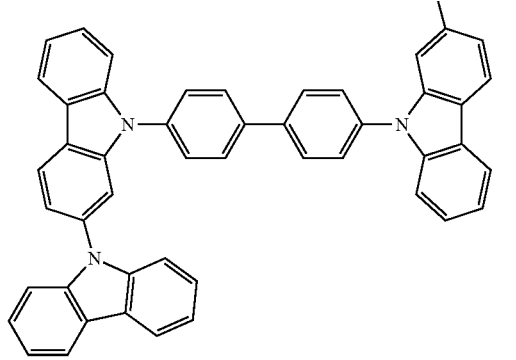
HT36
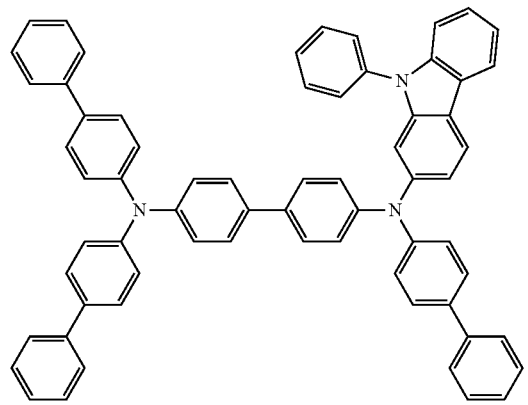
HT37
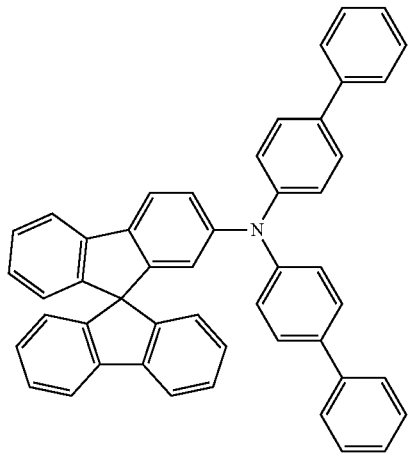

-continued
HT38
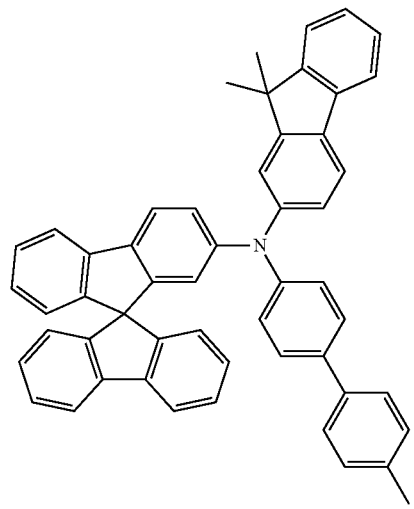
HT39
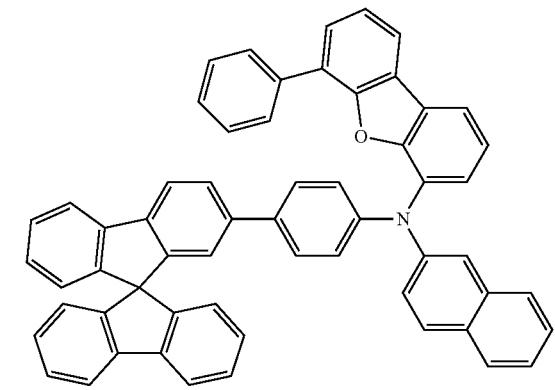
HT40
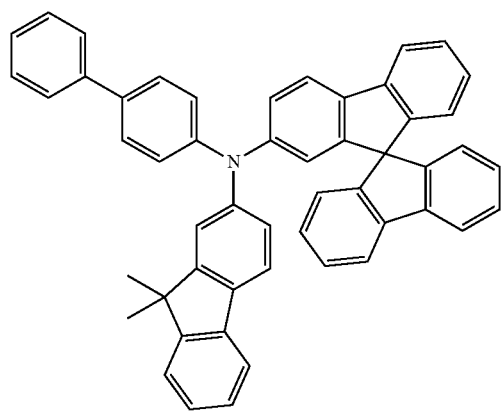
HT41
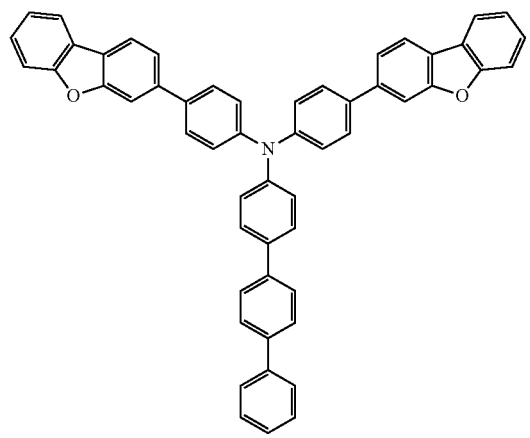
HT42
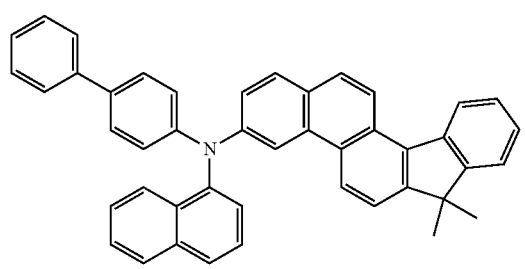
HT43
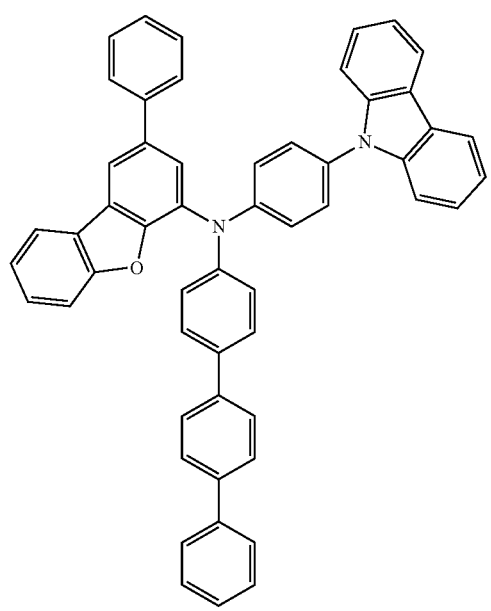

-continued
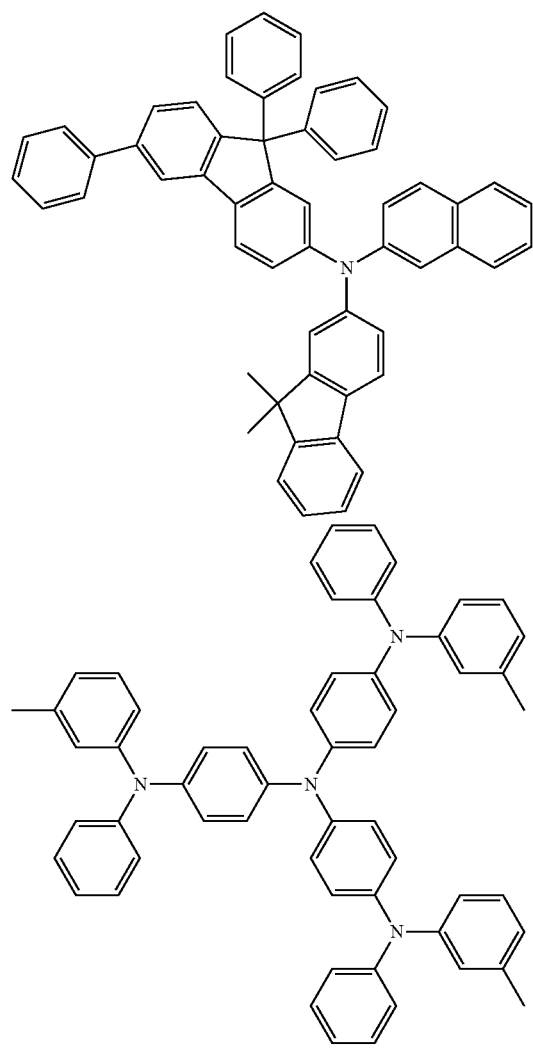
m-MTDATA
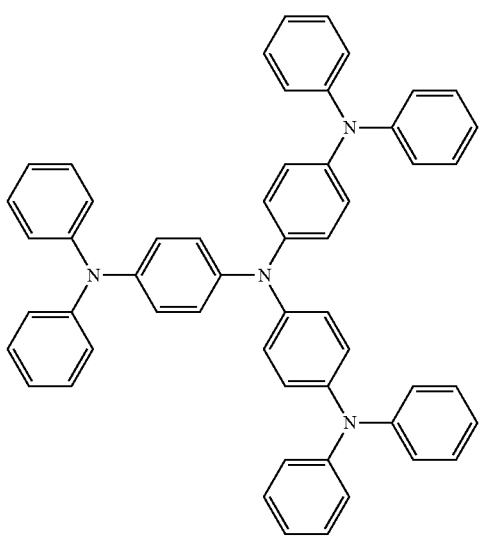
TDATA
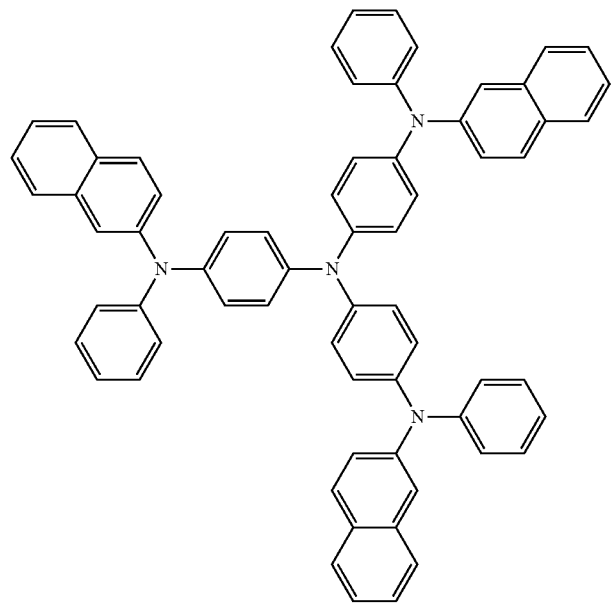
2-TNATA
HT44

-continued

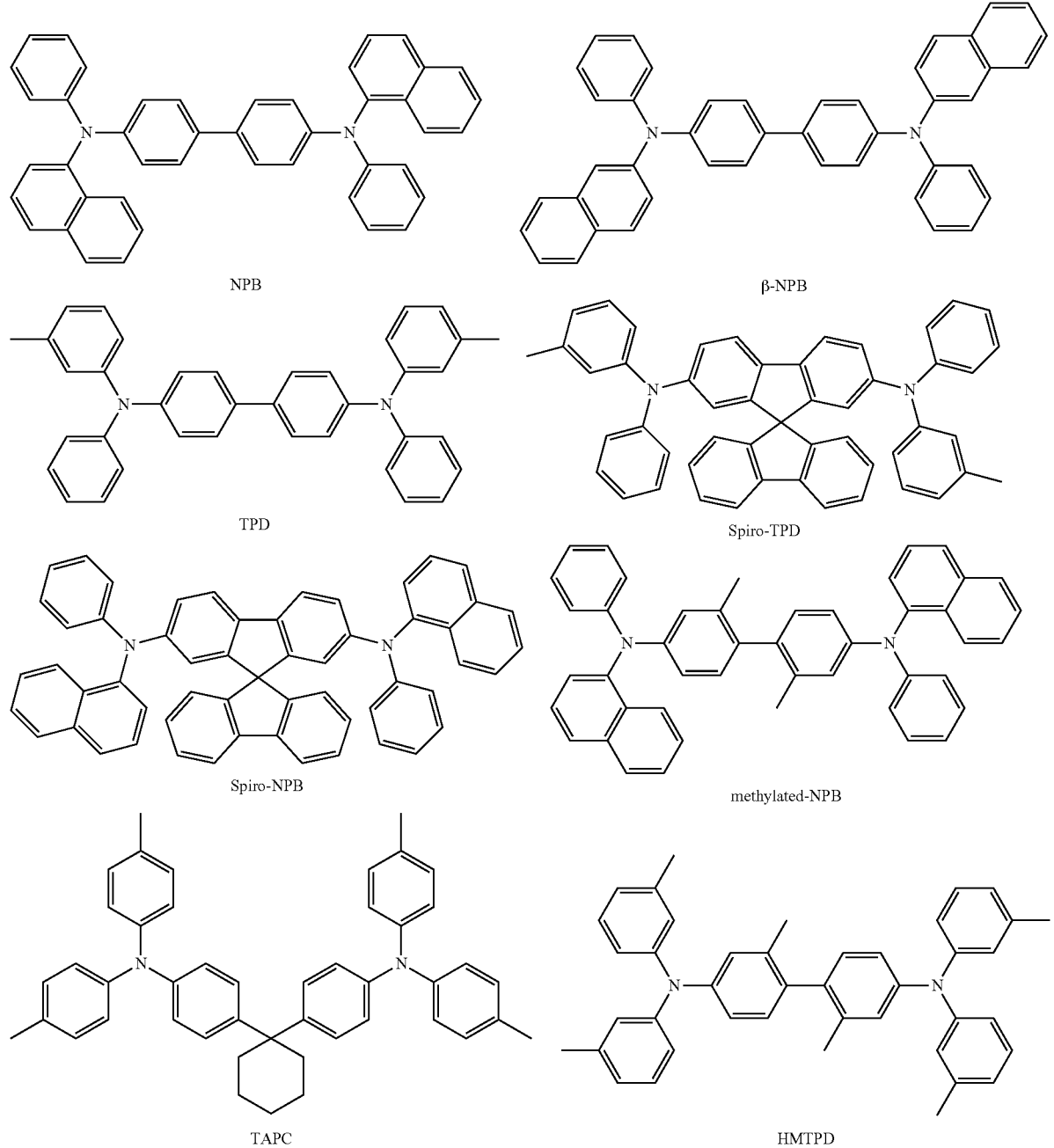

The thickness of the hole transport region 131 may be in a range of about 50 Angstroms (Å) to about 10,000 Å, for example, about 100 Å to about 4,000 Å. When the hole transport region 131 includes the hole injection layer, the hole transport layer, or any combination thereof, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region 131, the hole injection layer, and the hole transport layer are within these ranges, satisfactory hole-transporting characteristics may be obtained without a substantial increase in driving voltage.

The emission auxiliary layer may increase light-emission efficiency by compensating for an optical resonance distance according to the wavelength of light emitted by the emission layer 133, and the electron blocking layer may block the flow of electrons from an electron transport region 135. The emission auxiliary layer and the electron blocking layer may include the materials as described above.

p-Dopant

The hole transport region 131 may further include, in addition to these materials, a charge-generation material for the improvement of conductive properties. The charge-generation material may be uniformly or non-uniformly dispersed in the hole transport region 131 (for example, in the form of a single layer consisting of a charge-generation material). The charge-generation material may be, for example, a p-dopant. In an embodiment, a lowest unoccupied molecular orbital (LUMO) energy level of the p-dopant may be about −3.5 eV or less.

In an embodiment, the p-dopant may include a quinone derivative, a cyano group-containing compound, a compound containing element EL1 and element EL2, or any combination thereof. Examples of the quinone derivative may include tetracyanoquinodimethane (TCNQ), 2,3,5,6-tetrafluoro-7,7,8,8-tetracyanoquinodimethane (F4-TCNQ), and the like.

Examples of the cyano group-containing compound may include 1,4,5,8,9,12-hexaazatriphenylene-hexacarbonitrile (HAT-CN), a compound represented by Formula 221 below, and the like.

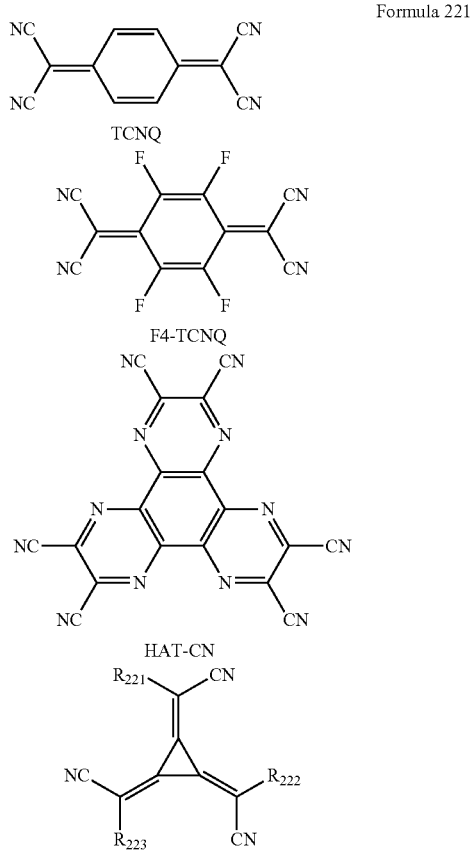

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof. In the compound containing element EL1 and element EL2, element EL1 may be metal, metalloid, or a combination thereof, and element EL2 may be non-metal, metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te). Examples of the non-metal may include oxygen (O) and a halogen (for example, F, Cl, Br, I, etc.).

In an embodiment, examples of the compound containing element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), and a rhenium oxide (for example, $ReO_3$, etc.).

Examples of the metal halide may include an alkali metal halide, an alkaline earth metal halide, a transition metal halide, a post-transition metal halide, and a lanthanide metal halide. Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI. Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.). Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$. Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, $In_2Te_3$, SnTe, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer 133 in Interlayer 130

When the light-emitting device 10 is a full-color light-emitting device, the emission layer 133 may be patterned into a red emission layer, a green emission layer, and/or a blue emission layer, according to subpixel. In one or more embodiments, the emission layer 133 may have a stacked structure of two or more layers of the red emission layer, the green emission layer, and the blue emission layer, in which the two or more layers contact each other or are separated from each other. In one or more embodiments, the emission layer 133 may include two or more materials of a red light-emitting material, a green light-emitting material, and a blue light-emitting material, in which the two or more materials are mixed with each other in a single layer to emit white light. The emission layer 133 may include a host and a dopant. The dopant may include a phosphorescent dopant, a fluorescent dopant, or any combination thereof. The amount of the dopant in the emission layer 133 may be from about 0.01 wt % to about 15 wt % based on 100 wt % of the host.

In one or more embodiments, the emission layer 133 may include a quantum dot. In an embodiment, the emission layer 133 may include a delayed fluorescence material. The delayed fluorescence material may act as a host or a dopant in the emission layer 133. The thickness of the emission layer 133 may be in a range of about 100 Å to about 1,000 Å, for example, about 200 Å to about 600 Å. When the thickness of the emission layer 133 is within the range, excellent light-emission characteristics may be obtained without a substantial increase in driving voltage.

Host

The host may include a compound represented by Formula 301 below:

$$[Ar_{301}]_{xb11}\text{-}[(L_{301})_{xb1}\text{-}R_{301}]_{xb21}. \qquad \text{Formula 301}$$

wherein, in Formula 301, $Ar_3O_1$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are each the same as described in connection with $Q_1$.

In an embodiment, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination thereof:

Formula 301-1

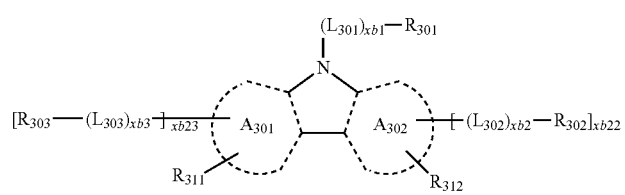

Formula 301-2

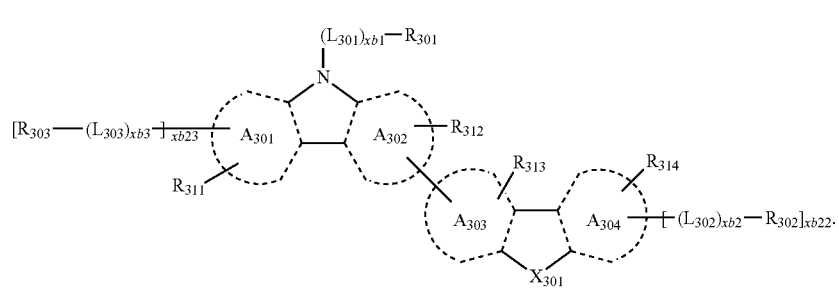

wherein, in Formulae 301-1 and 301-2,
ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
$X_{301}$ may be O, S, N-[$(L_{304})_{xb4}$-$R_{304}$], $C(R_{304})(R_{305})$, or $Si(R_{304})(R_{305})$,
xb22 and xb23 may each independently be 0, 1, or 2,
$L_{301}$, xb1, and $R_{301}$ are each the same as described herein,
$L_{302}$ to $L_{304}$ are each independently the same as described in connection with $L_{301}$,
xb2 to xb4 are each independently the same as described in connection with xb1, and $R_{302}$ to $R_{305}$ and $R_{311}$ to $R_{314}$ are each the same as described in connection with $R_{301}$.

In one embodiment, the host may include an alkaline earth-metal complex. In an embodiment, the host may include a Be complex (for example, Compound H55), an Mg complex, a Zn complex, or a combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di(carbazol-9-yl)benzene (mCP), 1,3,5-tri(carbazol-9-yl)benzene (TCP), 3,3-di(9H-carbazol-9-yl)biphenyl (mCBP), or any combination thereof:

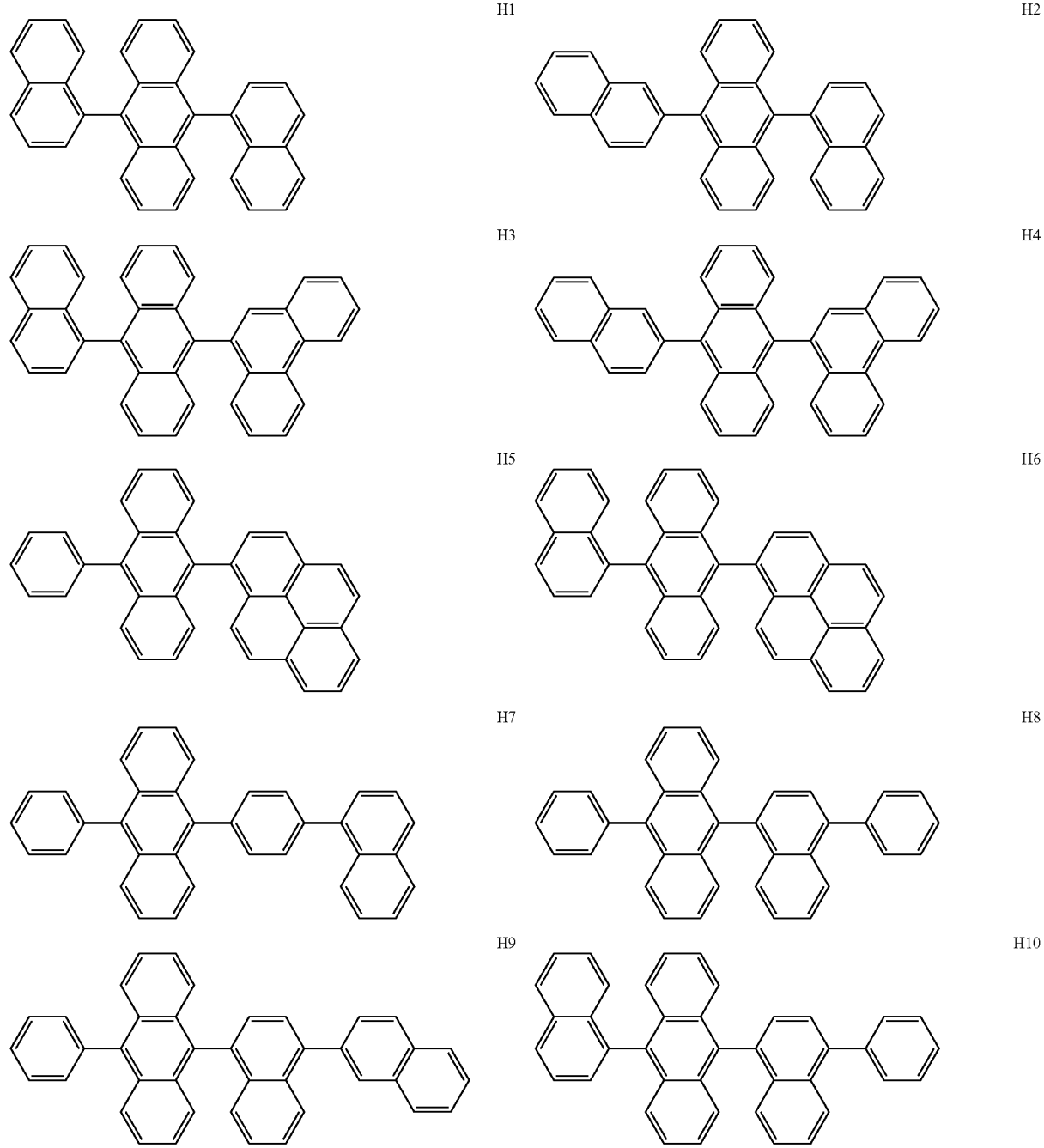

-continued
H11
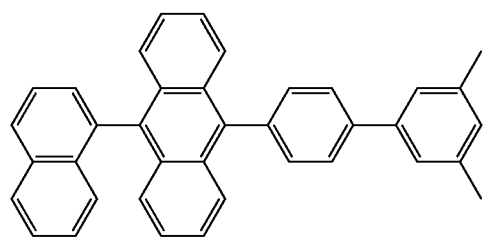
H12
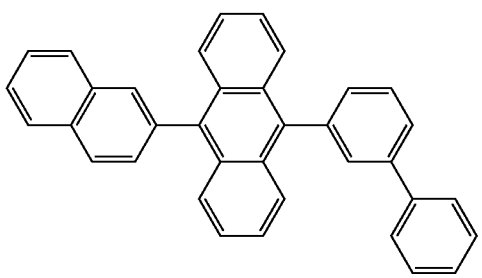
H13
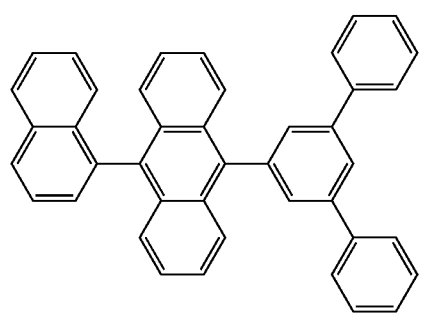
H14
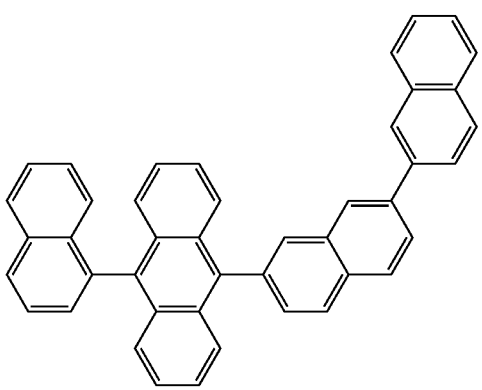
H15
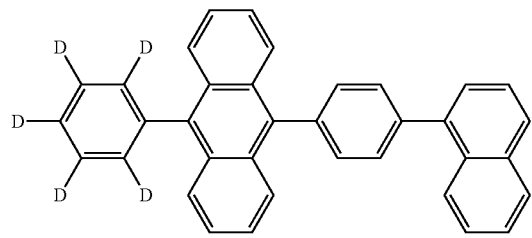
H16
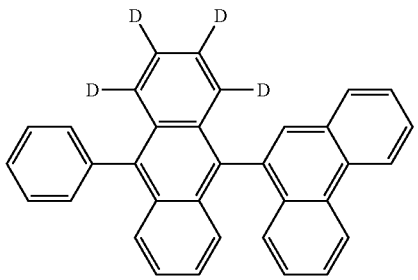
H17
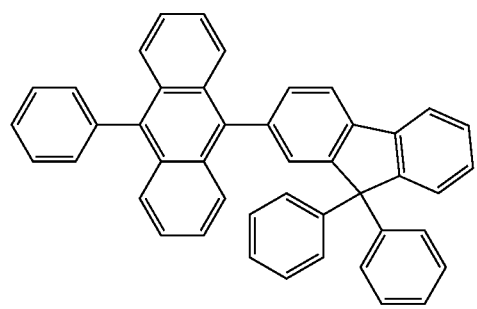
H18
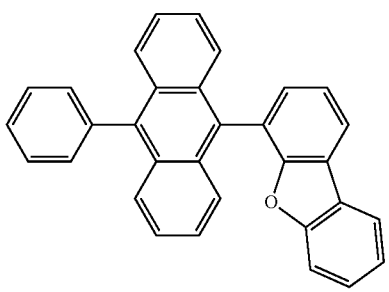
H19
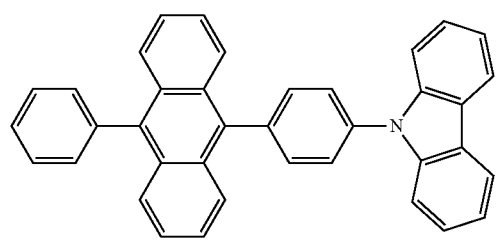
H20
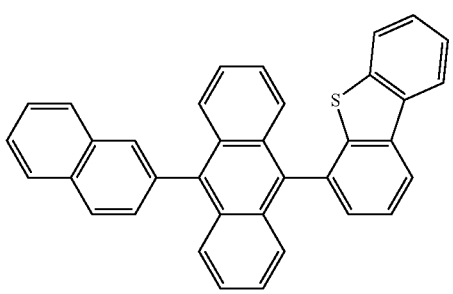

-continued
H21
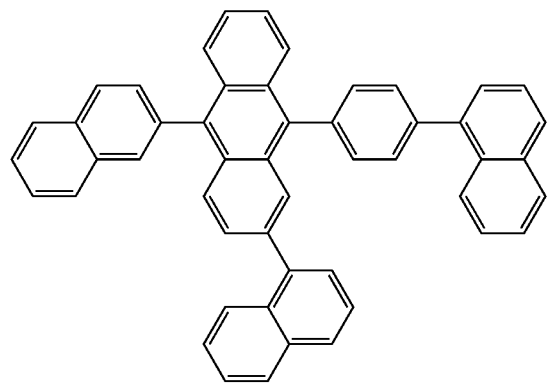
H22
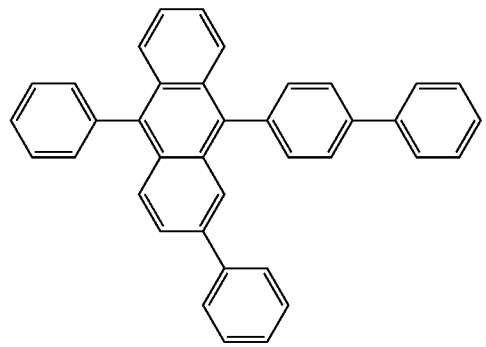
H23
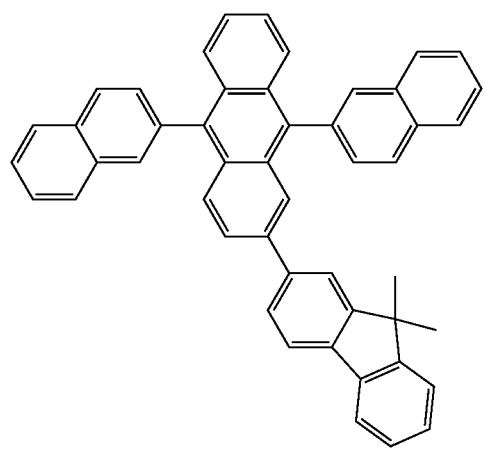
H24
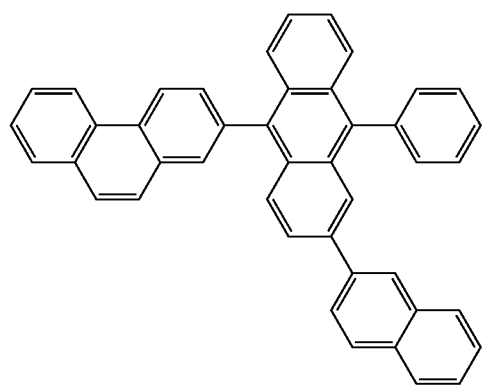
H25
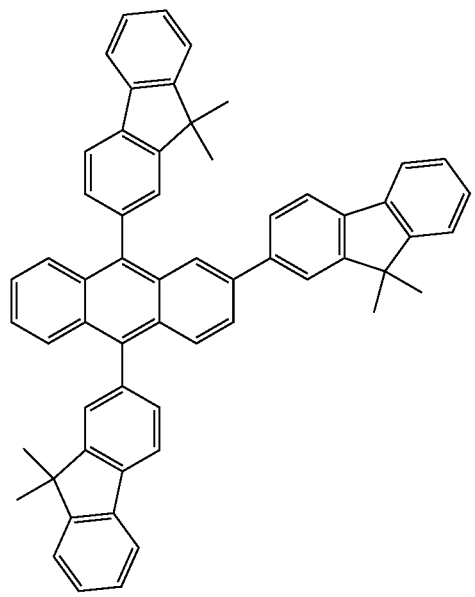
H26
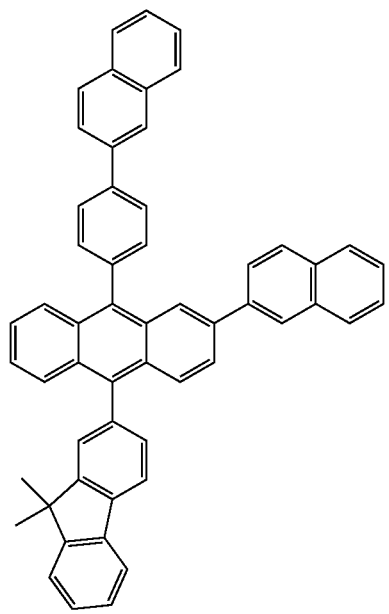

-continued
H27
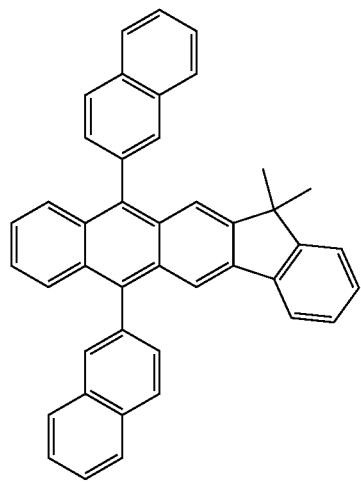
H28
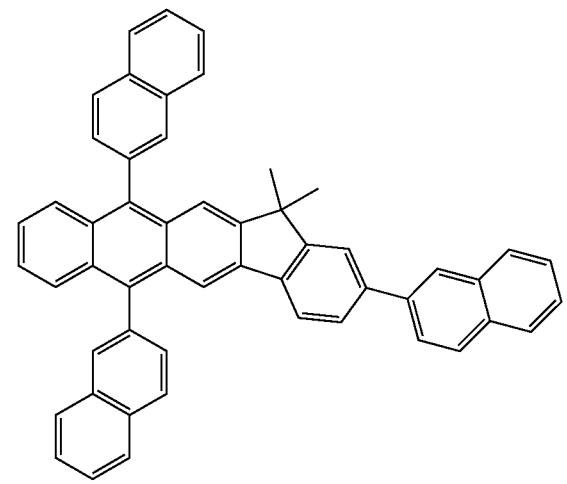
H29
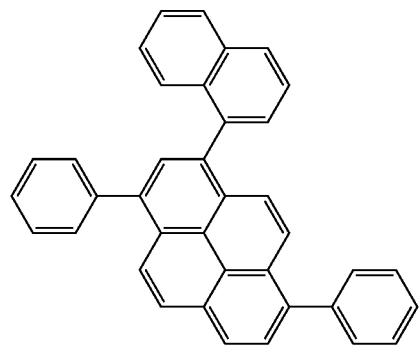
H30
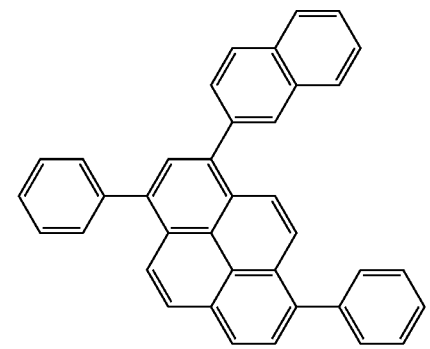
H31
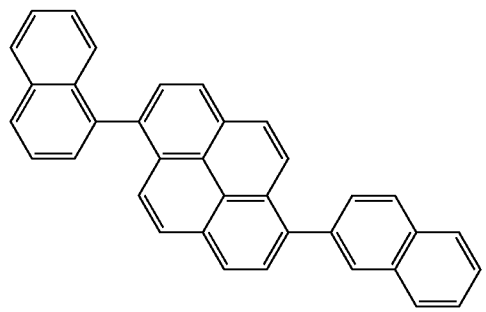
H32
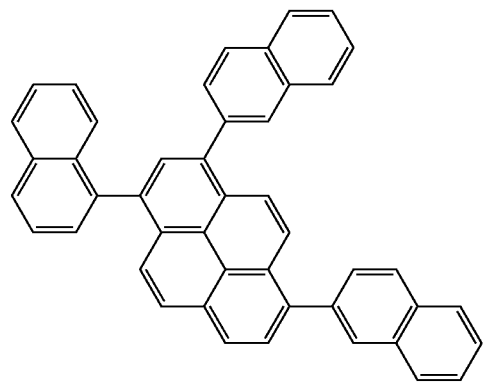
H33
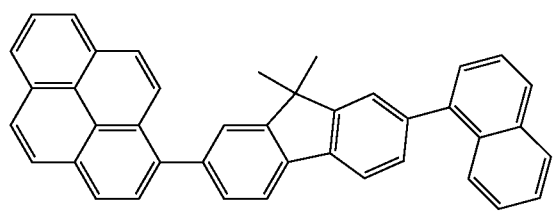
H34
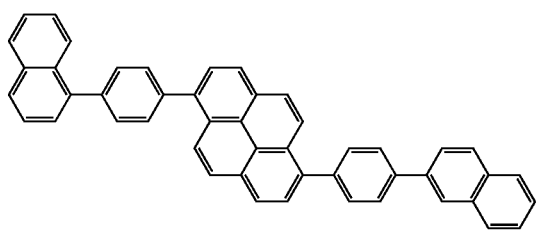

-continued
H35
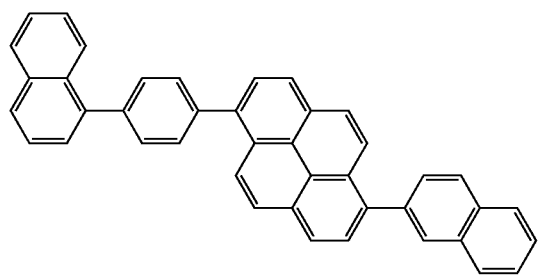
H36
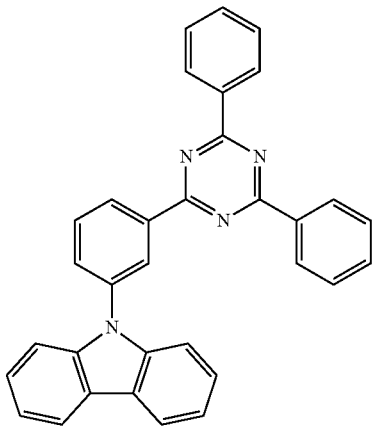
H37
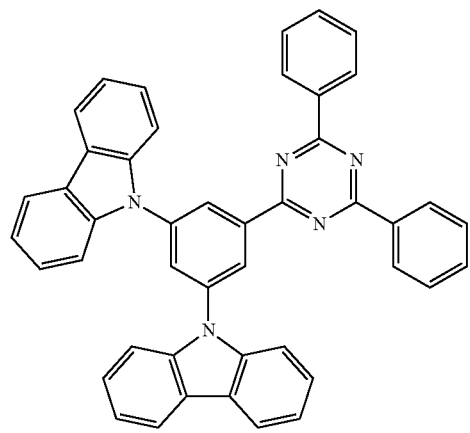
H38
H39
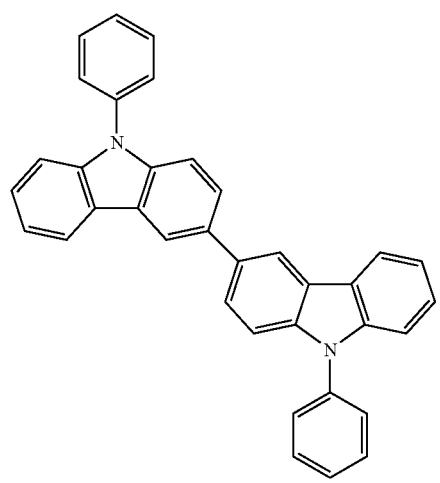
H40
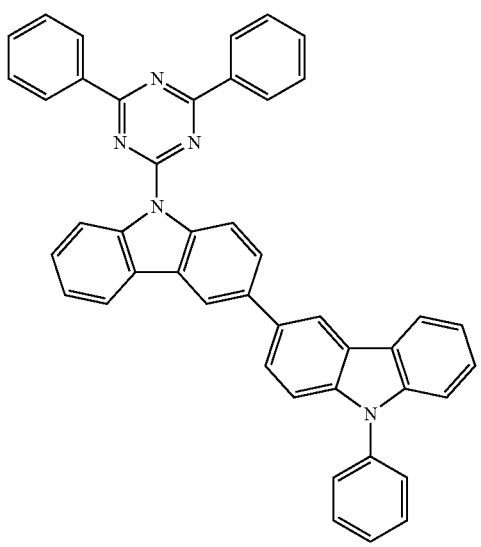

-continued
H41
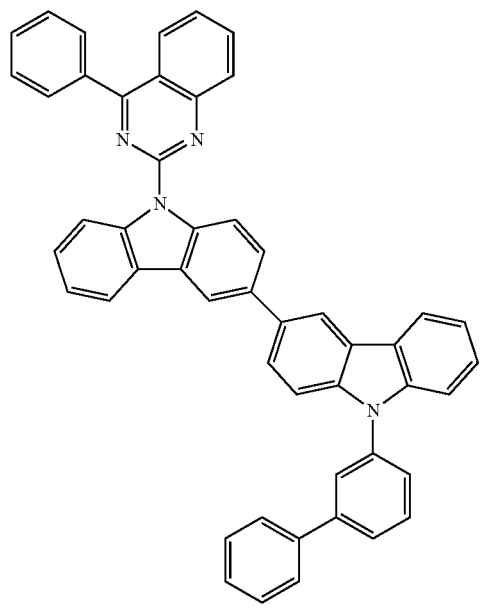
H42
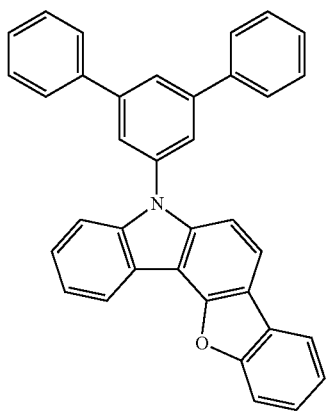
H43
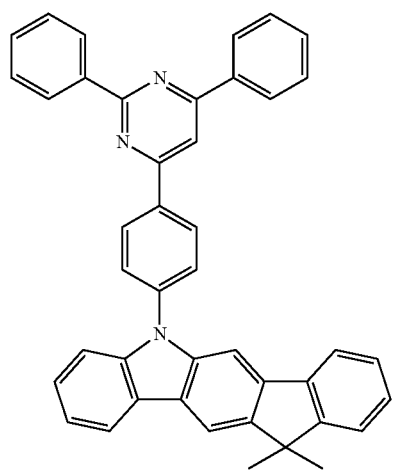
H44
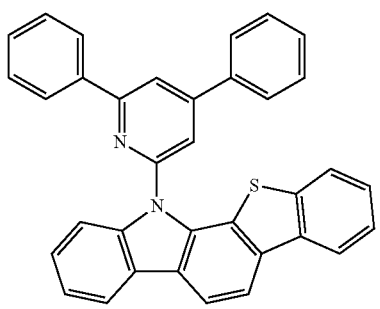
H45
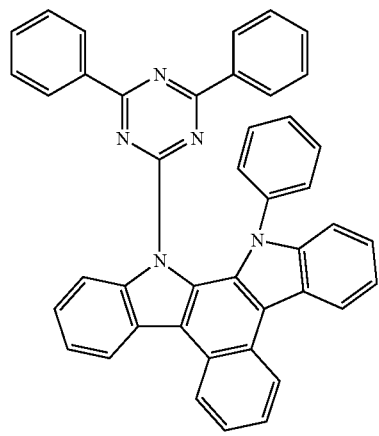
H46
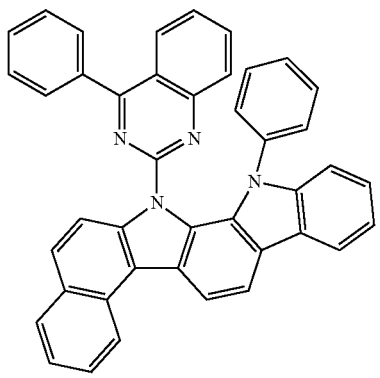

-continued
H47
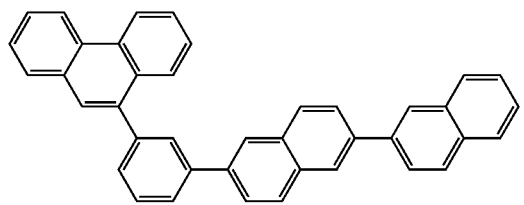
H48
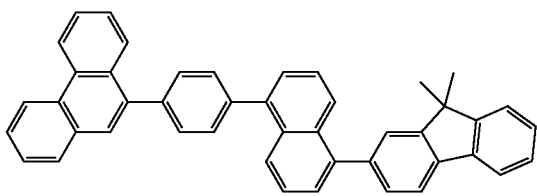
H49
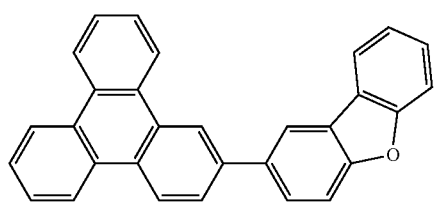
H50
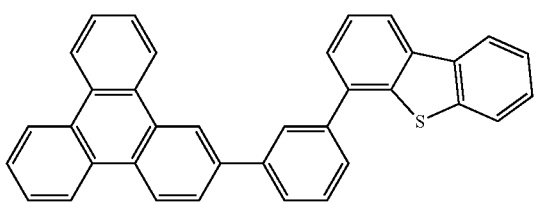
H51
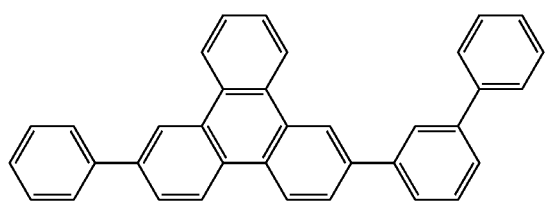
H52
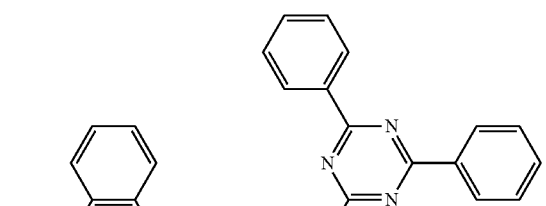
H53
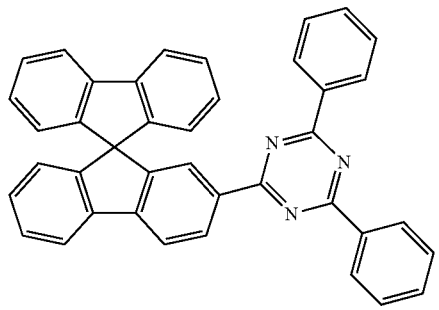
H54
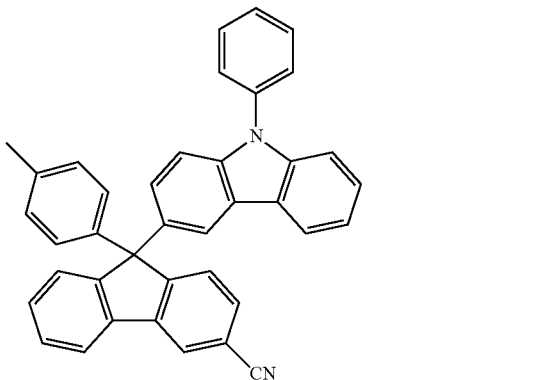
H55
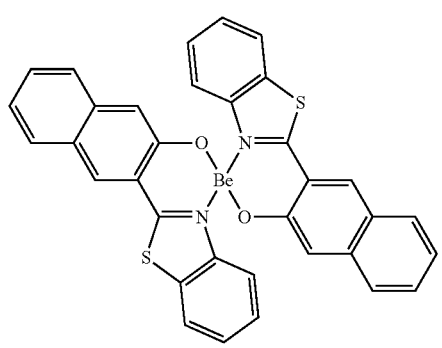
H56
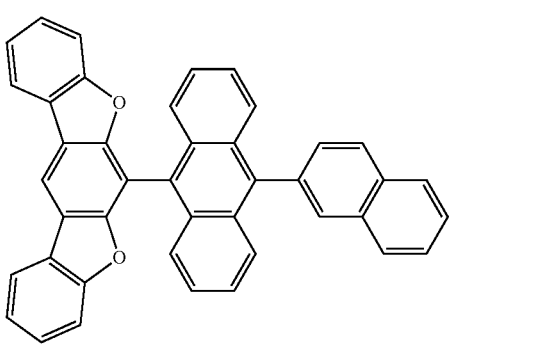

-continued
H57
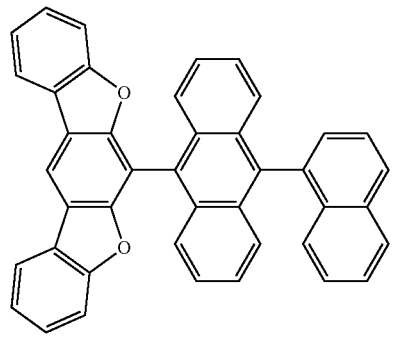
H58
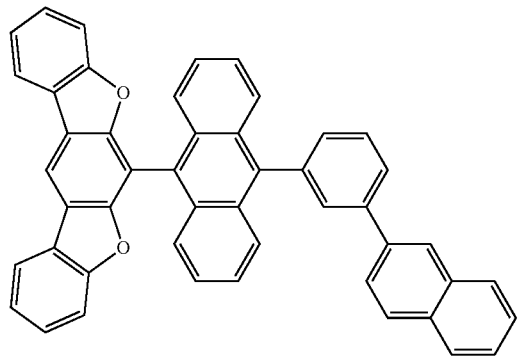
H59
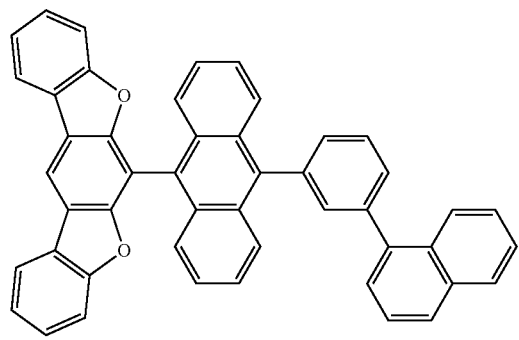
H60
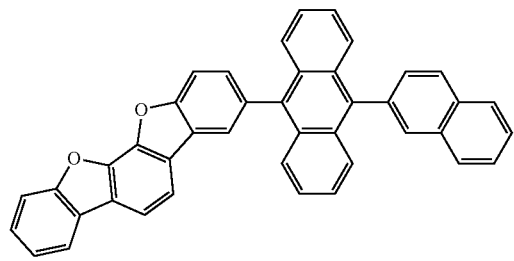
H61
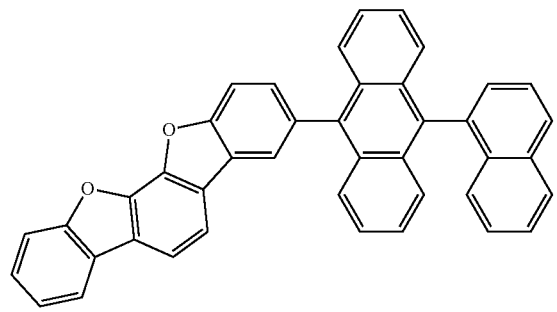
H62
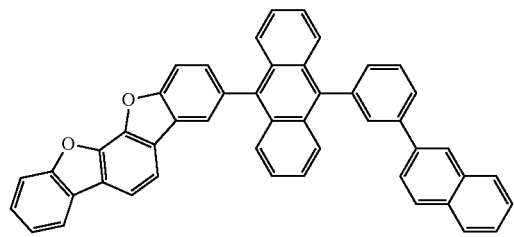
H63
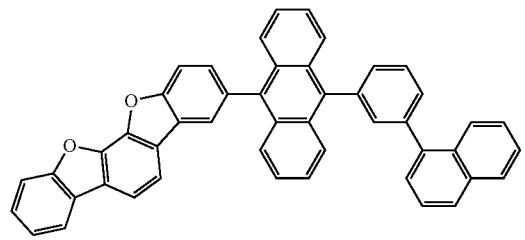
H64
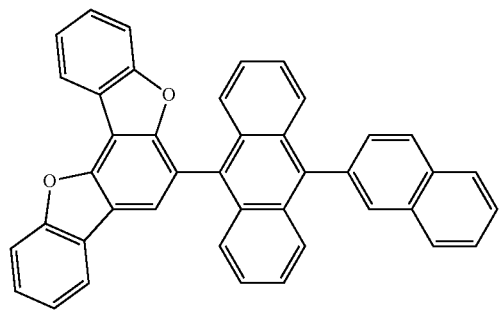

-continued
H65
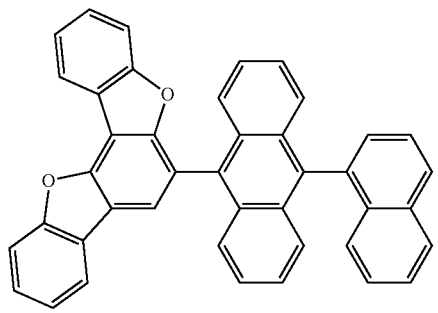
H66
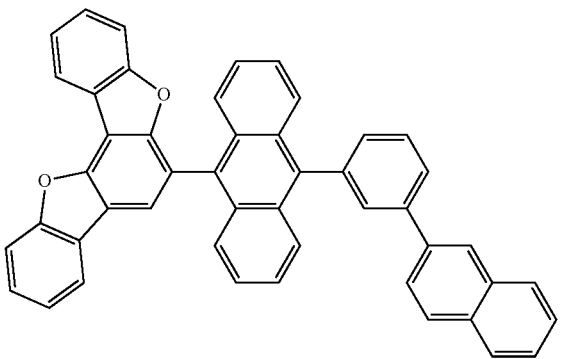
H67
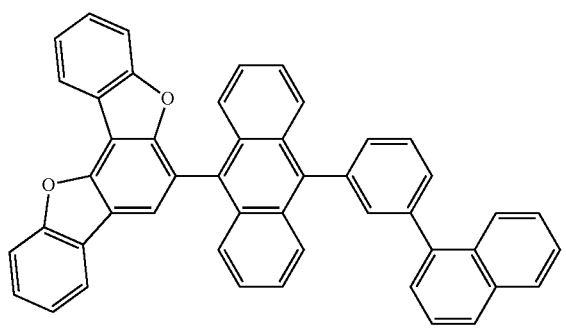
H68
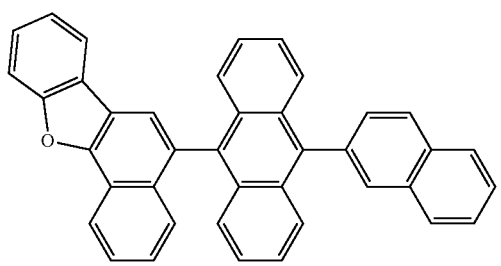
H69
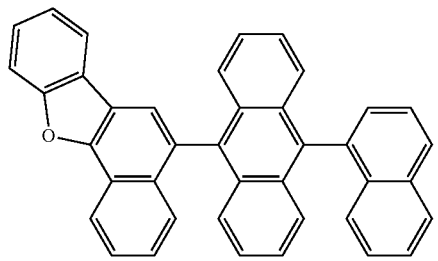
H70
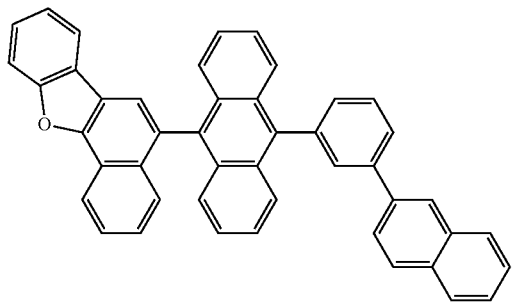
H71
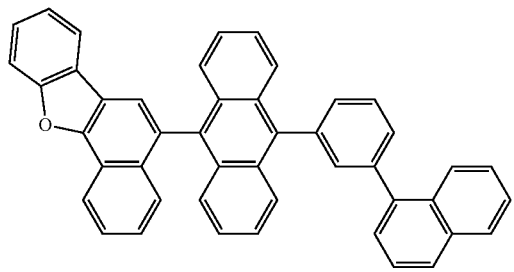
H72
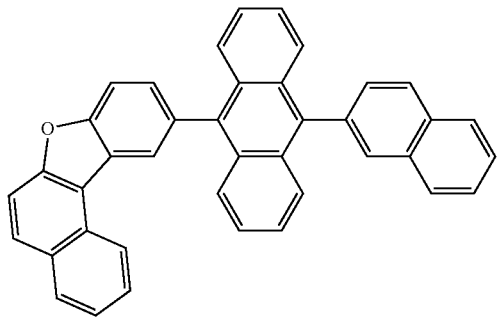

-continued
H73
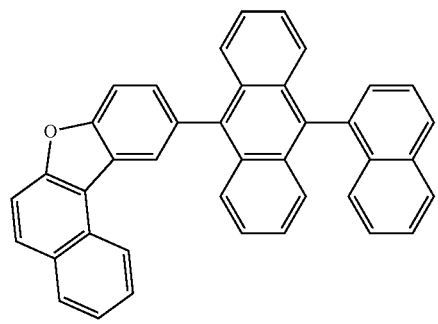
H74
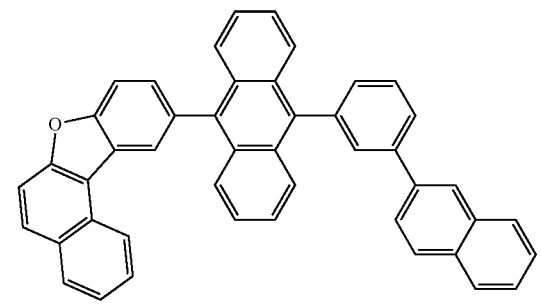
H75
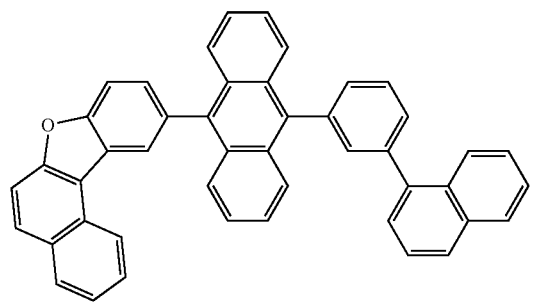
H76
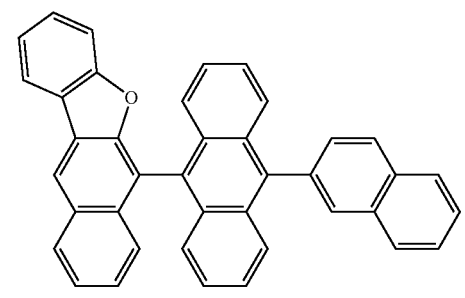
H77
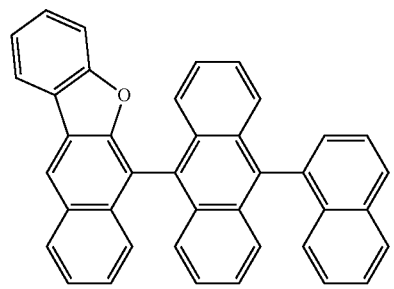
H78
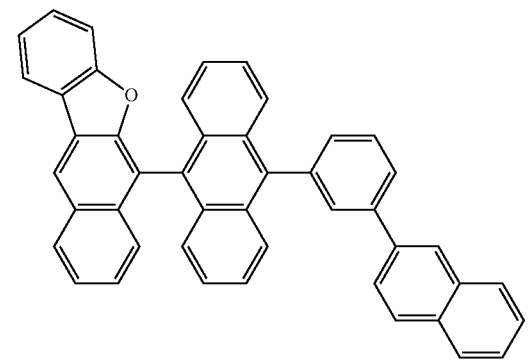
H79
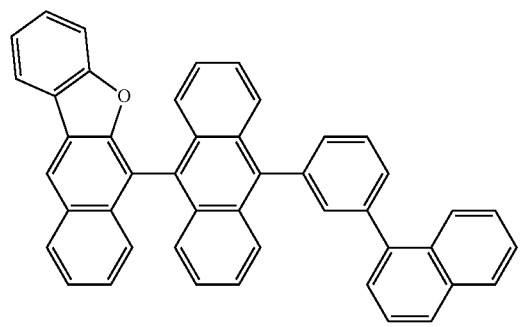
H80
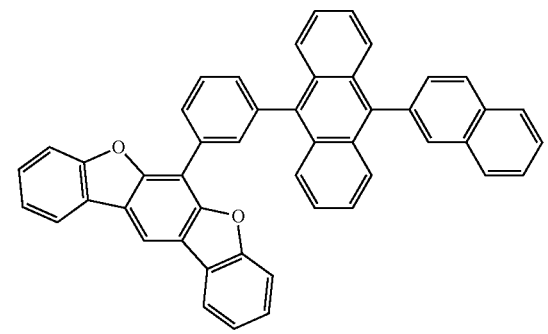

-continued
H81
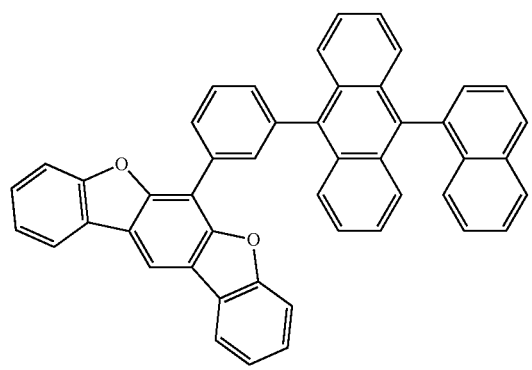
H82
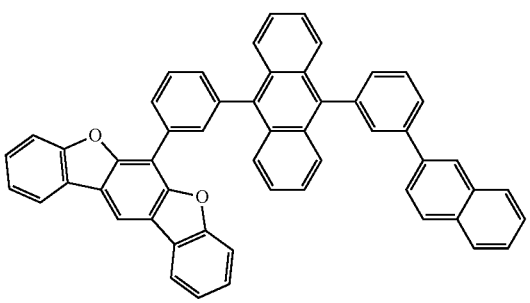
H83
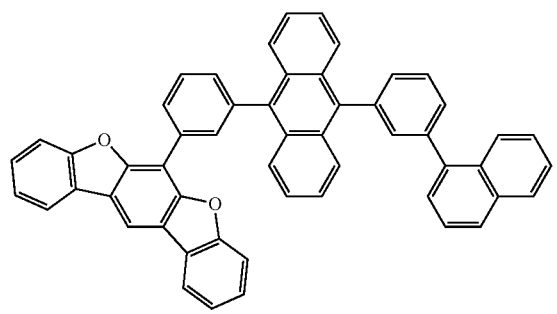
H84
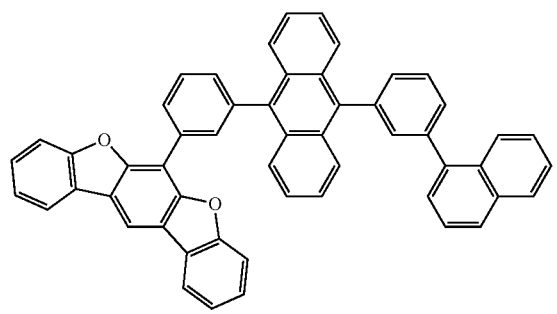
H85
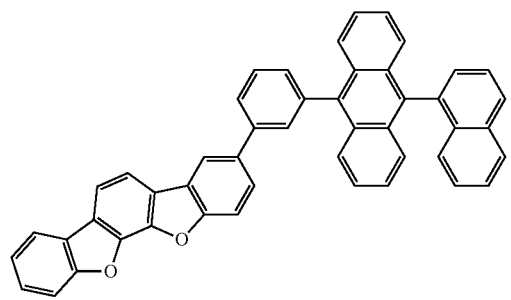
H86
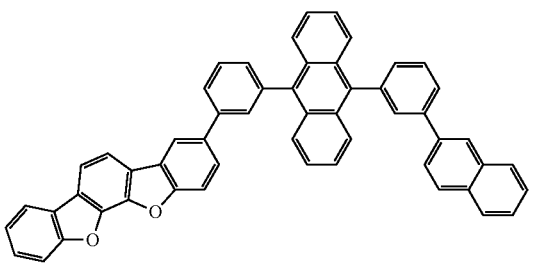
H87
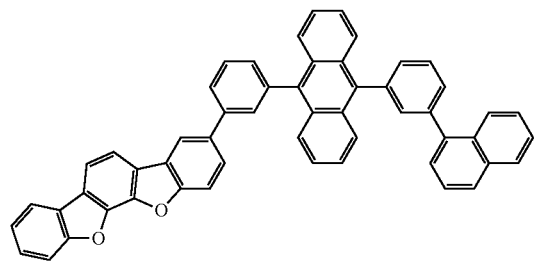
H88
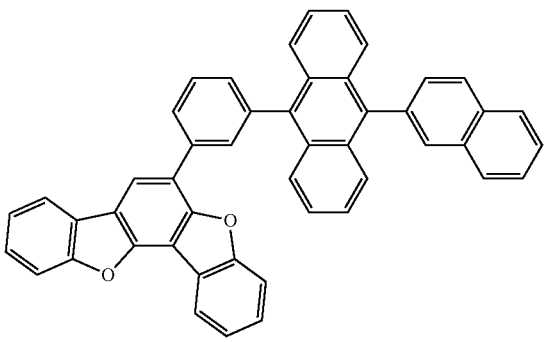

-continued
H89
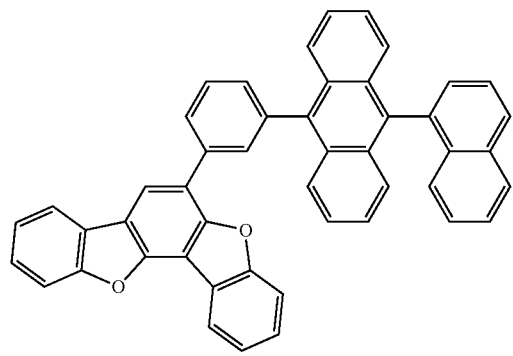
H90
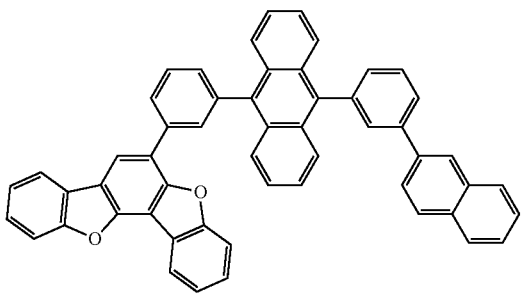
H91
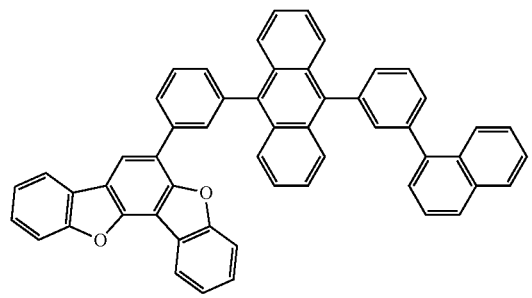
H92
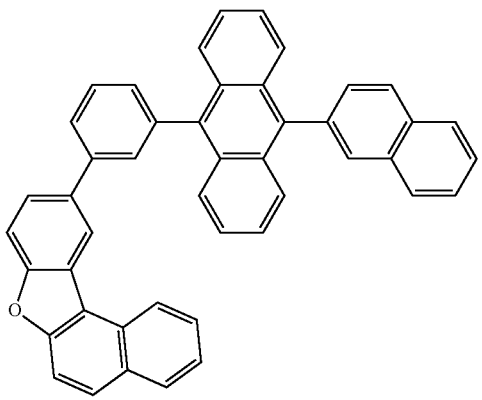
H93
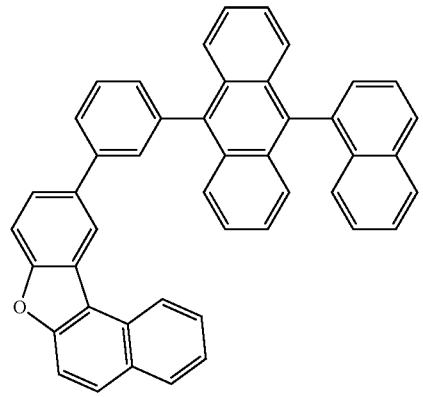
H94
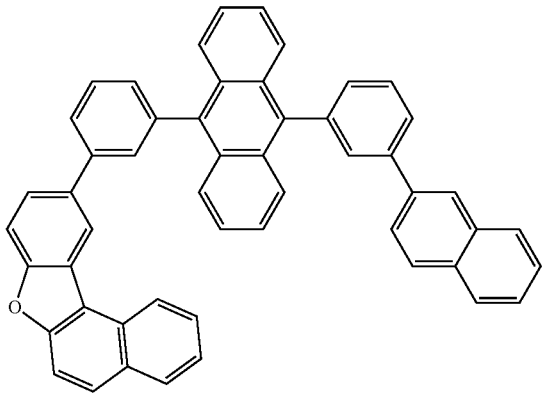
H95
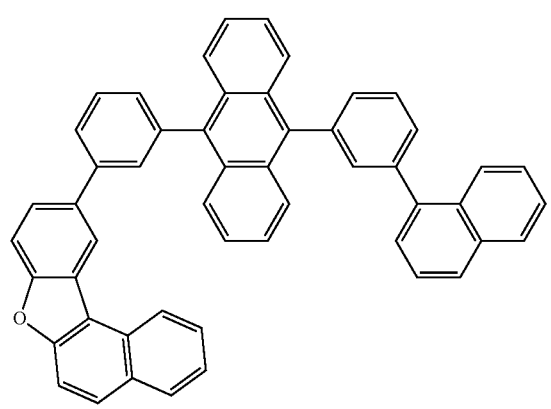
H96
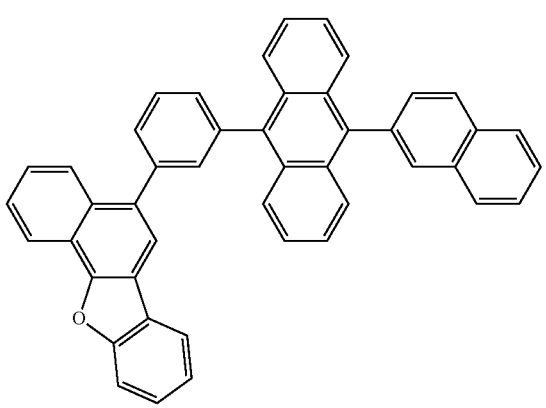

-continued
H97
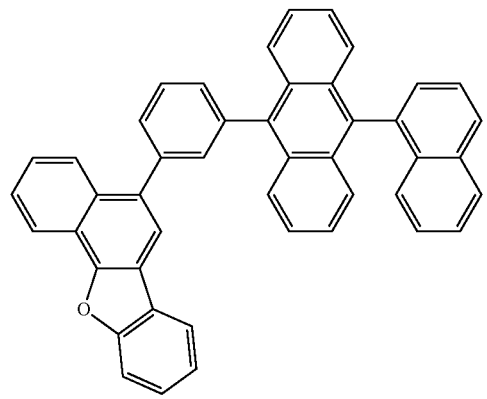
H98
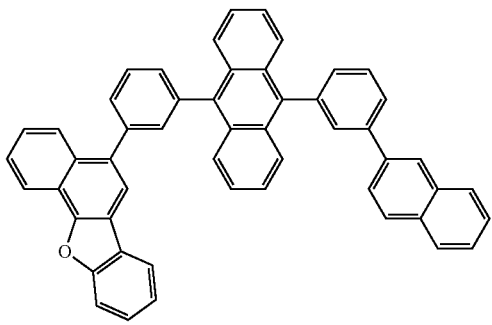
H99
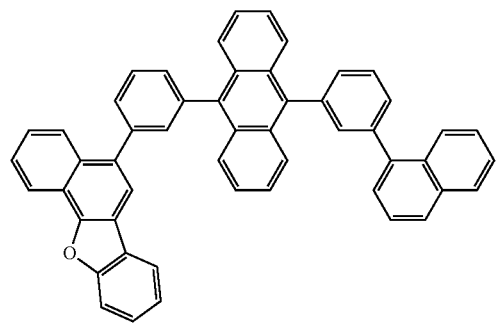
H100
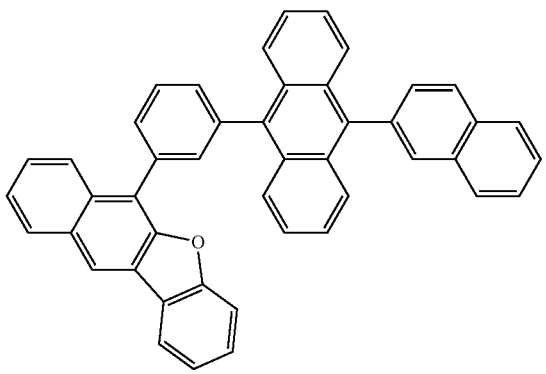
H101
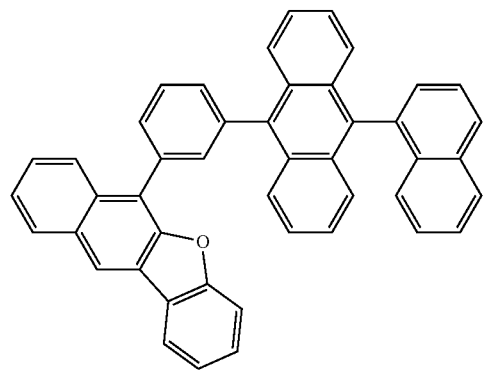
H102
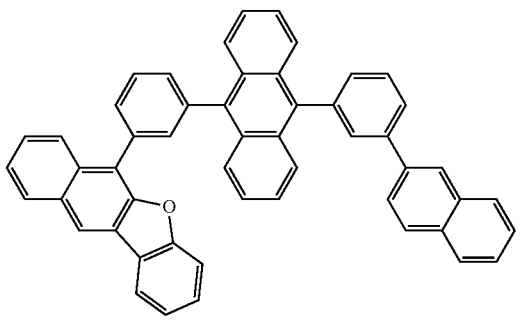
H103
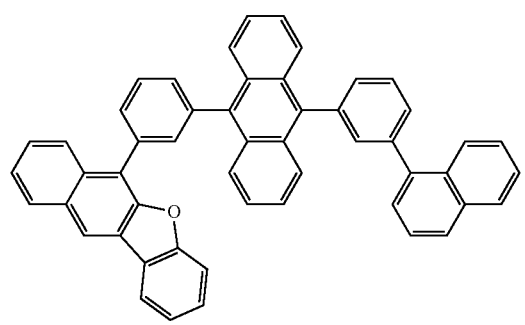
H104
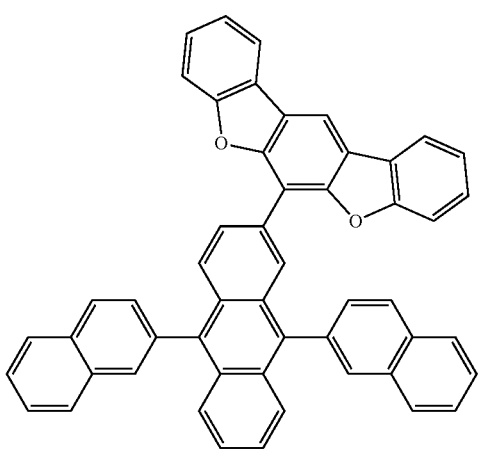

-continued
H105
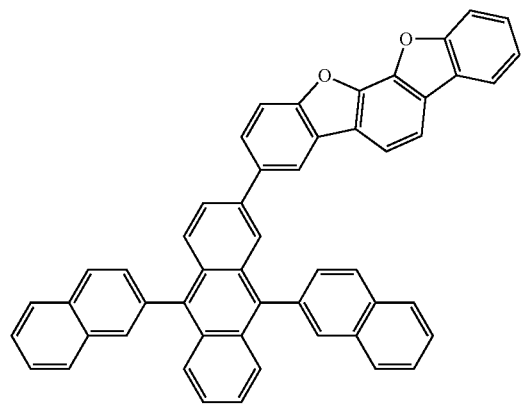
H106
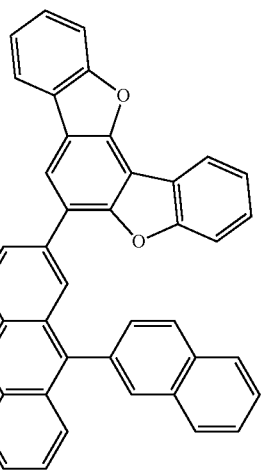
H107
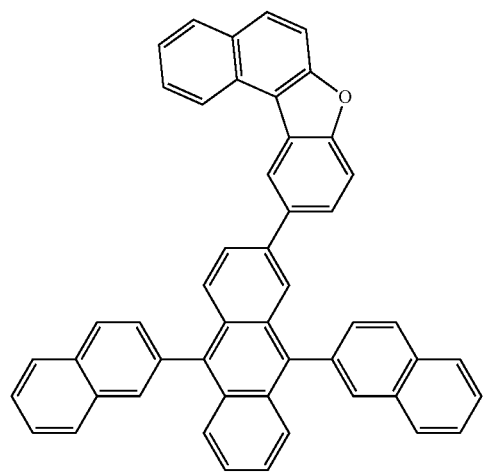
H108
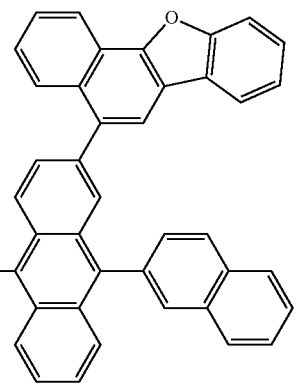
H109
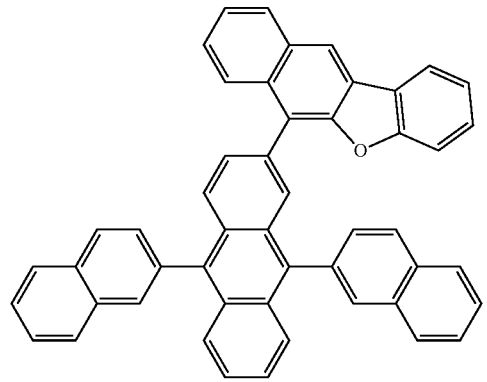
H110
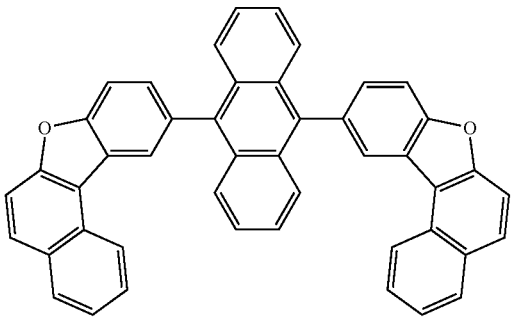
H111
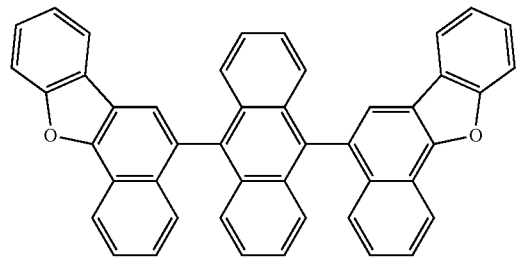
H112
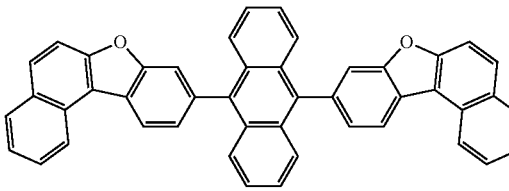

-continued
H113
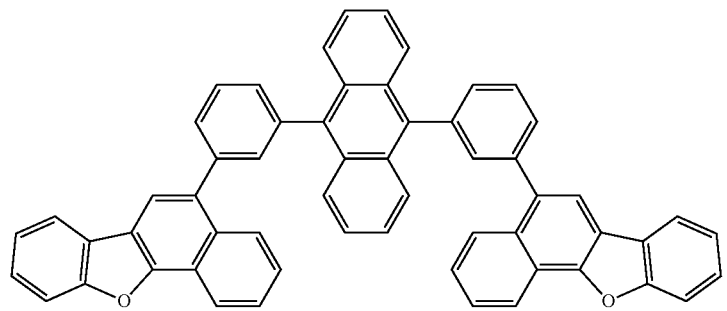
H114
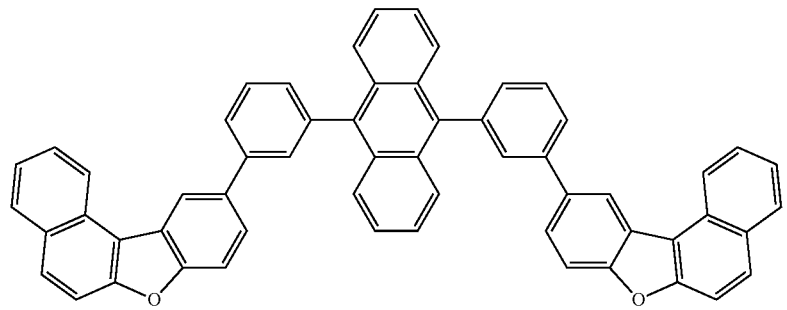
H115
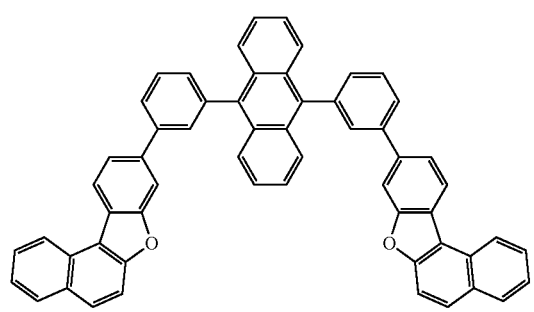
H116
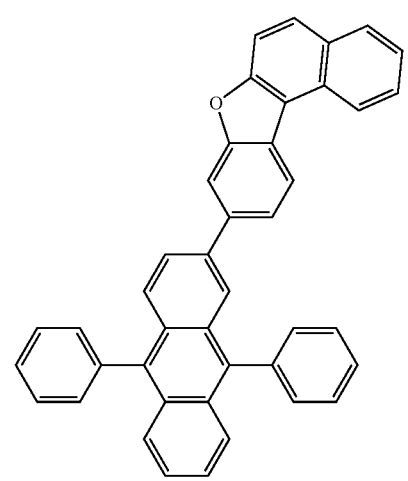
H117
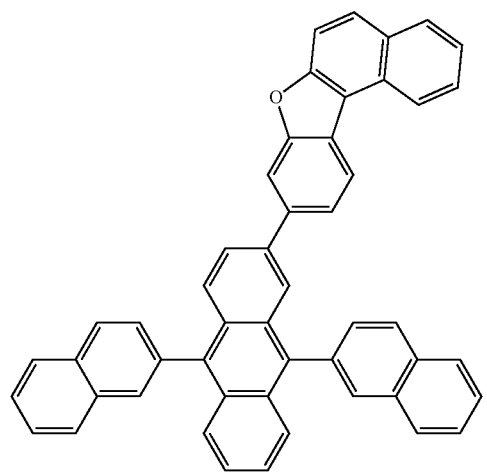
H118
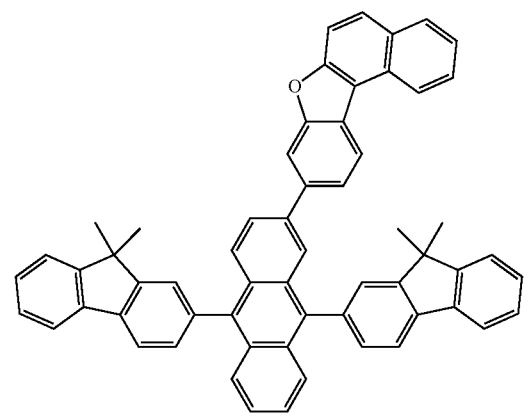

-continued
H119
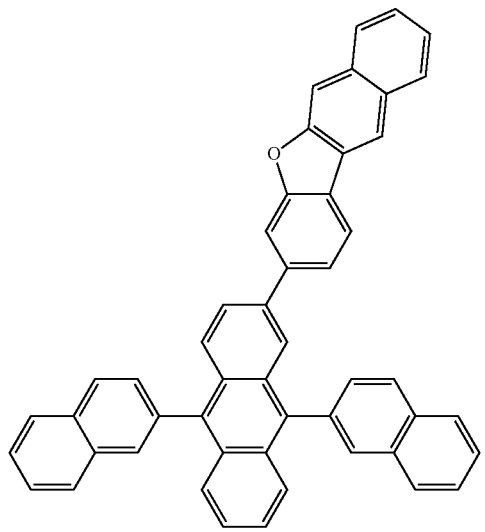
H120
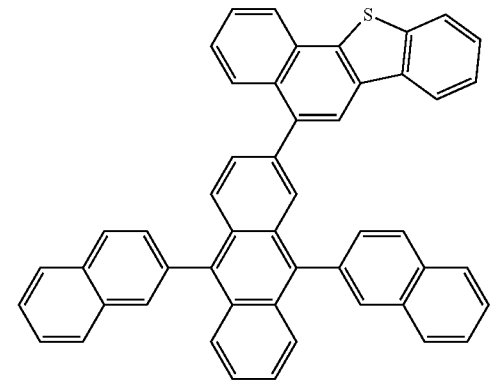
H121
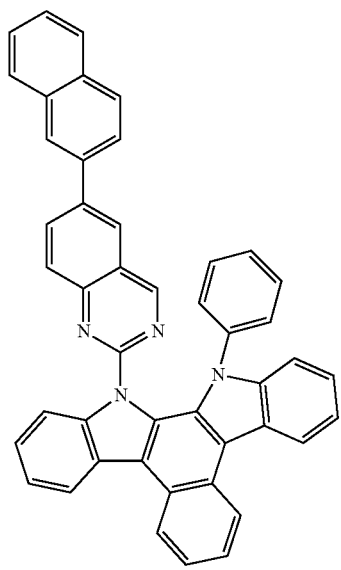
H122
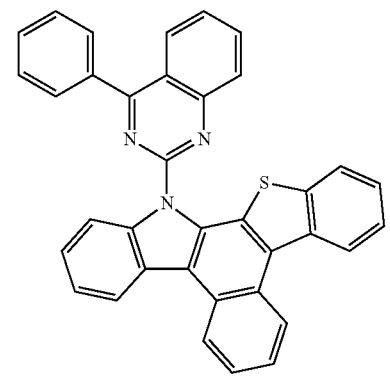
H123
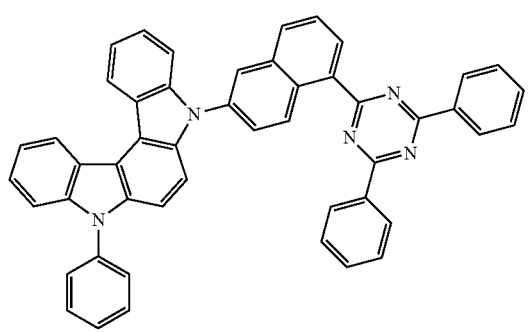
H124
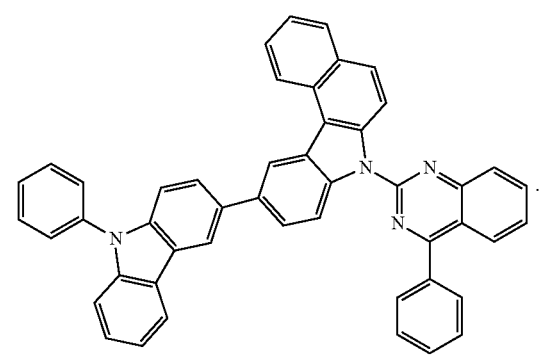

Phosphorescent Dopant

The phosphorescent dopant may include at least one transition metal as a central metal. The phosphorescent dopant may include a monodentate ligand, a bidentate ligand, a tridentate ligand, a tetradentate ligand, a pentadentate ligand, a hexadentate ligand, or any combination thereof. The phosphorescent dopant may be electrically neutral.

In an embodiment, the phosphorescent dopant may include an organometallic compound represented by Formula 401:

$$M(L_{401})_{xc1}(L_{402})_{xc2} \qquad \text{Formula 401}$$

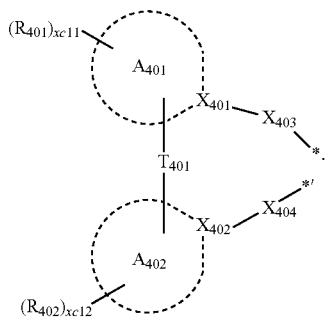

Formula 402 wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is two or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', and $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are each the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are each the same as described in connection with $Q_1$, xc11 and xc12 may each independently be an integer from 0 to 10, and and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 402 is 2 or more, two ring $A_{401}$ in two or more of $L_{401}$(s) may be optionally linked to each other via $T_{402}$, which is a linking group, and two ring $A_{402}$ may optionally be linked to each other via $T_{403}$, which is a linking group (see Compounds PD1 to PD4 and PD7). The variables $T_{402}$ and $T_{403}$ are each the same as described in connection with T401.

The variable $L_{402}$ in Formula 401 may be an organic ligand. In an embodiment, $L_{402}$ may include a halogen group, a diketone group (for example, an acetylacetonate group), a carboxylic acid group (for example, a picolinate group), a —C(=O) group, an isonitrile group, a —CN group, a phosphorus group (for example, a phosphine group, a phosphite group, etc.), or any combination thereof.

The phosphorescent dopant may include, for example, one of compounds PD1 to PD25, or any combination thereof.

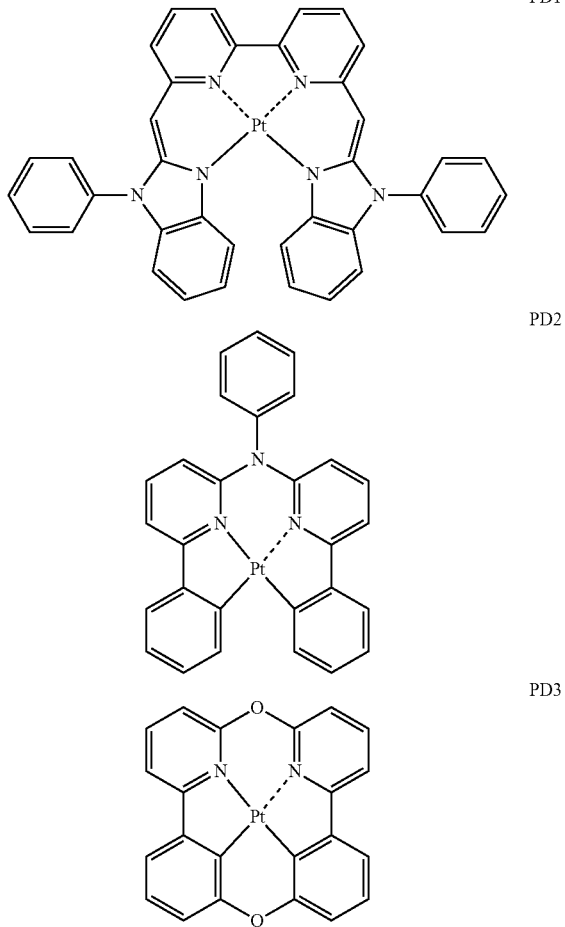

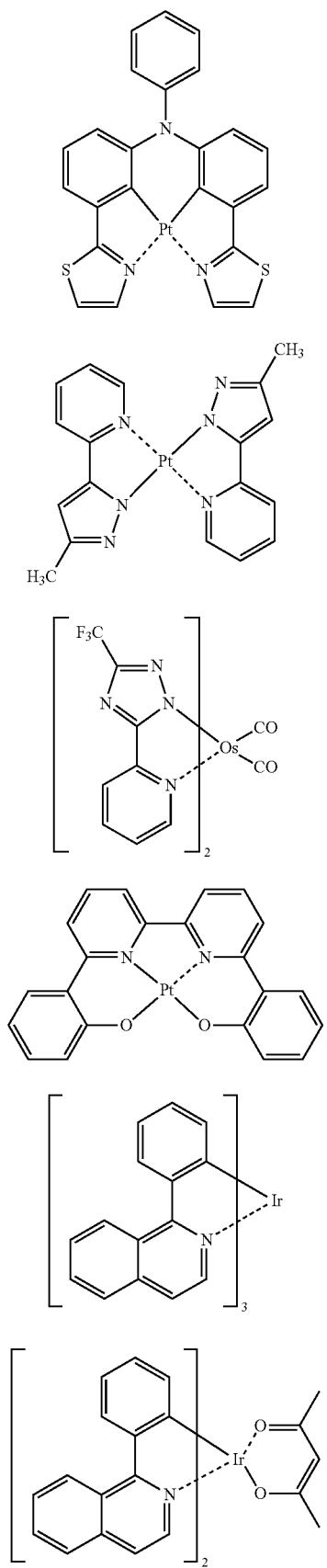
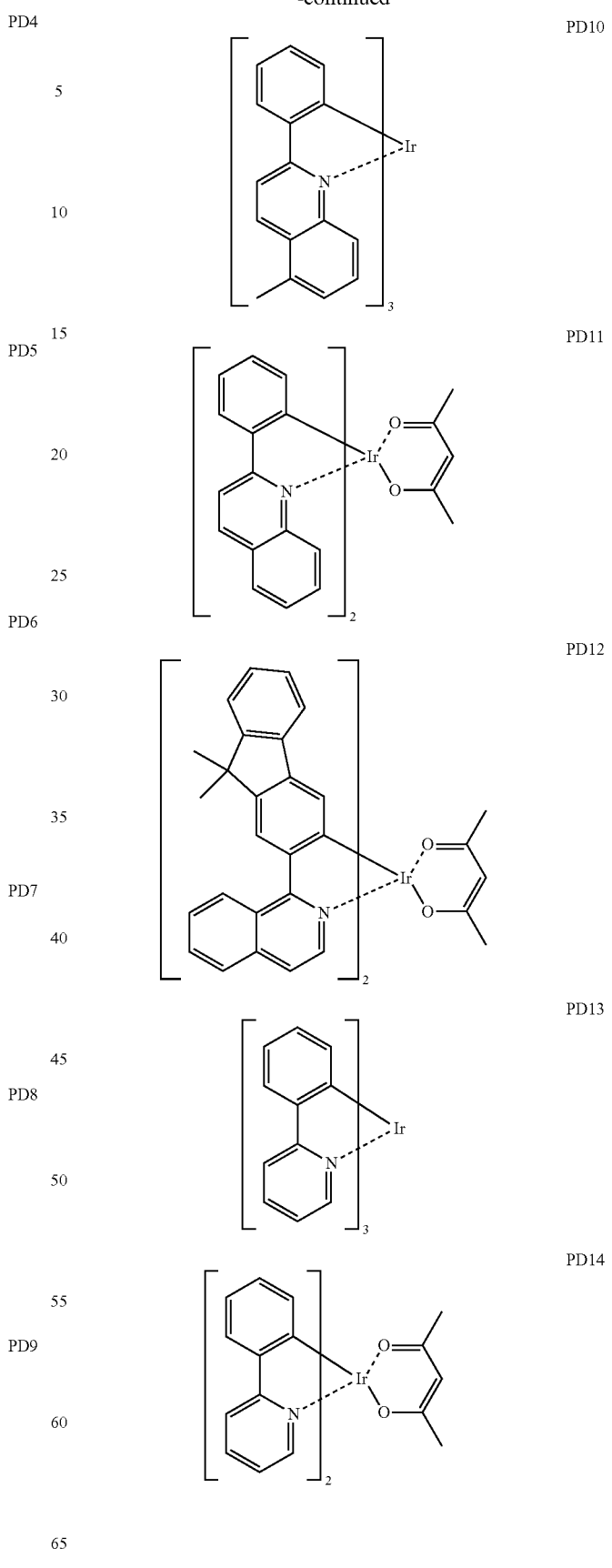

-continued
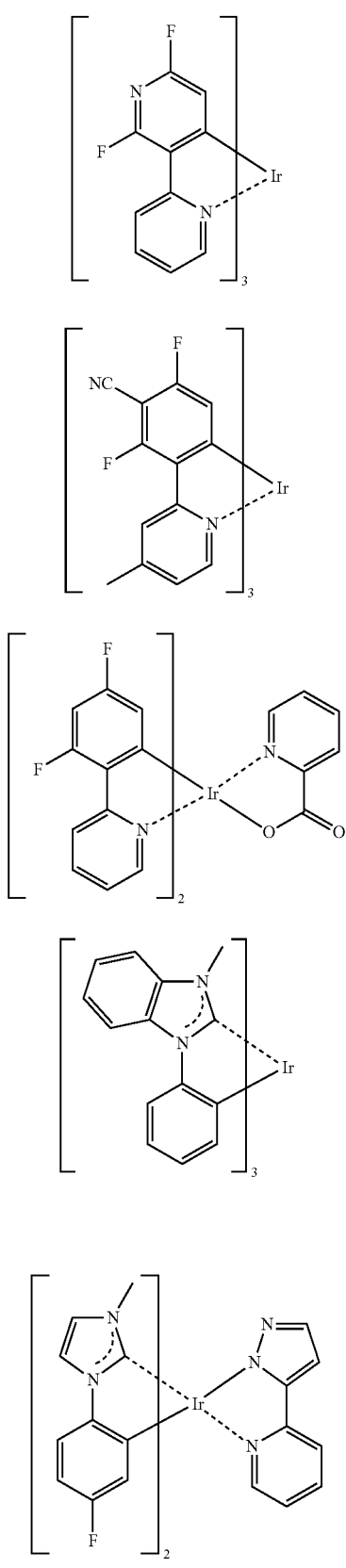
PD15
PD16
PD17
PD18
PD19
-continued
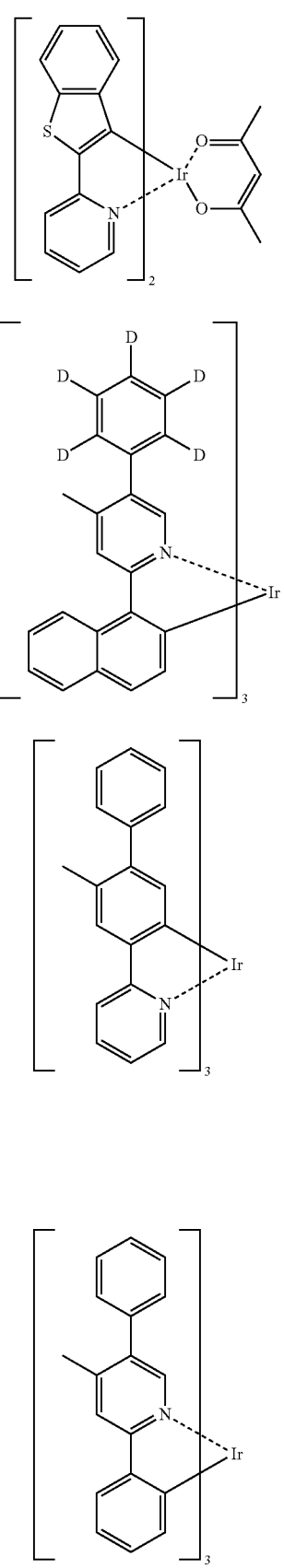
PD20
PD21
PD22
PD23

PD24
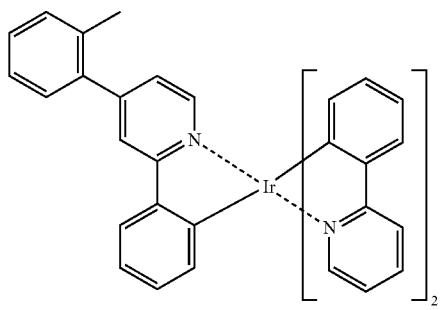

PD25
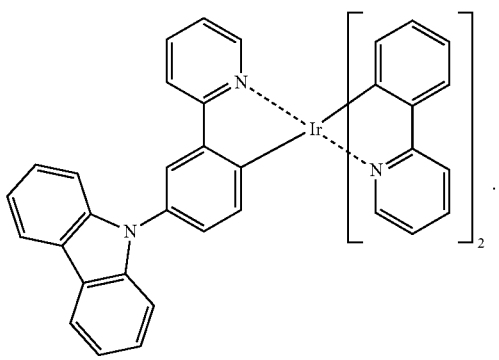

Fluorescent Dopant

The fluorescent dopant may include an amine group-containing compound, a styryl group-containing compound, or any combination thereof. In an embodiment, the fluorescent dopant may include a compound represented by Formula 501:

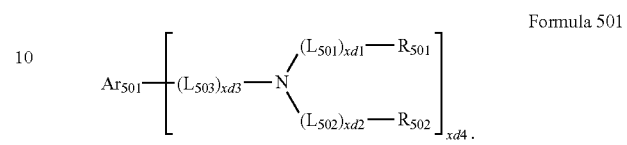

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In an embodiment, xd4 in Formula 501 may be 2. In an embodiment, the fluorescent dopant may include: one of Compounds FD1 to FD36; DPVBi; DPAVBi; or any combination thereof:

FD1
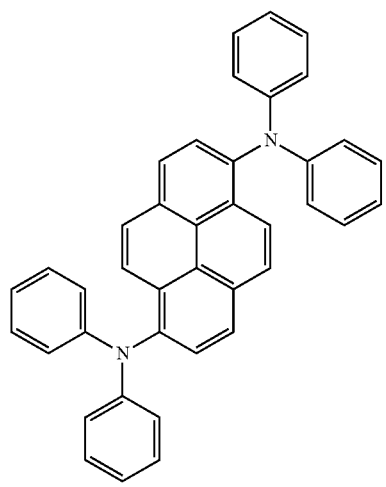

FD2
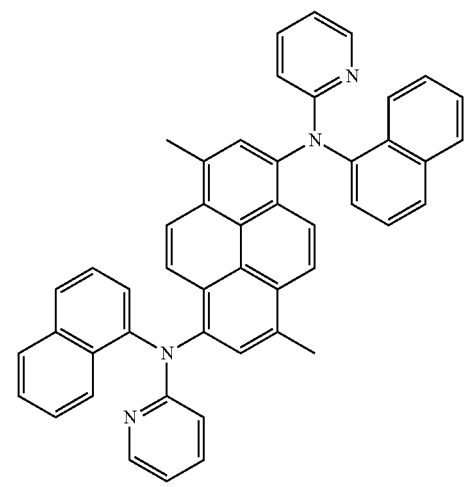

-continued
FD3
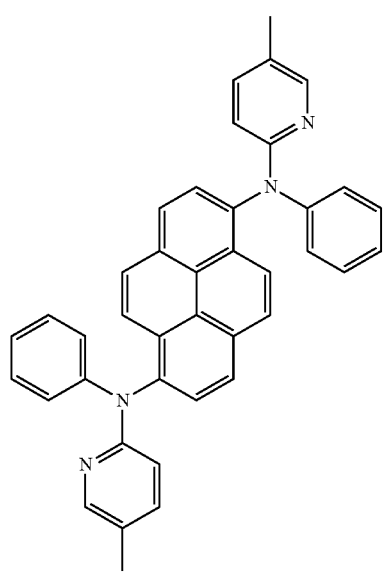
FD4
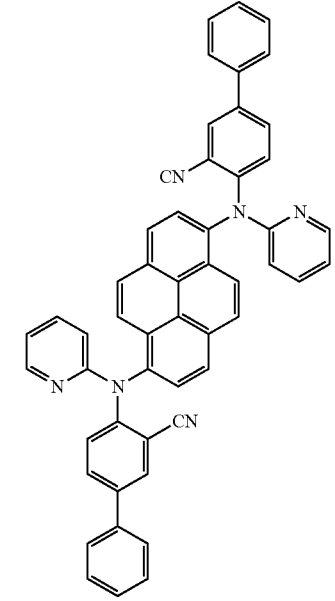
FD5
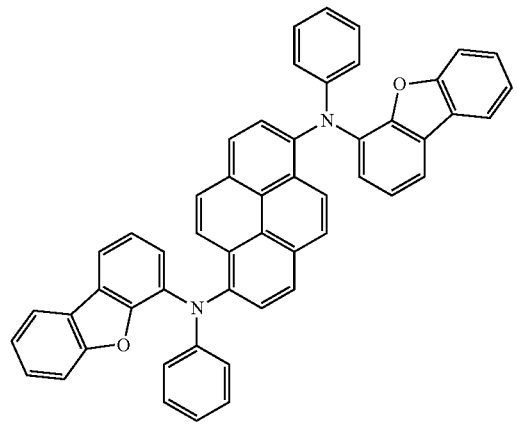
FD6
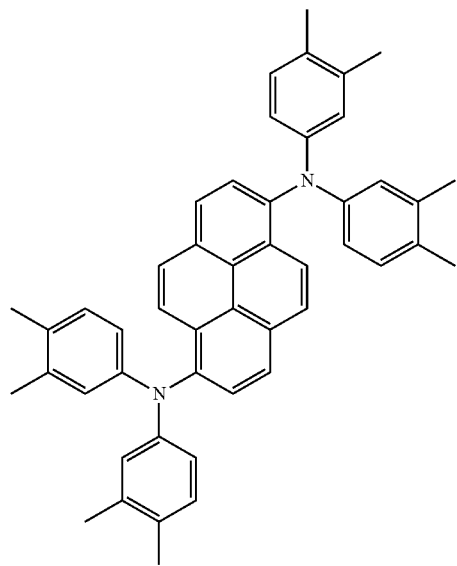
FD7
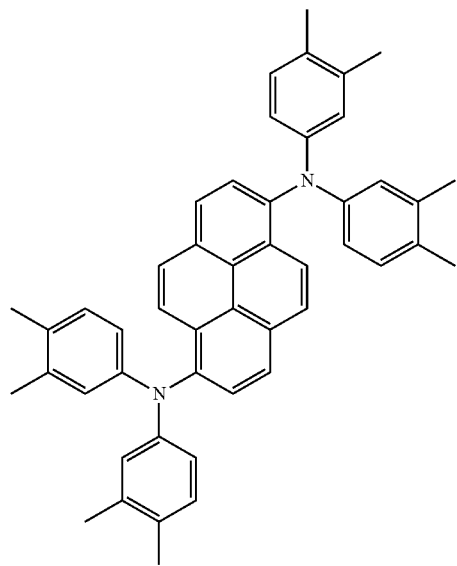
FD8
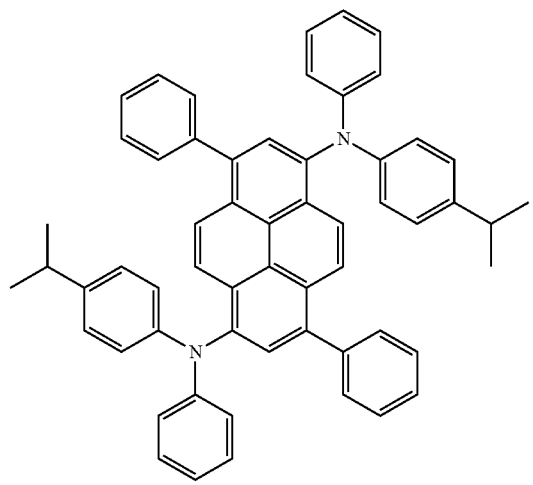

-continued
FD9
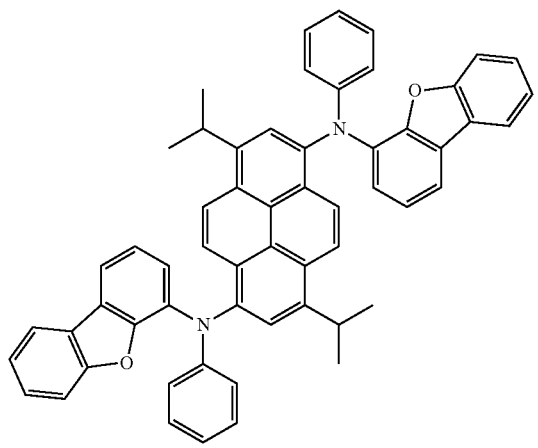
FD10
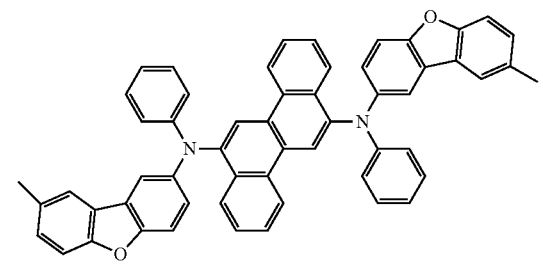
FD11
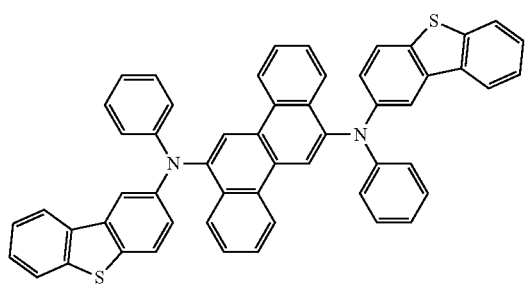
FD12
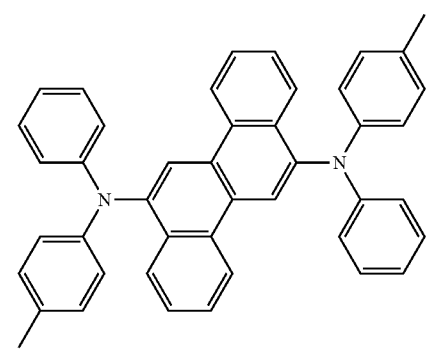
FD13
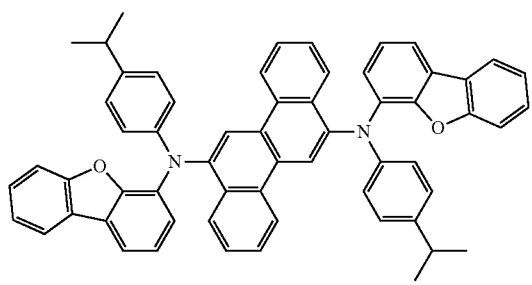
FD14
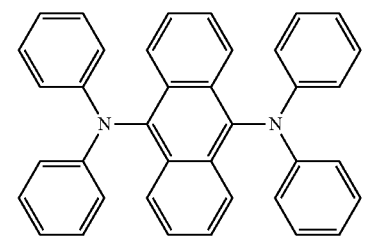
FD15
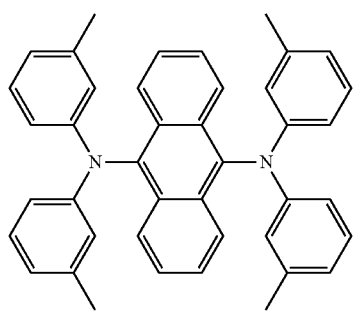
FD16
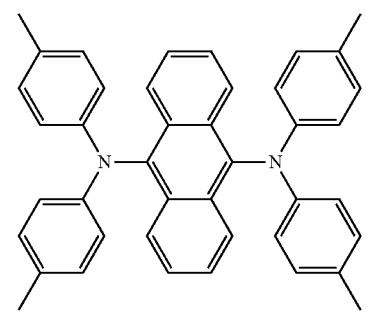

-continued
FD17
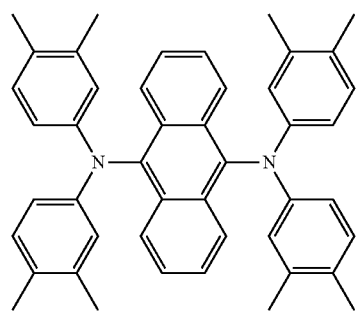
FD18
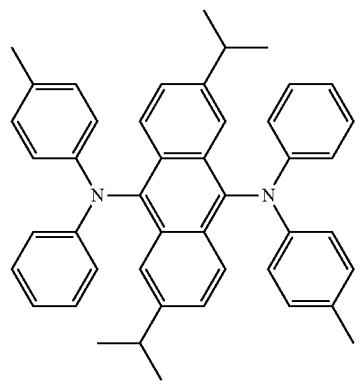
FD19
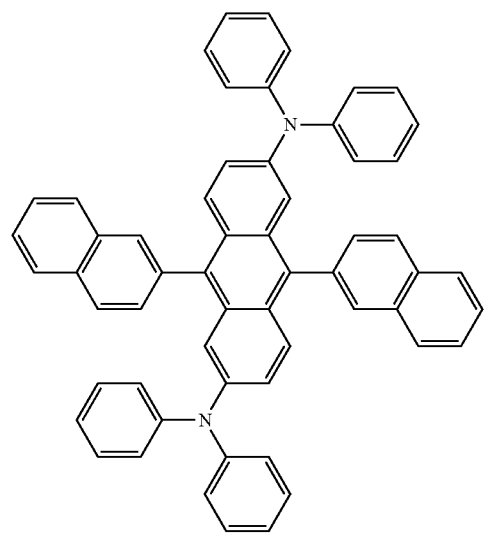
FD20
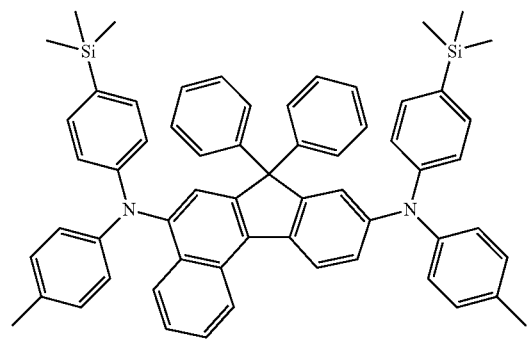
FD21
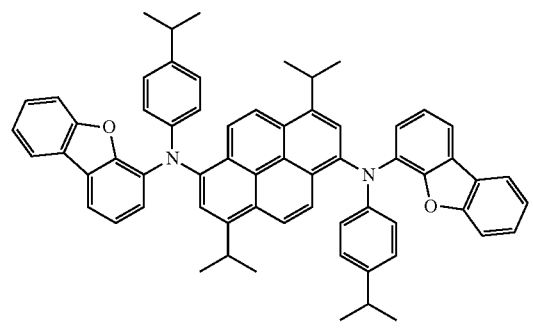
FD22
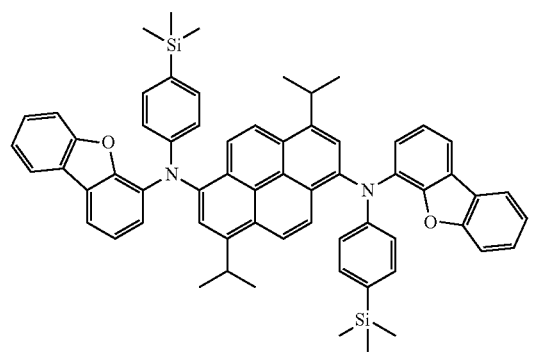
FD23
FD24

-continued
FD25
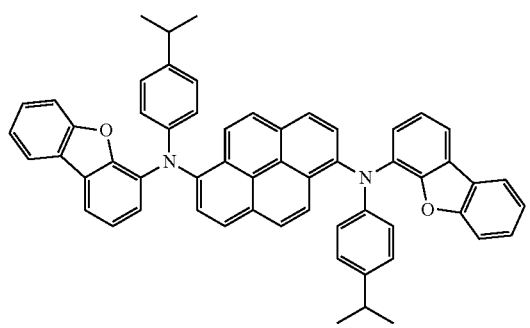
FD26
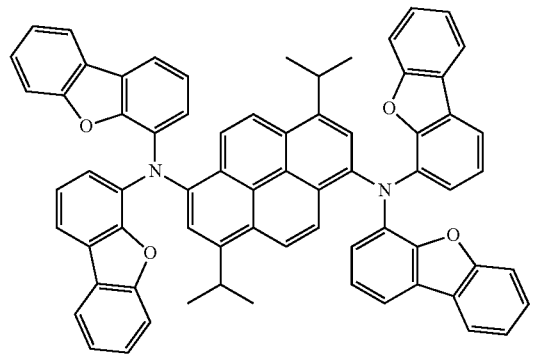
FD27
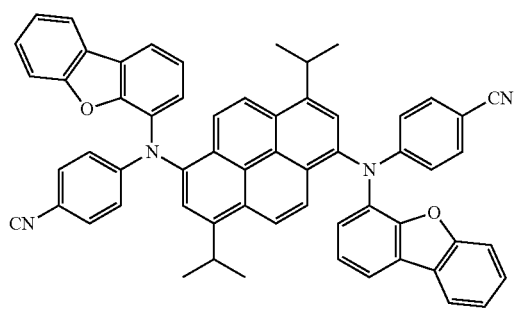
FD28
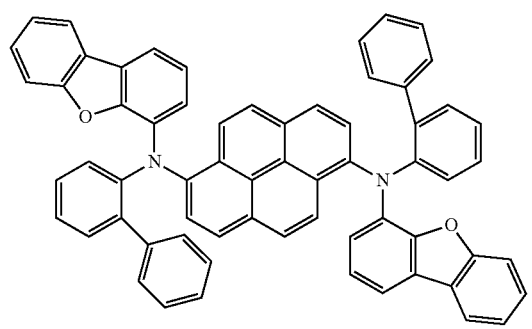
FD29
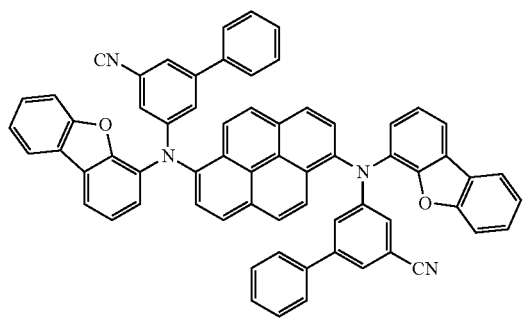
FD30
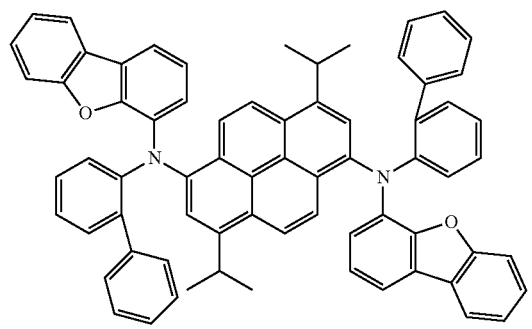
FD31
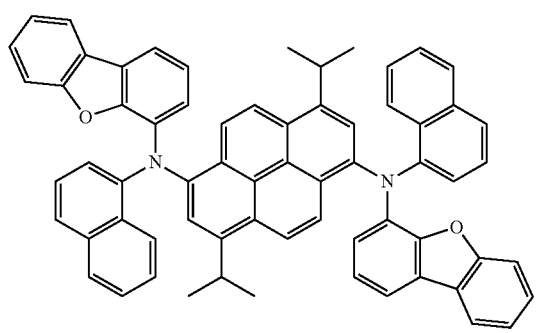
FD32
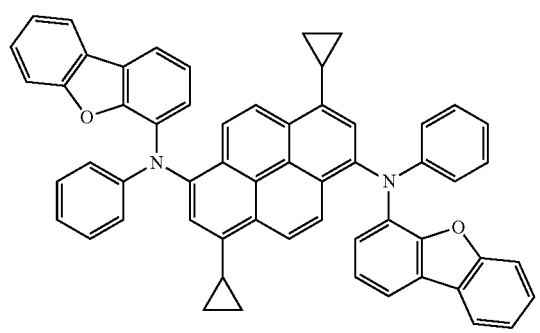

-continued

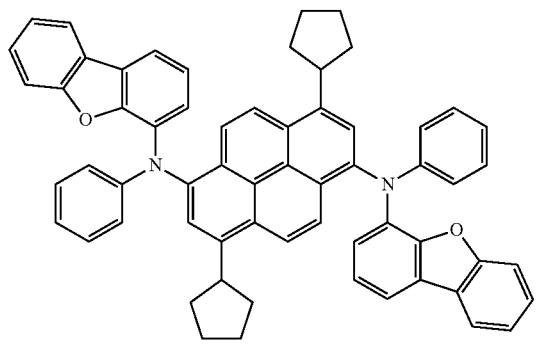
FD33

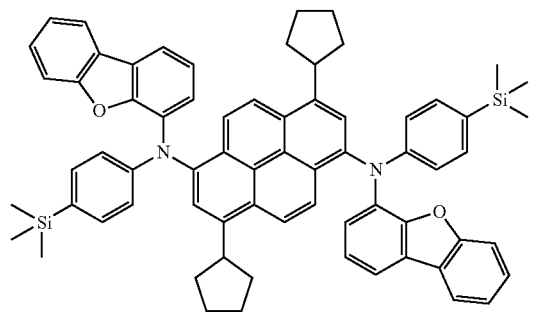
FD34

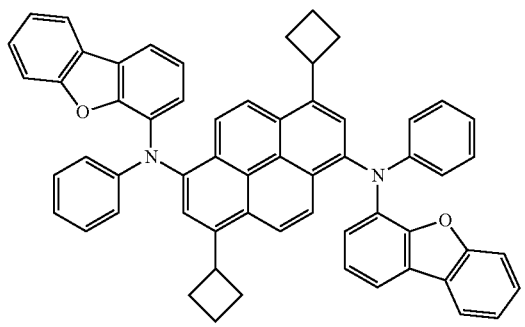
FD35

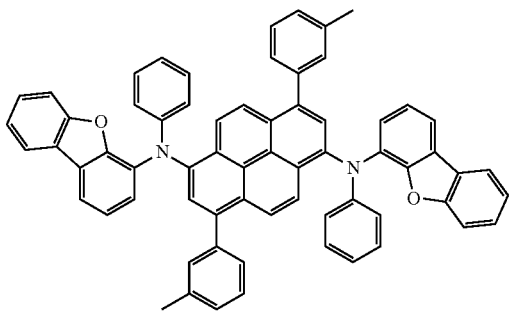
FD36

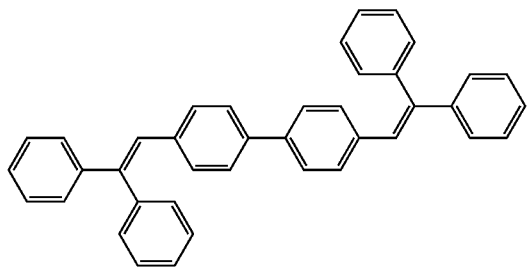
DPVBi

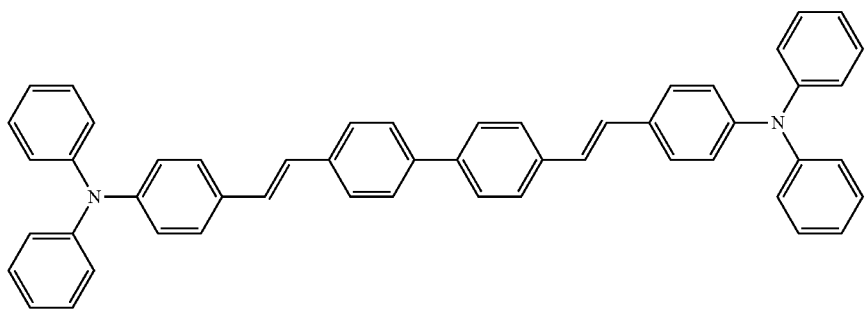
DPAVBi

Delayed Fluorescence Material

The emission layer 133 may include a delayed fluorescence material. As used herein, the delayed fluorescence material may be selected from compounds capable of emitting delayed fluorescence based on the delayed fluorescence emission mechanism. The delayed fluorescence material included in the emission layer 133 may act as a host or a dopant depending on the type of other materials included in the emission layer 133.

In an embodiment, the difference between a triplet energy level (eV) of the delayed fluorescence material and a singlet energy level (eV) of the delayed fluorescence material may be greater than or equal to about 0 eV and less than or equal to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the emission efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).
Examples of the delayed fluorescence material may include at least one of the following compounds DF1 to DF9:
DF1(DMAC-DPS)
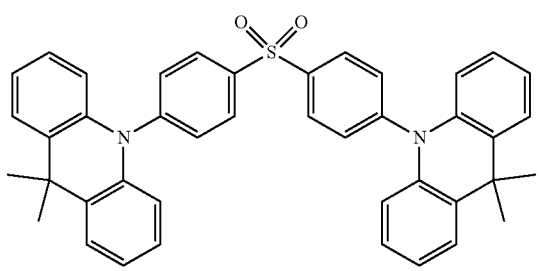
DF2(ACRFL-CN)
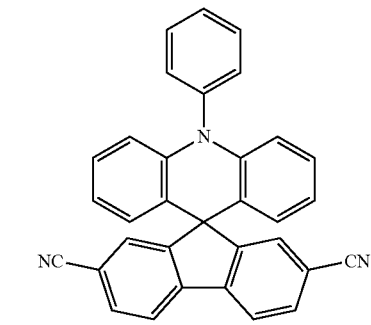
DF3(ACRSA)
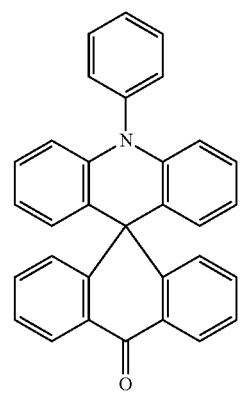
DF4(CC2TA)
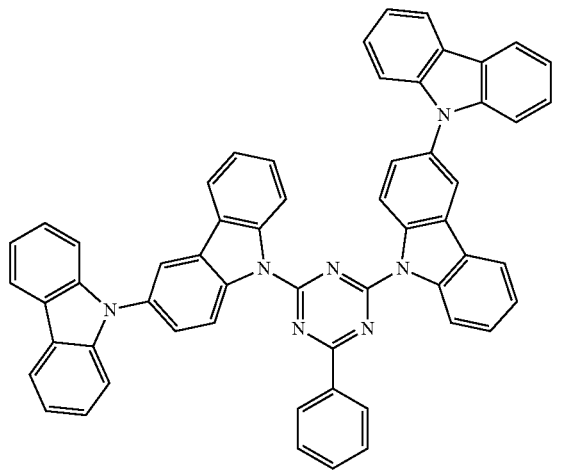
DF5(PIC-TRZ)
DF6(PIX-TRZZ)
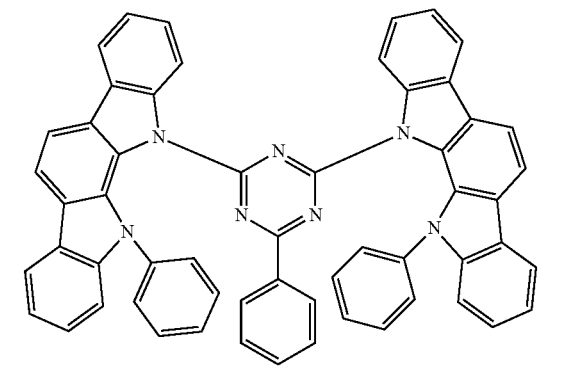
DF7(PXZ-TRZ)
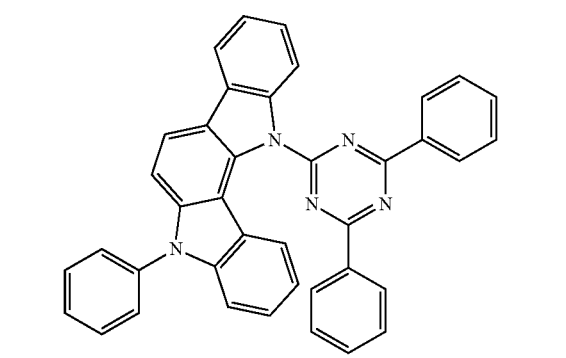

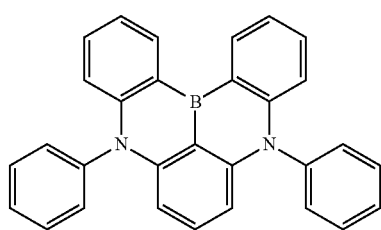

DF8(DABNA-1)

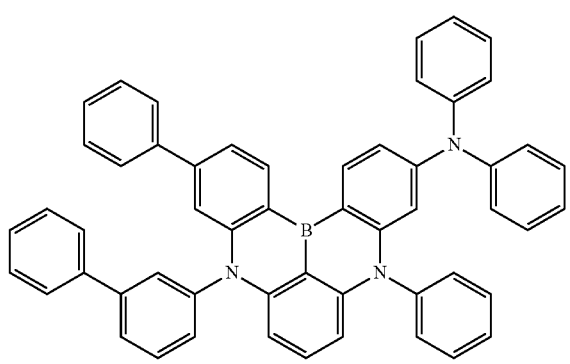

DF9(DABNA-2)

Quantum Dot

The emission layer 133 may include a quantum dot. The quantum dot refers to a crystal of a semiconductor compound, and may include any material capable of emitting light of various emission wavelengths according to the size of the crystal. The diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) process or molecular beam epitaxy (MBE) process, and which requires low costs.

The quantum dot may include: a semiconductor compound of Groups II-VI; a semiconductor compound of Groups III-V; a semiconductor compound of Groups III-VI; a semiconductor compound of Groups I-III-VI; a semiconductor compound of Groups IV-VI; an element or a compound of Group IV; or any combination thereof.

Examples of the semiconductor compound of Groups II-VI may include: a binary compound, such as CdSe, CdTe, ZnS, ZnSe, ZnTe, ZnO, HgS, HgSe, HgTe, MgSe, or MgS; a ternary compound, such as CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the semiconductor compound of Groups III-V may include: a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like; or any combination thereof. In an embodiment, the semiconductor compound of Groups III-V may further include Group II elements. Examples of the semiconductor compound of Groups III-V further including Group II elements may include InZnP, InGaZnP, InAlZnP, and the like.

Examples of the semiconductor compound of Groups III-VI may include: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; or any combination thereof. Examples of the semiconductor compound of Groups 1-III-VI may include: a ternary compound, such as AgInS, $AgInS_2$, CuInS, $CuInS_2$, $CuGaO_2$, $AgGaO_2$, or $AgAlO_2$; or any combination thereof.

Examples of the semiconductor compound of Groups IV-VI may include: a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof. The Group IV element or compound may include: an elementary substance, such as Si or Ge; a binary compound, such as SiC or SiGe; or any combination thereof.

Each element included in a multi-element compound such as the binary compound, ternary compound and quaternary compound, may exist in a particle with a uniform concentration or non-uniform concentration.

In an embodiment, the quantum dot may have a single structure or a core/shell dual structure. In the case of the quantum dot having a single structure, the concentration of each element included in the corresponding quantum dot is uniform. In an embodiment, the material contained in the core and the material contained in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The element presented in the interface between the core and the shell of the quantum dot may have a concentration gradient that decreases toward the center of the quantum dot.

Examples of the shell of the quantum dot may be an oxide of metal, metalloid or non-metal, a semiconductor compound, and any combination thereof. Examples of the oxide of metal, metalloid or non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound may include, as described herein, a semiconductor compound of Groups II-VI, a semiconductor compound of Groups III-V, a semiconductor compound of Groups III-VI, a semiconductor compound of Groups I-III-VI, a semiconductor compound of Groups IV-VI, or any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The full width at half maximum (FWHM) of an emission wavelength spectrum of the quantum dot may be about 45 nm or less, for example, about 40 nm or less, for example, about 30 nm or less, and within these ranges, color purity or color reproducibility may be increased. In addition, since the light emitted through the quantum dot is emitted in all directions, the wide viewing angle can be improved.

In addition, the quantum dot may be a generally spherical nanoparticle, a generally pyramidal nanoparticle, a generally multi-armed nanoparticle, a generally cubic nanoparticle, may be a generally nanotube-shaped, a generally nanowire-shaped, generally nanofiber-shaped, or a generally nanoplate-shaped.

Because the energy band gap can be adjusted by controlling the size of the quantum dot, light having various wavelength bands can be obtained from the quantum dot emission layer. Therefore, by using quantum dots of different sizes, a light-emitting device that emits light of various wavelengths may be implemented. In an embodiment, the size of the quantum dot may be selected to emit red, green and/or blue light. In addition, the size of the quantum dot may be configured to emit white light by combining light of various colors.

Electron Transport Region 135 in Interlayer 130

The electron transport region 135 may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region 135 may include a buffer layer, a hole blocking layer, an electron control layer, an electron transport layer, an electron injection layer, or any combination thereof.

In an embodiment, the electron transport region 135 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, in each structure, layers are stacked sequentially from the emission layer 133.

In an embodiment, the electron transport region 135 may include an electron transport layer, and the electron transport layer may be formed using the nanoparticle ink composition.

The electron transport region 135 (for example, the buffer layer, the hole blocking layer, the electron control layer, or the electron transport layer in the electron transport region 135) may include a metal-free compound including at least one π electron-deficient nitrogen-containing $C_1$-$C_{60}$ cyclic group.

In an embodiment, the electron transport region 135 may include a compound represented by Formula 601 below.

$$[Ar_{601}]_{xe11}\text{-}[(L_{601})_{xe1}\text{-}R_{601}]_{xe21}. \quad \text{Formula 601}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-\text{Si}(Q_{601})(Q_{602})(Q_{603})$, $-\text{C}(=\text{O})(Q_{601})$, $-\text{S}(=\text{O})_2(Q_{601})$, or $-\text{P}(=\text{O})(Q_{601})(Q_{602})$, $Q_{601}$ to $Q_{603}$ are each the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}(s)$ may be linked via a single bond. In an embodiment, $Ar_{601}$ in Formula 601 may be a substituted or unsubstituted anthracene group.

In an embodiment, the electron transport region 135 may include a compound represented by Formula 601-1:

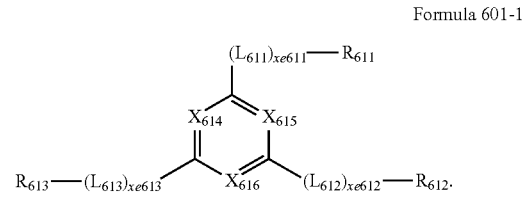

Formula 601-1 wherein, in Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are each the same as described in connection with $L_{601}$, xe611 to xe613 are each the same as described in connection with xe1, $R_{611}$ to $R_{613}$ are each the same as described in connection with $R_{601}$, and $R_{614}$ to $R_{16}$ may each independently be hydrogen, deuterium, $-\text{F}$, $-\text{Cl}$, $-\text{Br}$, $-\text{I}$, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region 135 may include one of Compounds ET1 to ET45, 2,9-dimethyl-4,7-diphenyl-1,10-phenanthroline (BCP), 4,7-diphenyl-1,10-phenanthroline (Bphen), tris-(8-hydroxyquinoline)aluminum ($Alq_3$), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), diphenyl(4-(triphenylsilyl)phenyl)-phosphine oxide (TSPO1), or any combination thereof:

ET1
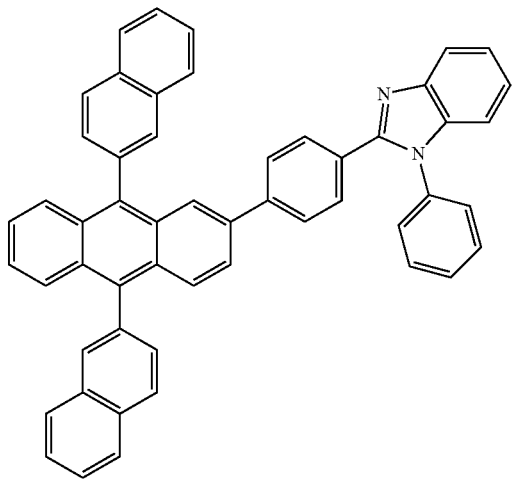
ET4
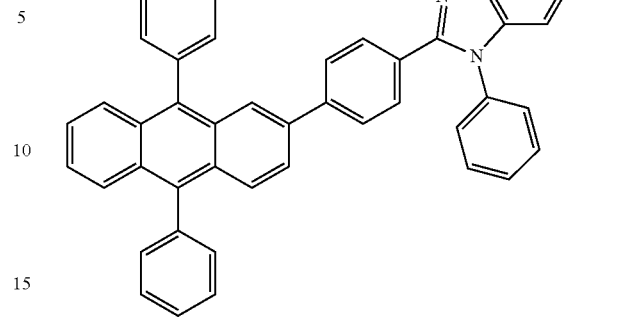
ET2
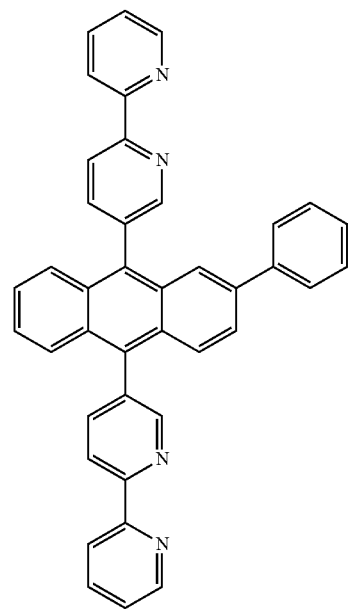
ET5
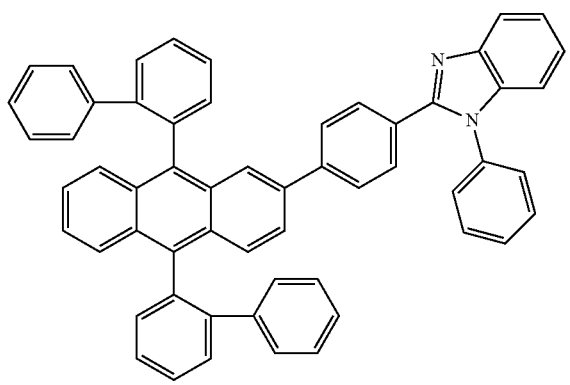
ET6
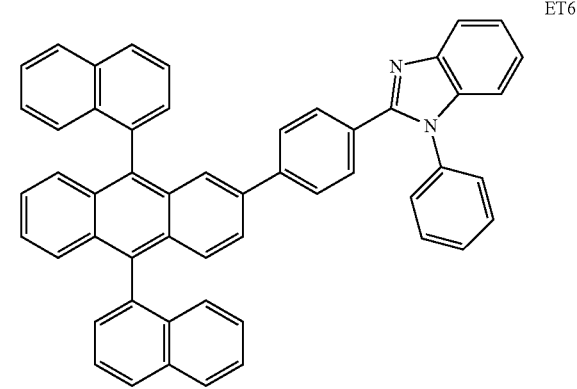
ET3
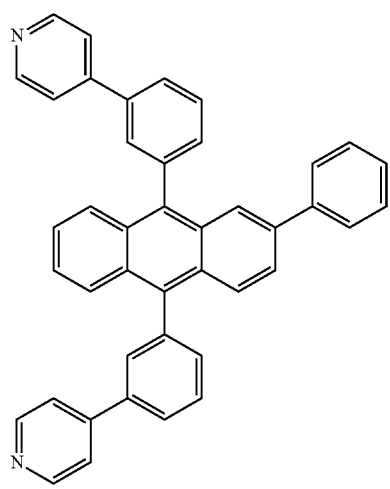
ET7
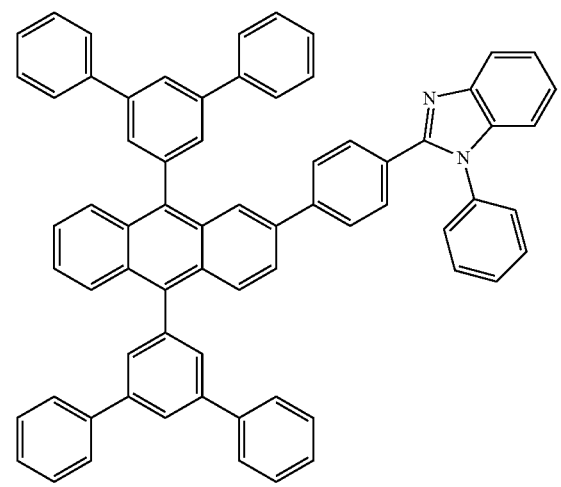

ET8
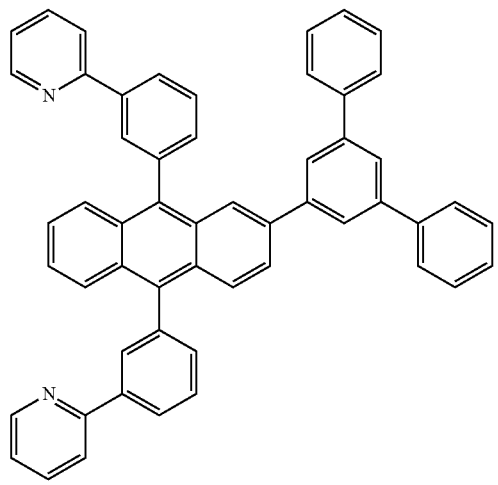
ET9
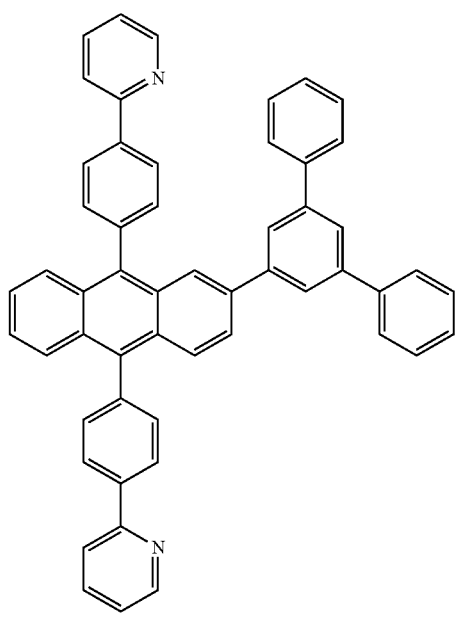
ET10
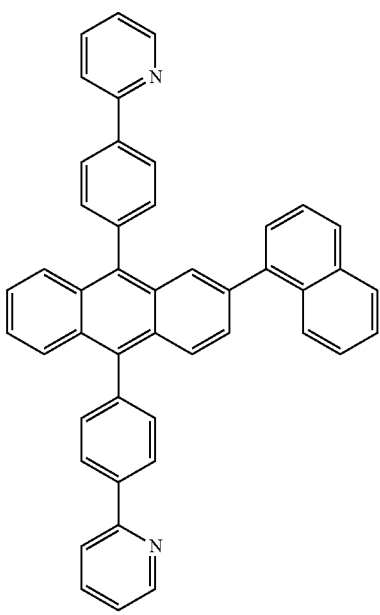
ET11
ET12
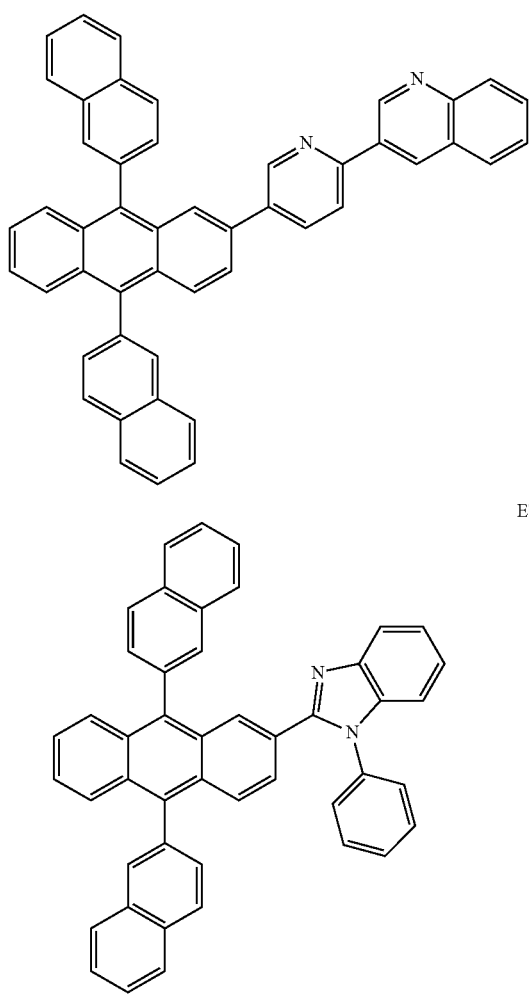

ET13
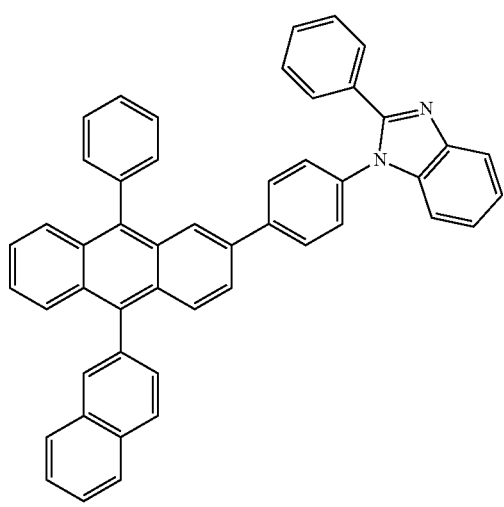
ET14
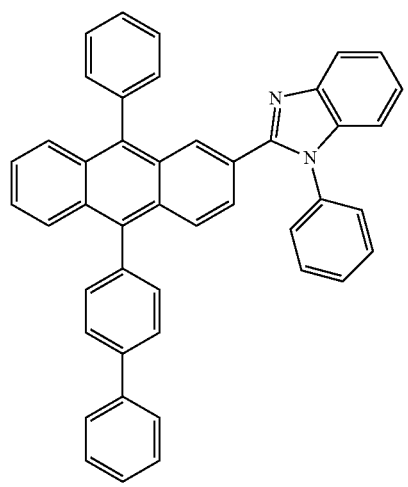
ET15
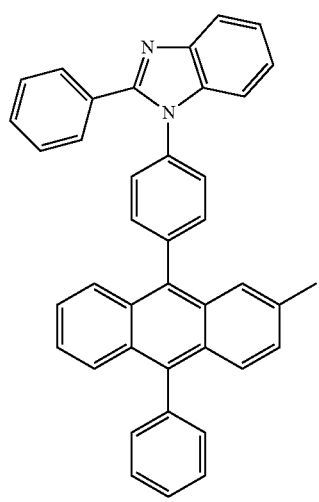
ET16
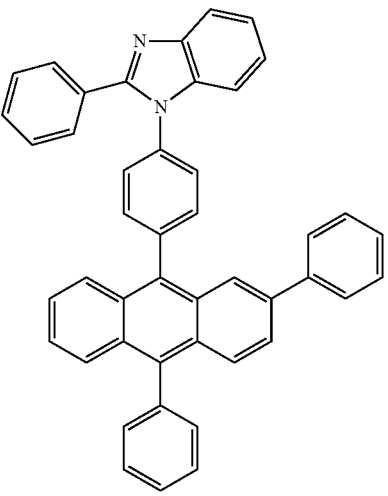
ET17
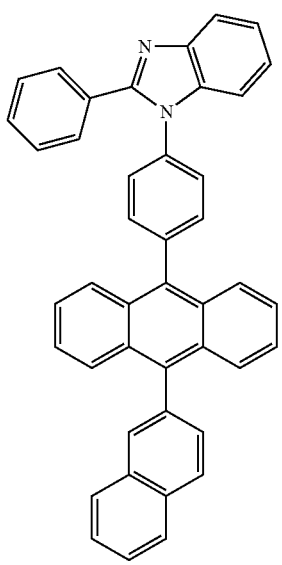
ET18
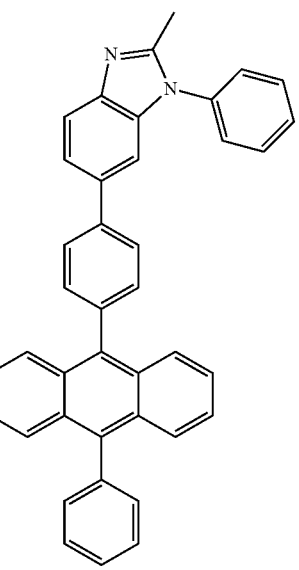

ET19
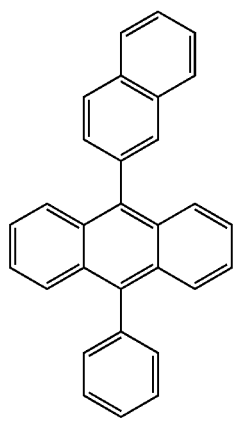
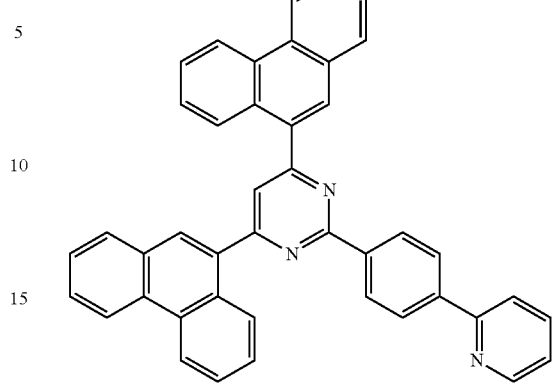
ET20
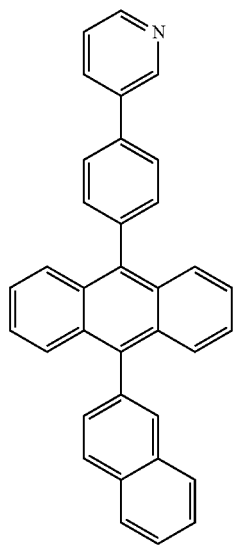
ET22
ET23
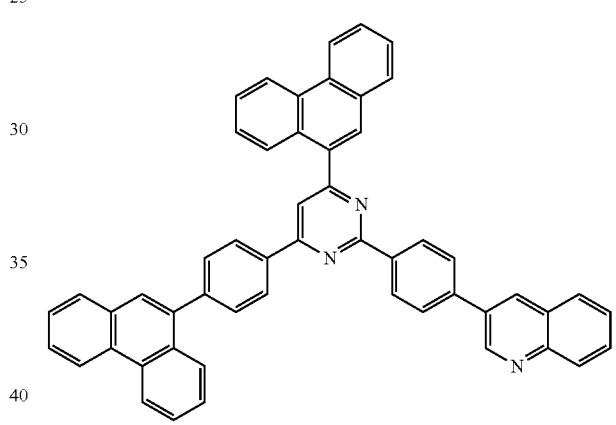
ET21
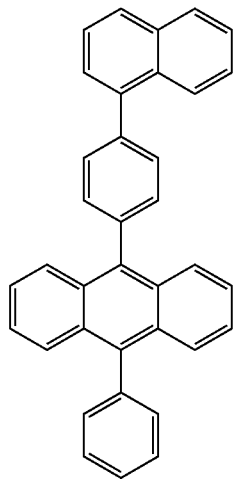
ET24
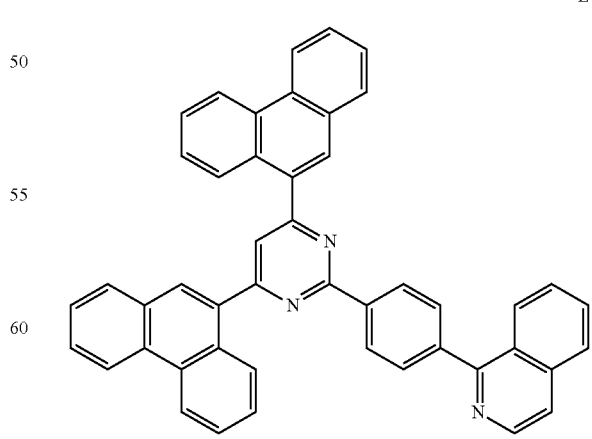

ET25
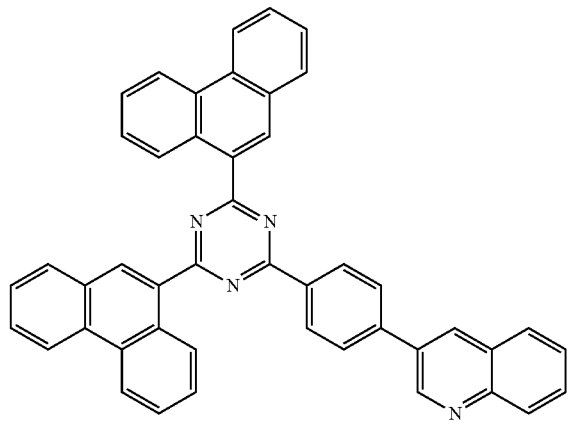
ET26
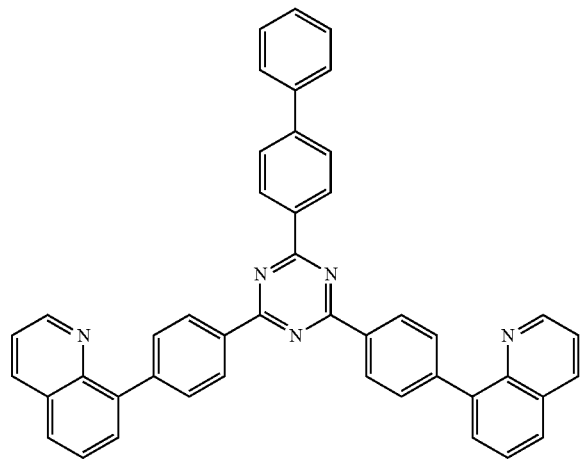
ET27
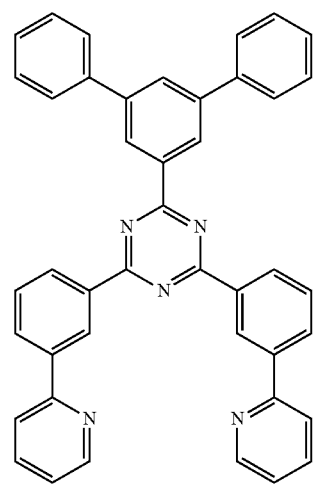
ET28
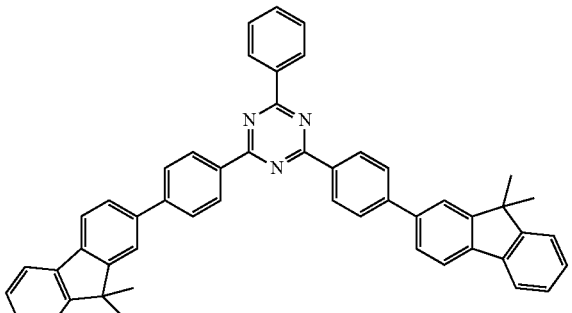
ET29
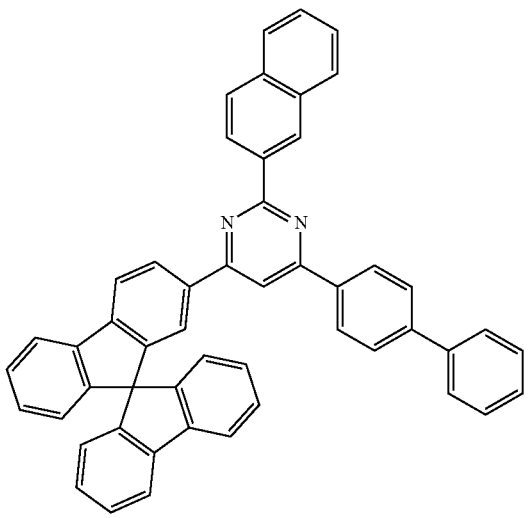
ET30

ET31
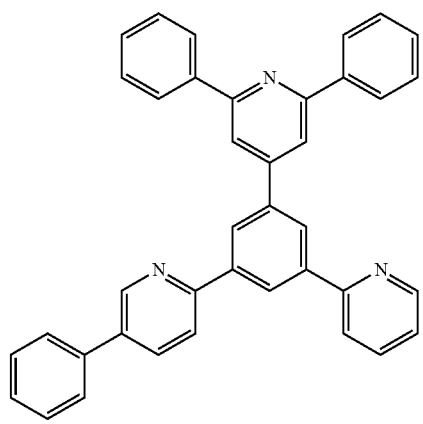
ET32
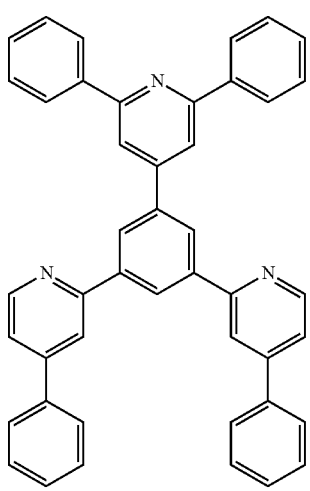
ET33
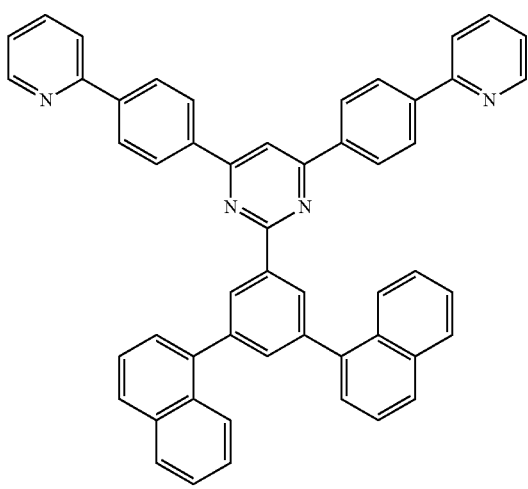
ET34
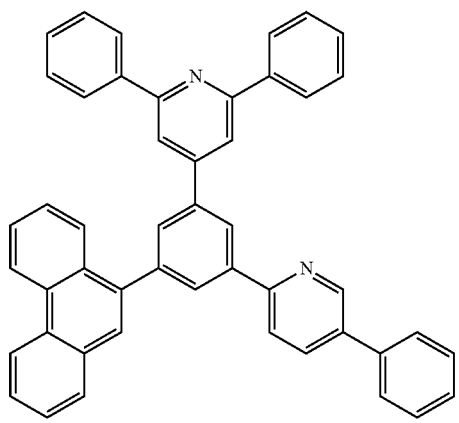
ET35
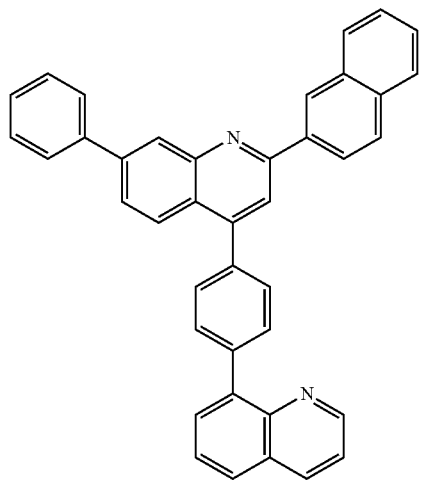
ET36
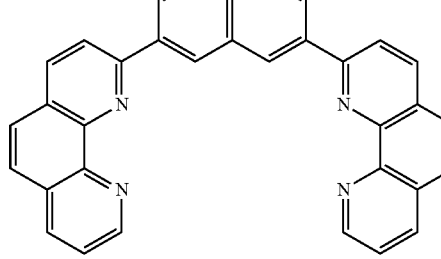
ET37
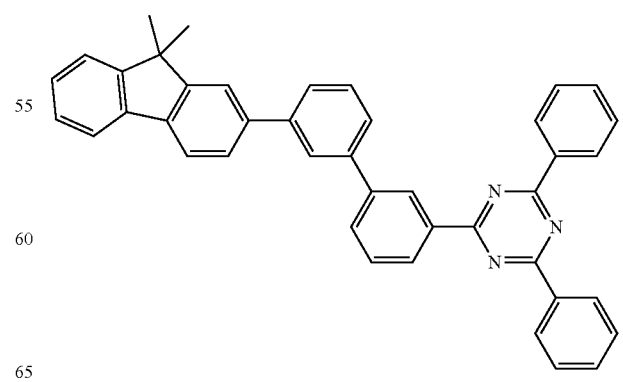

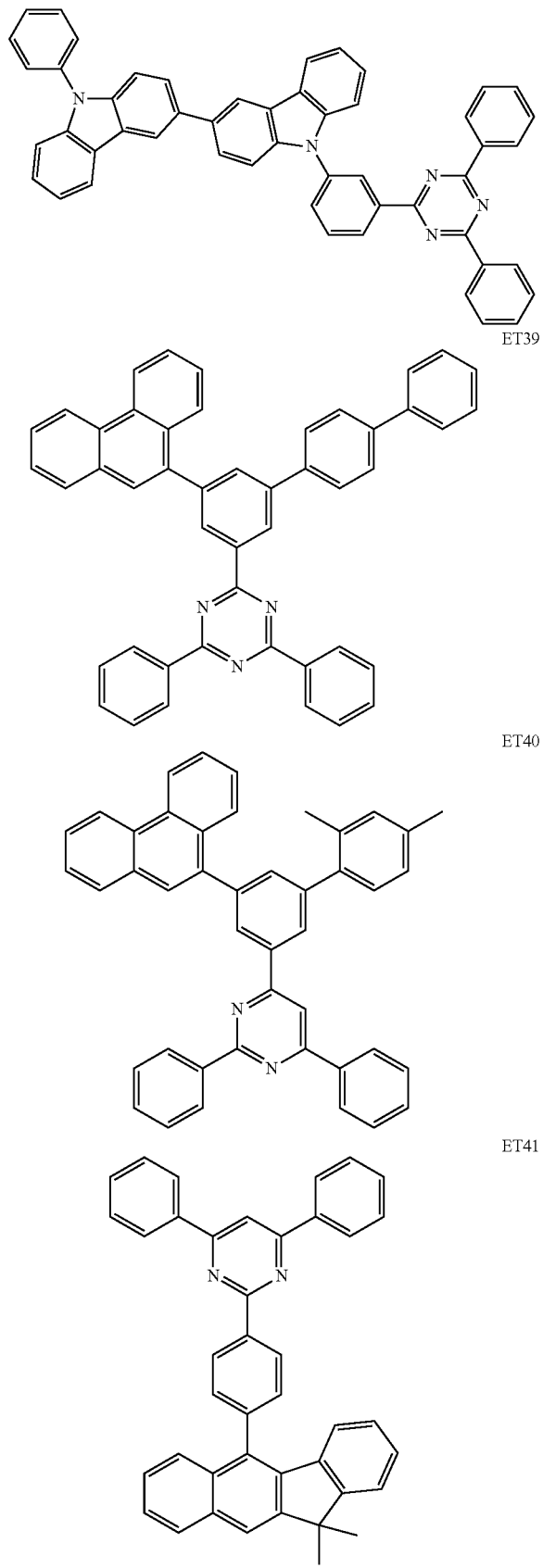

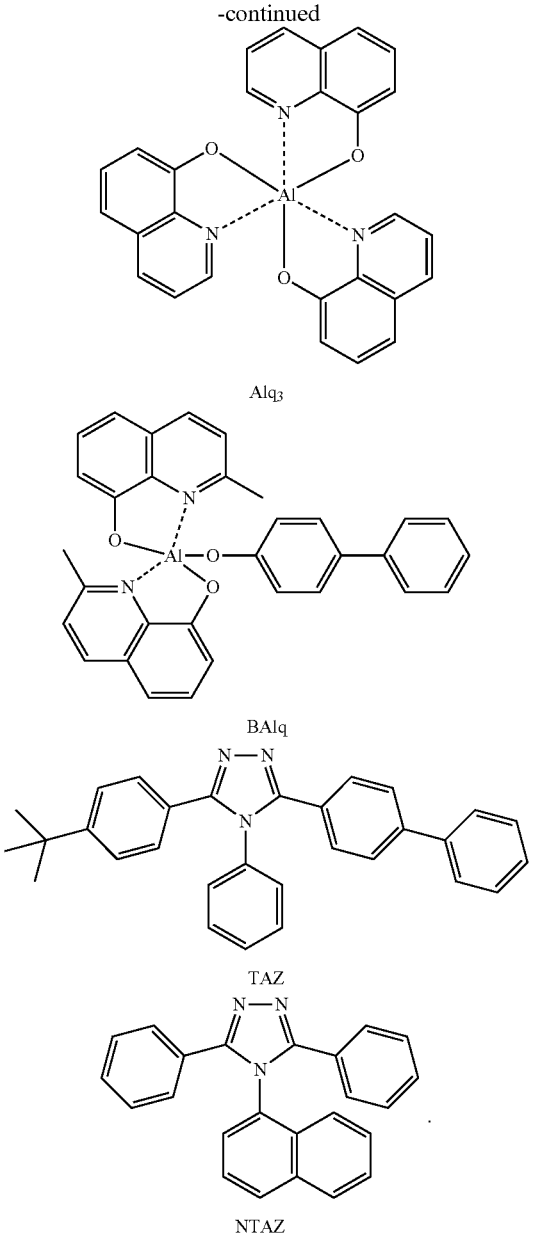

Alq₃

BAlq

TAZ

NTAZ

The thickness of the electron transport region 135 may be from about 100 Å to about 5,000 Å, for example, from about 100 Å to about 4,000 Å. When the electron transport region 135 includes a buffer layer, a hole blocking layer, an electron control layer, an electron transport layer, or any combination thereof, the thickness of the buffer layer, the hole blocking layer, or the electron control layer may each independently be from about 20 Å to about 1,000 Å, for example, from about 30 Å to about 300 Å, and the thickness of the electron transport layer may be from about 100 Å to about 1,000 Å, for example, from about 150 Å to about 500 Å. When the thicknesses of the buffer layer, the hole blocking layer, the electron control layer, the electron transport layer, and/or the electron transport region are within the above-described ranges, electron transport characteristics may be obtained without a substantial increase in driving voltage.

The electron transport region 135 (for example, the electron transport layer in the electron transport region 135) may further include, in addition to the materials described above, a metal-containing material.

The metal-containing material may include an alkali metal complex, an alkaline earth metal complex, or any combination thereof. The metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (lithium quinolate, Liq) or ET-D2:

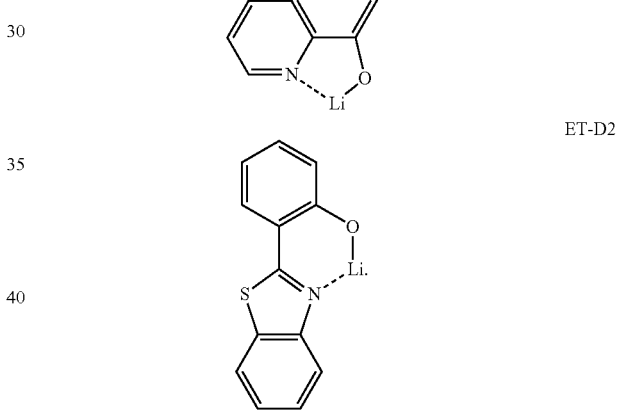

ET-D1

ET-D2

The electron transport region 135 may include an electron injection layer that facilitates the injection of electrons from the second electrode 150. The electron injection layer may be in direct contact with the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal oxide, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

The thickness of the electron injection layer may be in a range of about 1 Å to about 100 Å, and, for example, about 3 Å to about 90 Å. When the thickness of the electron injection layer is within the range described above, satisfactory electron injection characteristics may be obtained without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), an ITO, an IZO, or a combination thereof. The second electrode 150 may be a transmissive electrode, a semi-transmissive electrode, or a reflective electrode. The second electrode 150 may have a single-layered structure or a multi-layered structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer 133 of the interlayer 130 of the light-emitting device 10 may be extracted toward the outside through the first electrode 110, which is a semi-transmissive electrode or a transmissive electrode, and the first capping layer, or light generated in the emission layer 133 of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved. Each of the first capping layer and second capping layer may include a material having a refractive index (at 589 nm) of about 1.6 or more.

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In an embodiment, at least one of the first capping layer and the second capping layer may each independently include one of Compounds HT28 to HT33, one of Compounds CP1 to CP6, N4,N4'-di(naphthalen-2-yl)-N4,N4'-diphenyl-[1,1'-biphenyl]-4,4'-diamine (β-NPB), or any combination thereof:

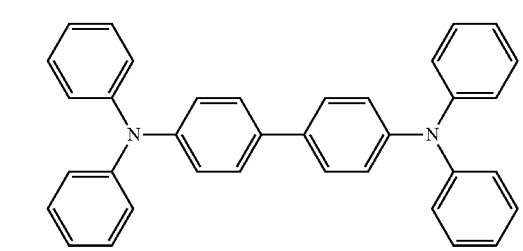
CP1

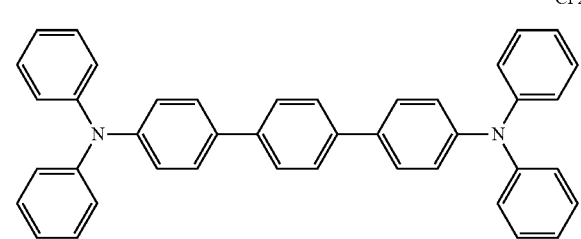
CP2

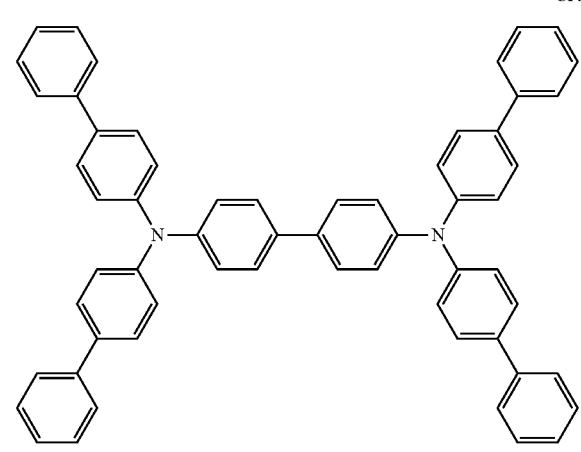
CP3

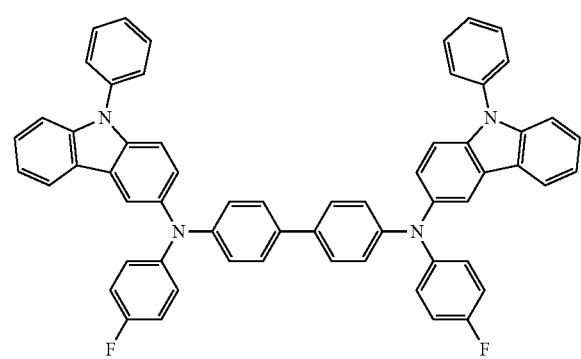
CP4

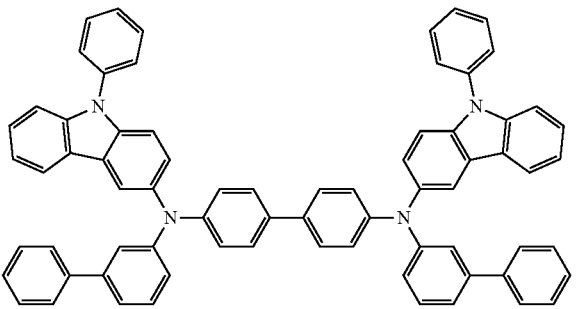
CP5

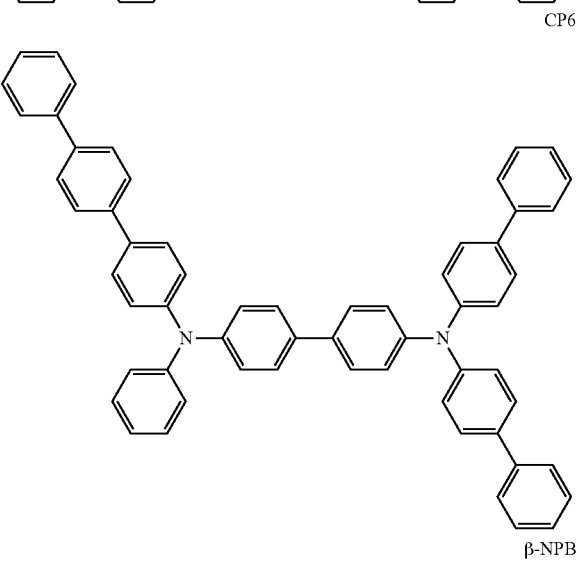
CP6

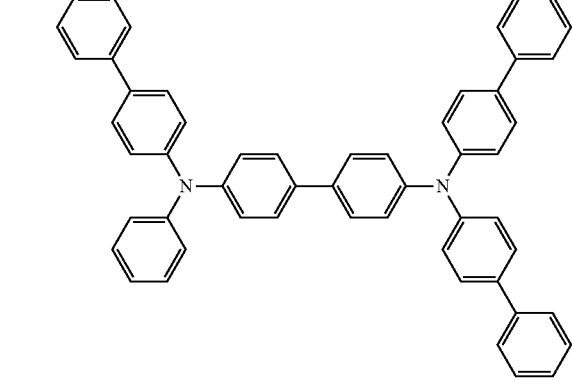
β-NPB

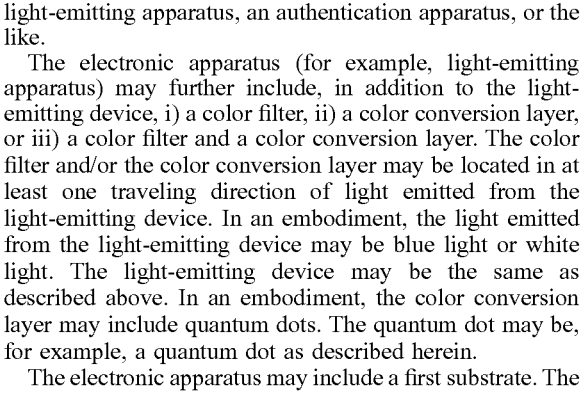

Electronic Apparatus

The light-emitting device may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, the light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film (or referred as "pixel-defining layer") may be located among the subpixel areas to define each of the subpixel areas. The color filter may further include a plurality of color filter areas and light-shielding patterns located among the color filter areas, and the color conversion layer may include a plurality of color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In detail, the first area may include a red quantum dot, the second area may include a green quantum dot, and the third area may not include a quantum dot. The quantum dot is the same as described herein. The first area, the second area, and/or the third area may each include a scatterer.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device. The thin-film transistor may further include a gate electrode, a gate insulating film, etc. The activation layer may include a crystalline silicon, an amorphous silicon, an organic semiconductor, an oxide semiconductor, or the like.

The electronic apparatus may further include a sealing portion for sealing the light-emitting device. The sealing portion may be placed between the color filter and/or the color conversion layer and the light-emitting device. The sealing portion allows light from the light-emitting device to be extracted to the outside, while simultaneously preventing ambient air and moisture from penetrating into the light-emitting device. The sealing portion may be a sealing substrate including a transparent glass substrate or a plastic substrate. The sealing portion may be a thin-film encapsulation layer including at least one layer of an organic layer and an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.). The authentication apparatus may further include, in addition to the light-emitting device, a biometric information collector.

The electronic apparatus may take the form of or be applied to various displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
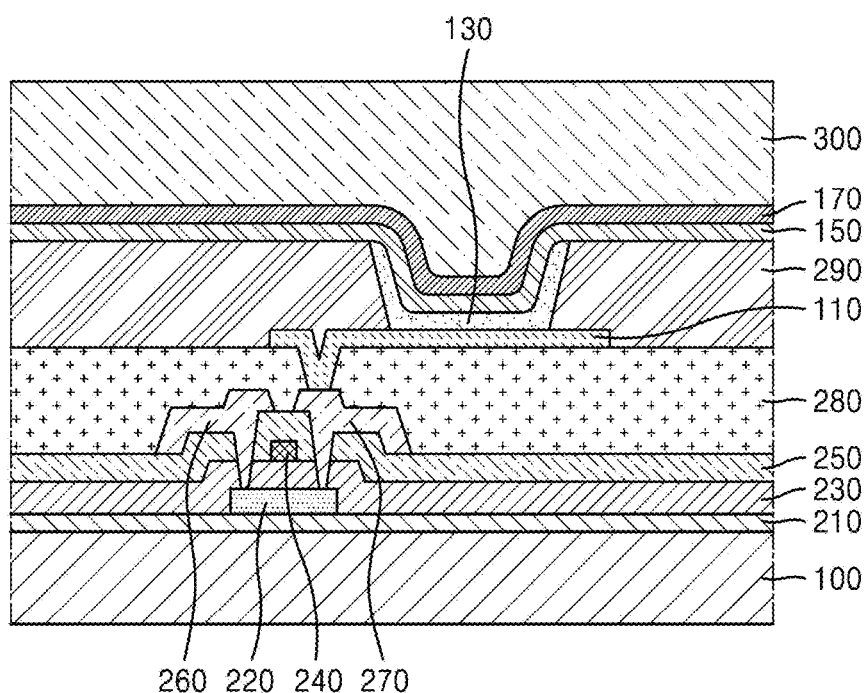
FIG. 2 is a schematic cross-sectional view of an embodiment of a light-emitting apparatus including a light-emitting device constructed according to the principles of the invention.
Figure 3:
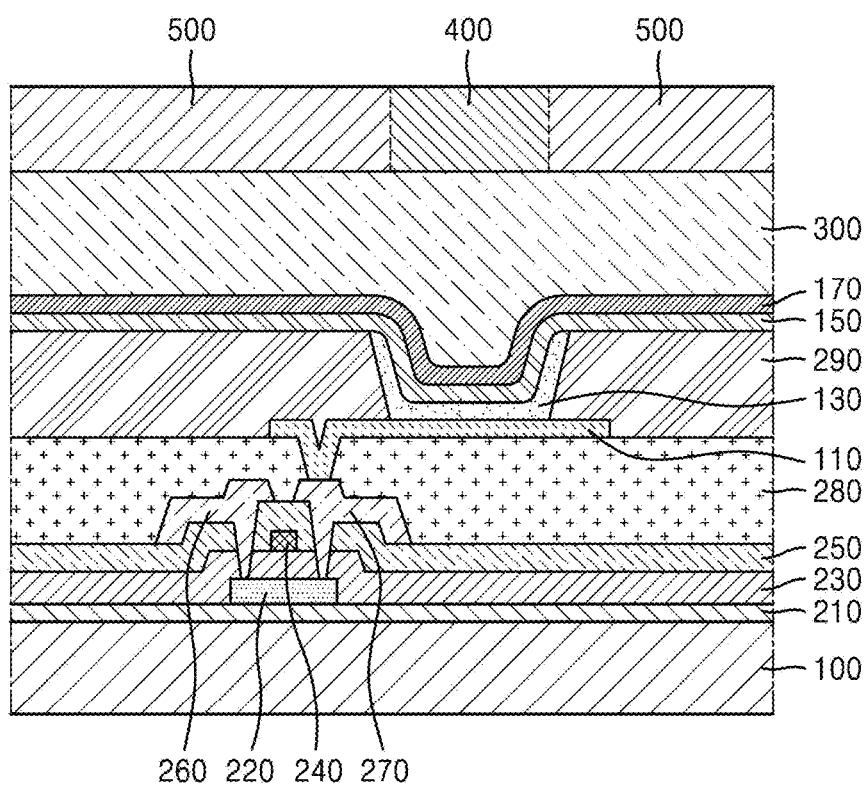
FIG. 3 is a schematic cross-sectional view of another embodiment of a light-emitting apparatus including a light-emitting device constructed according to the principles of the invention.

Description of FIGS. 2 and 3

FIG. 2 is a schematic cross-sectional view of an embodiment of a light-emitting apparatus including a light-emitting device constructed according to the principles of the invention.

The light-emitting apparatus of FIG. 2 includes a substrate 100, a thin-film transistor (TFT), a light-emitting device, and an encapsulation portion 300 that seals the light-emitting device. The substrate 100 may be a flexible substrate, a glass substrate, or a metal substrate. A buffer layer 210 may be formed on the substrate 100. The buffer layer 210 may prevent penetration of impurities through the substrate 100 and may provide a substantially flat surface on the substrate 100.

The TFT may be located on the buffer layer 210. The TFT may include an activation layer 220, a gate electrode 240, a source electrode 260, and a drain electrode 270. The activation layer 220 may include an inorganic semiconductor such as a silicon or a polysilicon, an organic semiconductor, or an oxide semiconductor, and may include a source region, a drain region and a channel region. A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device 10 to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may be a polyimide or a polyacrylic organic film. At least some layers of the interlayer 130 may extend beyond the upper portion of the pixel-defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device 10 to protect the light-emitting device from moisture or oxygen. The encapsulation portion 300 may include: an inorganic film including a silicon nitride ($SiN_x$), a silicon oxide ($SiO_x$), an indium tin oxide, an indium zinc oxide, or any combination thereof, an organic film including a polyethylene terephthalate, a polyethylene naphthalate, a polycarbonate, a polyimide, a polyethylene sulfonate, a polyoxymethylene, a polyarylate, a hexamethyldisiloxane, an acrylic resin (for example, a polymethyl methacrylate, a polyacrylic acid, or the like), an epoxy-based resin (for example, an aliphatic glycidyl ether (AGE), or the like), or a combination thereof; or a combination of the inorganic film and the organic film.

FIG. 3 is a schematic cross-sectional view of another embodiment of a light-emitting apparatus a light-emitting device constructed according to the principles of the invention.

The light-emitting apparatus of FIG. 3 is substantially the same as the light-emitting apparatus of FIG. 2, except that a light-shielding pattern 500 and a functional region 400 are additionally located on the encapsulation portion 300. The functional region 400 may be a combination of i) a color filter area, ii) a color conversion area, or iii) a combination of the color filter area and the color conversion area. In an embodiment, the light-emitting device 10 included in the light-emitting apparatus of FIG. 3 may be a tandem light-emitting device.

Method of Manufacturing Light-Emitting Device

A method of manufacturing a light-emitting device according to an embodiment includes: an operation (A) of forming a hole transport region on a first electrode; an operation (B) of forming an emission layer on the hole transport region; and an operation (C) of forming an electron transport region on the emission layer, and at least one of the operation (A) to the operation (C) includes a soluble process using the above-described nanoparticle ink composition.

In the method of manufacturing a light-emitting device according to an embodiment, the operation (A) may include a soluble process using the above-described nanoparticle ink composition, and the nanoparticle ink composition may include the above-described metal oxide. In the method of manufacturing a light-emitting device according to an embodiment, the operation (B) may include a soluble process using the above-described nanoparticle ink composition, and the nanoparticle ink composition may include the above-described quantum dot.

In the method of manufacturing a light-emitting device according to an embodiment, the operation (C) may include a soluble process using the above-described nanoparticle ink composition, and the nanoparticle ink composition may include the above-described metal oxide.

In an embodiment, the soluble process may be performed using an inkjet printing method. As an inkjet printer or the like used in the inkjet printing method, a known inkjet printer may be utilized. In the inkjet printing method, an inkjet printer having an inkjet head equipped with a piezo-type nozzle applying pressure according to a voltage may be utilized.

In more detail, the quantum dot composition is discharged from the nozzle of the inkjet head onto a substrate. In this regard, an amount of the quantum dot composition discharged may be from about 1 picoliter (pL) each time to about 50 pL each time, for example, from about 1 pL each time to about 30 pL each time, for example, from about 1 pL each time to about 20 pL each time.

The aperture of the inkjet head may be from about 5 μm to about 50 μm, for example, from about 10 μm to about 30 μm, to minimize clogging of the nozzle and improve discharge precision, but is not limited thereto. Discharge pressure of the inkjet head may be from about 1,000 $s^{-1}$ to about 10,000 $s^{-1}$ based on the shear rate, but is not limited thereto.

Although a temperature during formation of a coating film is not particularly limited, in terms of suppressing crystallization of a material included in the quantum dot composition, the temperature may be from about 10° C. to about 50° C., for example, from about 15° C. to about 40° C., for example, from about 15° C. to about 30° C., for example, from about 20° C. to about 25° C.

Because at least one of layers constituting a hole transport region, an emission layer, and layers constituting an electron transport region, which are included in a light-emitting device, is formed using the nanoparticle ink composition, a high-quality large-area light-emitting device including inorganic nanoparticles may be efficiently manufactured.

In an embodiment, in addition to layers formed by a soluble process using the above-described nanoparticle ink composition, the layers constituting the hole transport region, the emission layer, the layers constituting the electron transport region may each be formed in a certain region by using various methods such as vacuum deposition, spin coating, casting, Langmuir-Blodgett (LB) deposition, ink-jet printing, laser-printing, and laser-induced thermal imaging (LITI).

When layers constituting the hole transport region 131, the emission layer 133, and layers constituting the electron transport region 135 are formed by vacuum deposition, the vacuum deposition may be performed at a deposition temperature of about 100° C. to about 500° C., a vacuum degree of about 108 torr to about $10^{-3}$ torr, and a deposition speed of about 0.01 Å/sec to about 100 Å/sec, depending on a material to be included in a layer to be formed and the structure of a layer to be formed.

Definition of Terms

The term "room temperature" as used herein refers to about 25° C.

The term "chelating ligand" as used herein refers to a ligand with two or more sites that is capable of coordination to a metal-based material.

The term "Group I" used herein may include Group IB elements on the IUPAC periodic table, and Group I elements may include, for example, copper (Cu), silver (Ag), gold (Au), and the like.

The term "Group II" used herein may include a Group IIA element and a Group IIB element on the IUPAC periodic table, and the Group II element includes, for example, magnesium (Mg), calcium (Ca), zinc (Zn), cadmium (Cd), and mercury (Hg).

The term "Group III" used herein may include a Group IIIA element and a Group IIIB element on the IUPAC periodic table, and the Group III element may include, for example, aluminum (Al), gallium (Ga), indium (In), and thallium (Tl).

The term "Group IV" used herein may include a Group IVA element and a Group IVB element on the IUPAC periodic table, and the Group II element includes, for example, carbon (C), silicon (Si), germanium (Ge), tin (Sn), and lead (Pb).

The term "Group V" used herein may include a Group VA element and a Group VB element on the IUPAC periodic table, and the Group V element may include, for example, nitrogen (N), phosphorus (P), arsenic (As), and antimony (Sb).

The term "Group VI" used herein may include a Group VIA element and a Group VIB element on the IUPAC periodic table, and the Group VI element may include, for example, sulfur (S), selenium (Se), and tellurium (Te).

The term "interlayer" as used herein refers to a single layer and/or all layers between a first electrode and a second electrode of a light-emitting device. A material included in the "interlayer" is not limited to an organic material.

The term "$C_3$-$C_{60}$ carbocyclic group" as used herein refers to a cyclic group consisting of carbon only and having three to sixty carbon atoms, and the term "$C_1$-$C_{60}$ heterocyclic group" as used herein refers to a cyclic group that has one to sixty carbon atoms and further has, in addition to carbon, a heteroatom. The $C_3$-$C_{60}$ carbocyclic group and the $C_1$-$C_{60}$ heterocyclic group may each be a monocyclic group consisting of one ring or a polycyclic group in which two or more rings are fused with each other. In an embodiment, the number of ring-forming atoms of the $C_1$-$C_{60}$ heterocyclic group may be from 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

In an embodiment, the $C_3$-$C_{60}$ carbocyclic group may be i) a group T1 or ii) a fused cyclic group in which two or more groups T1 are fused with each other, for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spirobifluorene group, a benzofluorene group, an indenophenanthrene group, or an indenoanthracene group.

The $C_1$-$C_{60}$ heterocyclic group may be i) a group T2, ii) a fused cyclic group in which two or more groups T2 are fused with each other, or iii) a fused cyclic group in which at least one group T2 and at least one group T1 are fused with each other, for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.

The π electron-rich $C_3$-$C_{60}$ cyclic group may be i) a group T1, ii) a fused cyclic group in which two or more groups T1 are fused with each other, iii) group T3, iv) a fused cyclic group in which two or more groups T3 are fused with each other, or v) a fused cyclic group in which at least one group T3 and at least one group T1 are fused with each other, for example, the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.

The π electron-deficient nitrogen-containing $C_1$-$C_{60}$ cyclic group may be i) a group T4, ii) a fused cyclic group in which two or more group T4 are fused with each other, iii) a fused cyclic group in which at least one group T4 and at least one group T1 are fused with each other, iv) a fused cyclic group in which at least one group T4 and at least one group T3 are fused with each other, or v) a fused cyclic group in which at least one group T4, at least one group T1, and at least one group T3 are fused with one another, for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.

The group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein refers to a group fused to any cyclic group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a divalent non-aromatic fused heteropolycyclic group.

The term "$C_1$-$C_{60}$ alkyl group" as used herein refers to a linear or branched aliphatic saturated hydrocarbon monovalent group that has one to sixty carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" used herein refers to a monovalent cyclic group that has three to ten carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The term "monovalent non-aromatic fused polycyclic group" as used herein refers to a monovalent group having two or more rings fused to each other, only carbon atoms (for example, having 8 to 60 carbon atoms) as ring-forming atoms, and non-aromaticity in its molecular structure when considered as a whole. Examples of the monovalent non-aromatic fused polycyclic group include an indenyl group, a fluorenyl group, a spiro-bifluorenyl group, a benzofluorenyl group, an indenophenanthrenyl group, and an indeno anthracenyl group. The term "divalent non-aromatic fused polycyclic group" as used herein refers to a divalent group having a structure corresponding to a monovalent non-aromatic fused polycyclic group.

The term "monovalent non-aromatic fused heteropolycyclic group" as used herein refers to a monovalent group having two or more rings fused to each other, at least one heteroatom other than carbon atoms (for example, having 1 to 60 carbon atoms), as a ring-forming atom, and non-aromaticity in its molecular structure when considered as a whole. Examples of the monovalent non-aromatic fused heteropolycyclic group include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having a structure corresponding to a monovalent non-aromatic fused heteropolycyclic group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

$R_{10a}$ may be:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_{11}$ to $Q_{13}$, $Q_{21}$ to $Q_{23}$, and $Q_{31}$ to $Q_{33}$ used herein may each independently be: hydrogen; deuterium; —F; —Cl; —Br; —I; a hydroxyl group; a cyano group; a nitro group;

a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom include O, S, N, P, Si, B, Ge, Se, or any combination thereof.

The term "Ph" as used herein refers to a phenyl group, the term "Me" as used herein refers to a methyl group, the term "Et" as used herein refers to an ethyl group, the term "tert-Bu" or "But" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". The "terphenyl group" is a substituted phenyl group having, as a substituent, a $C_6$-$C_{60}$ aryl group substituted with a $C_6$-$C_{60}$ aryl group.

\* and \*' as used herein, unless defined otherwise, each refer to a binding site to a neighboring atom in a corresponding formula.

EXAMPLES

Synthesis of ZnO Nanoparticle

A solution obtained by dissolving tetrametylammonium hydroxide (10 mmol) in 10 ml of ethanol was added dropwise to a solution obtained by dissolving zinc acetate (10 mmol) in 40 ml of dimethyl sulfoxide (DMSO), and the resultant was mixed and reacted for 1 hour at about normal pressure and temperature conditions (about 1 atmosphere and about 20° C.).

After the reaction is completed, acetone was added to perform centrifugation and the resultant was dispersed in ethanol, to thereby synthesize a ZnO nanoparticle.

Synthesis Example 1: Preparation of Nano Composite

ZnO (diameter: 5 nm) as an inorganic nanoparticle and Ligand 1 as a ligand were mixed at a weight ratio of 2:1 and subjected to ultrasonic treatment (by SD-100H from Sungdong Ultrasonic Co. Ltd) at room temperature (about 20° C.) for 30 minutes, to thereby prepare Nano Composite 1.

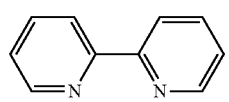

1

Synthesis Example 2: Preparation of Nano Composite

ZnO (diameter: 5 nm) as an inorganic nanoparticle and Ligand 2 as a ligand were mixed at a weight ratio of 2:1 and subjected to ultrasonic treatment at room temperature for 30 minutes, to thereby prepare Nano Composite 2.

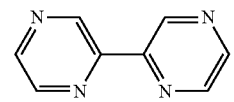

2

Synthesis Example 3: Preparation of Nano Composite

ZnO (diameter: 5 nm) as an inorganic nanoparticle and Ligand 3 as a ligand were mixed at a weight ratio of 2:1 and subjected to ultrasonic treatment at room temperature for 30 minutes, to thereby prepare Nano Composite 3.

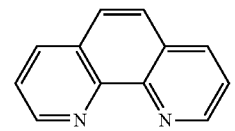

3

Synthesis Example 4: Preparation of Nano Composite

ZnO (diameter: 5 nm) as an inorganic nanoparticle and Ligand 4 as a ligand were mixed at a weight ratio of 2:1 and subjected to ultrasonic treatment at room temperature for 30 minutes, to thereby prepare Nano Composite 4.

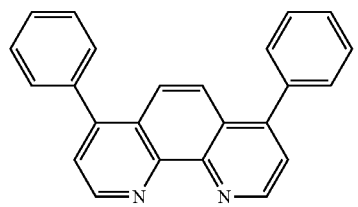

4

Synthesis Example 5: Preparation of Nano Composite

ZnO (diameter: 5 nm) as an inorganic nanoparticle and Ligand 5 as a ligand were mixed at a weight ratio of 2:1 and subjected to ultrasonic treatment at room temperature for 30 minutes, to thereby prepare Nano Composite 5.

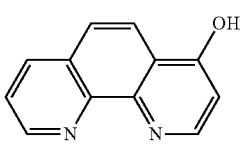

5

Synthesis Example 6: Preparation of Nano Composite

ZnO (diameter: 5 nm) as an inorganic nanoparticle and Ligand 6 as a ligand were mixed at a weight ratio of 2:1 and subjected to ultrasonic treatment at room temperature for 30 minutes, to thereby prepare Nano Composite 6.

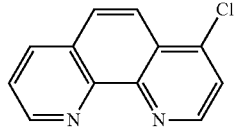

Comparative Synthesis Example 1: Preparation of Nano Composite

Nano Composite A was prepared in the same manner as in Synthesis Example 1, except that ethanolamine was used as a ligand.

Comparative Synthesis Example 2: Preparation of Nano Composite

Nano Composite B was prepared in the same manner as in Synthesis Example 1, except that benzylamine was used as a ligand.

Evaluation Example 1: Dispersity Evaluation

Dispersions of the nano composites prepared in Synthesis Example 1 and Comparative Synthesis Example 1 and 2 were evaluated. As a solvent used in the dispersity evaluation, toluene was utilized in Synthesis Example 1 and Comparative Synthesis Example 2, and ethanol was utilized in Comparative Synthesis Example 1, according to a ligand structure used.

Figure 4A:
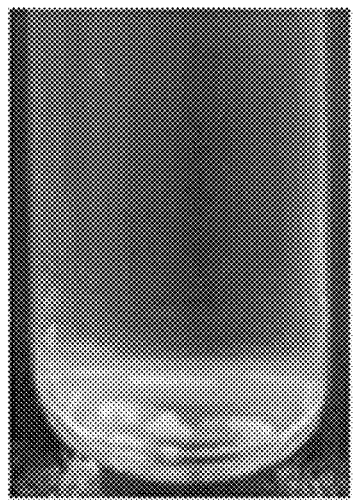
FIGS. 4A to 4C are photographic results of dispersions of nano composites of Synthesis Example 1 made according to the principles of the invention and Comparative Synthesis Examples 1 and 2.
Figure 4B:
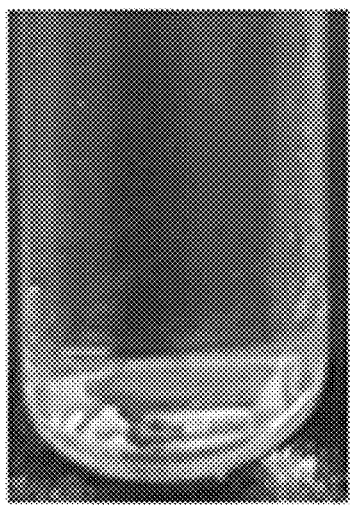
Figure 4C:
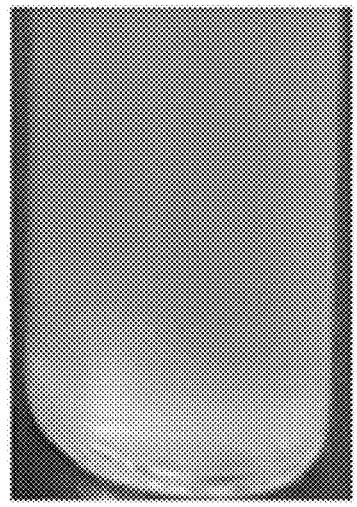

FIGS. 4A to 4C are photographic results of dispersions of nano composites of Synthesis Example 1 made according to the principles of the invention and Comparative Synthesis Examples 1 and 2.

Results obtained after a nano composite is dispersed in each solvent are shown in FIGS. 4A to 4C. FIGS. 4A to 4C show dispersibility being secured, in the cases of Synthesis Example 1 and Comparative Synthesis Example 1, but precipitation occurred in cases of Comparative Synthesis Example 2.

Evaluation Example 2: Evaluation of Ink Discharge

Based on the dispersity evaluation, ink discharge with respect to the nano composites of Synthesis Example 1 and Comparative Synthesis Example 1 was evaluated. An ink solvent has orthogonality with a lower quantum dot (QD) layer during device fabrication, ethyl methyl benzoate was used in Synthesis Example 1 according to a ligand structure used, and triethylene glycol monomethyl ether (TGME) was used in Comparative Synthesis Example 1.

Figure 5A:
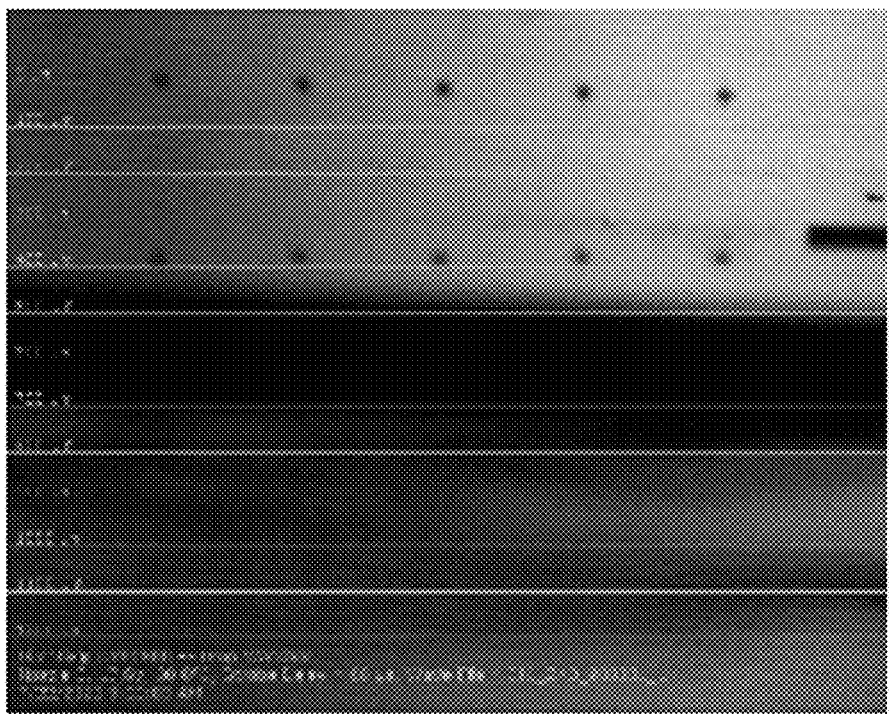
FIGS. 5A and 5B are photographic results of ink discharges of nano composites according to Synthesis Example 1 made according to the principles of the invention and Comparative Synthesis Example 1.
Figure 5B:

FIGS. 5A and 5B are photographic results of ink discharges of nano composites according to Synthesis Example 1 made according to the principles of the invention and Comparative Synthesis Example 1.

The results of the evaluation of ink discharge are shown in FIGS. 5A (Synthesis Example 1) and 5B (Comparative Synthesis Example 1). FIGS. 5A and 5B show the significant and unexpected results of that the ink being well discharged without inkjet head clogging in Synthesis Example 1, while inkjet head clogging occurred in Comparative Synthesis Example 1.

Some of the advantages that may be achieved by illustrative implementations of the invention and/or illustrative methods of the invention include securing stability by introducing a chelating ligand into the nano composite to prevent aggregation of metal oxide nanoparticles. Also, a chelating ligand may be introduced into the nano composite to change the state of a surface of a metal oxide nanoparticle, and thus a solvent for preparing an ink composition may be variously selected.

A light-emitting device includes a layer formed by a nanoparticle ink composition including the nano composite made according to the principles and embodiments of the invention, and when the light-emitting device includes a quantum dot, quantum dot quenching may be reduced by minimizing direct contact between the quantum dot and a metal oxide nanoparticle. In a case of forming a layer included in embodiments of the light-emitting device by using a nanoparticle ink composition including the nano composite, charge injection characteristics may be appropriately adjusted.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A nano composite comprising:
a metal oxide nanoparticle; and
a chelating ligand bonded to a surface of the nanoparticle and comprising a cyclic moiety;
wherein the metal oxide nanoparticle comprises ZnO, ZnMgO, ZnAlO, $TiO_2$, or any combination thereof,
wherein the chelating ligand is any one selected from among Formulae 1-1 to 1-4:

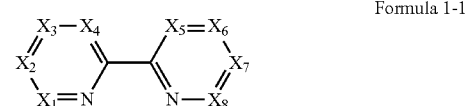

Formula 1-1

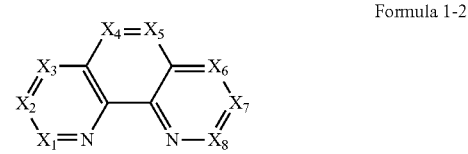

Formula 1-2

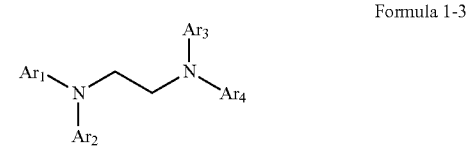

Formula 1-3

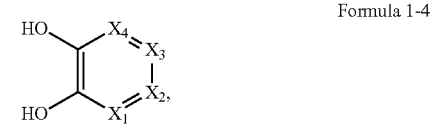

Formula 1-4 wherein, in Formulae 1-1 and 1-2,
$X_1$ is $C(R_1)$ or N, $X_2$ is $C(R_2)$ or N, $X_3$ is $C(R_3)$ or N, $X_4$ is $C(R_4)$ or N, $X_5$ is $C(R_5)$ or N, $X_6$ is $C(R_6)$ or N, $X_7$ is $C(R_7)$ or N, and $X_8$ is $C(R_8)$ or N, wherein, in Formula 1-4, $X_1$ is $C(R_1)$ or N, $X_2$ is N, $X_3$ is $C(R_3)$ or N, $X_4$ is $C(R_4)$ or N, wherein, in Formulae 1-1, 1-3 and 1-4, $R_1$ to $R_8$ and $Ar_1$ to $Ar_4$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein, in Formula 1-2, $R_1$ to $R_5$, $R_7$, $R_8$ and $Ar_1$ to $Ar_4$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and $R_6$ is —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein, in Formula 1-1 to 1-4, at least one of $Ar_1$ to $Ar_4$ is, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ is:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The nano composite of claim 1, wherein the cyclic moiety is a delocalized group.

3. The nano composite of claim 1, wherein the cyclic moiety is a TT electron-deficient nitrogen-containing $C_1$-$C_{60}$ cyclic group.

4. The nano composite of claim 1, wherein the chelating ligand comprises two or more anchoring sites bonded to the surface of the nanoparticle.

5. The nano composite of claim 1, wherein the chelating ligand comprises at least one of Ligand 1, Ligand 2, Ligand 5, or Ligand 6:

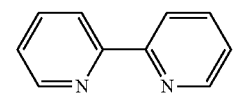

1

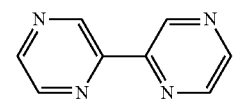

2

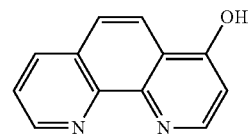

5

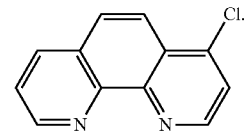

6

6. The nano composite of claim 1, wherein the chelating ligand has a length of about 1.5 nm or less.

7. The nano composite of claim 1, further comprising a monodentate ligand bonded to the surface of the nanoparticle.

8. The nano composite of claim 7, wherein the monodentate ligand comprises a pyridine group, an imidazole group, an oxazole group, or any combination thereof.

9. A nanoparticle ink composition comprising:
a solvent; and
the nano composite according to claim 1, wherein the nano composite is substantially dispersed in the solvent.

10. The nanoparticle ink composition of claim 9, wherein the solvent comprises an alcohol-based solvent, an ether-based solvent, an aliphatic hydrocarbon solvent, an aromatic hydrocarbon solvent, or any combination thereof.

11. The nanoparticle ink composition of claim 9, wherein the nanoparticle ink composition has a viscosity at 25° C. of about 1 cP or more and about 10 cP or less.

12. The nanoparticle ink composition of claim 9, wherein the nanoparticle ink composition at 25° C. has a surface tension from about 20 dyne/cm to about 40 dyne/cm.

13. A light-emitting device comprising:
a first electrode;
a second electrode facing the first electrode; and
an interlayer between the first electrode and the second electrode,
wherein the interlayer comprises an emission layer, and
at least one layer included in the interlayer is made from the nanoparticle ink composition according to claim 9.

14. The light-emitting device of claim 13, wherein the interlayer further comprises a hole transport region between the first electrode and the emission layer and an electron transport region between the emission layer and the second electrode.

15. The light-emitting device of claim 14, wherein the hole transport region comprises a hole injection layer, a hole transport layer, an emission auxiliary layer, an electron blocking layer, or any combination thereof,
the electron transport region comprises a buffer layer, a hole blocking layer, an electron control layer, an electron transport layer, an electron injection layer, or any combination thereof, and
at least one layer included in the hole transport region and the electron transport region is made from the nanoparticle ink composition.

16. The light-emitting device of claim 14, wherein the electron transport region comprises an electron transport layer, and the electron transport layer is made from the nanoparticle ink composition.

17. The light-emitting device of claim 13, wherein the emission layer comprises a quantum dot.

18. The light-emitting device of claim 17, wherein the quantum dot comprises a semiconductor compound of Groups III-VI, a semiconductor compound of Groups II-VI, a semiconductor compound of Groups III-V, a semiconductor compound of Groups I-III-VI, a semiconductor compound of Groups IV-VI, an element or a compound of Group IV, or any combination thereof.

19. A nano composite comprising:
a metal oxide nanoparticle;
a chelating ligand bonded to a surface of the nanoparticle and comprising a cyclic moiety; and
a monodentate ligand bonded to the surface of the nanoparticle and comprising an imidazole group, an oxazole group, or any combination thereof,
wherein,
the chelating ligand is any one selected from among Formulae 1-1 to 1-4:

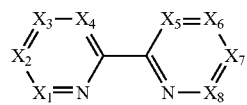

Formula 1-1

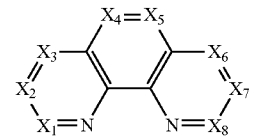

Formula 1-2

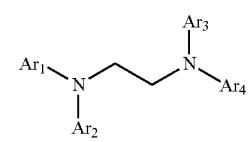

Formula 1-3

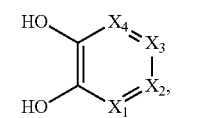

Formula 1-4 wherein, in Formulae 1-1 and 1-2,
$X_1$ is $C(R_1)$ or N, $X_2$ is $C(R_2)$ or N, $X_3$ is $C(R_3)$ or N, $X_4$ is $C(R_4)$ or N, $X_5$ is $C(R_5)$ or N, $X_6$ is $C(R_6)$ or N, $X_7$ is $C(R_7)$ or N, and $X_8$ is $C(R_8)$ or N,
wherein, in Formula 1-4,
$X_1$ is $C(R_1)$ or N, $X_2$ is N, $X_3$ is $C(R_3)$ or N, $X_4$ is $C(R_4)$ or N,
wherein, in Formulae 1-1, 1-3 and 1-4,
$R_1$ to $R_8$ and $Ar_1$ to $Ar_4$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$),
wherein, in Formula 1-2,
$R_1$ to $R_5$, $R_7$, $R_8$ and $Ar_1$ to $Ar_4$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and
$R_6$ is —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein, in Formula 1-1 to 1-4,
at least one of $Ar_1$ to $Ar_4$ is, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ is:
deuterium, —F, —Cl, —Br, —I, a hydroxyl group, a cyano group, or a nitro group,
a $C_1$-$C_{60}$ alkyl group, a $C_2$-$C_{60}$ alkenyl group, a $C_2$-$C_{60}$ alkynyl group, or a $C_1$-$C_{60}$ alkoxy group each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof,
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and
wherein $Q_1$ to $Q_3$, $Q_{11}$ to $Q_{13}$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

20. An electronic apparatus comprising a light-emitting device comprising:
a first electrode;
a second electrode opposite to the first electrode; and
an interlayer between the first electrode and the second electrode,
wherein the interlayer comprises an emission layer, and
at least one layer included in the interlayer is made from a nanoparticle ink composition comprising:
a solvent; and
a nano composite substantially dispersed in the solvent and comprising:
a metal oxide nanoparticle; and
a chelating ligand bonded to a surface of the nanoparticle and comprising a cyclic moiety;
wherein,
the metal oxide nanoparticle comprises ZnO, ZnMgO, ZnAlO, TiO$_2$, or any combination thereof,
the chelating ligand is any one selected from among Formulae 1-1 to 1-4:

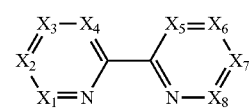

Formula 1-1

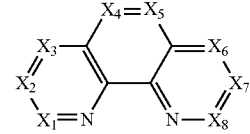

Formula 1-2

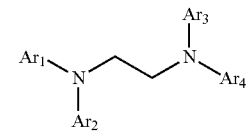

Formula 1-3

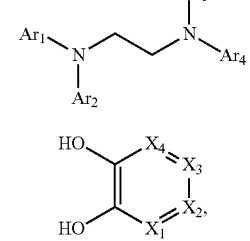

Formula 1-4 wherein, in Formulae 1-1 and 1-2,
$X_1$ is C($R_1$) or N, $X_2$ is C($R_2$) or N, $X_3$ is C($R_3$) or N, $X_4$ is C($R_4$) or N, $X_5$ is C($R_5$) or N, $X_6$ is C($R_6$) or N, $X_7$ is C($R_7$) or N, and $X_8$ is C($R_8$) or N,
wherein, in Formula 1-4,
$X_1$ is C($R_1$) or N, $X_2$ is N, $X_3$ is C($R_3$) or N, $X_4$ is C($R_4$) or N,
wherein, in Formulae 1-1, 1-3 and 1-4,
$R_1$ to $R_8$ and $Ar_1$ to $Ar_4$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$),
wherein, in Formula 1-2,
$R_1$ to $R_5$, $R_7$, $R_8$ and $Ar_1$ to $Ar_4$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and
$R_6$ is —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein, in Formula 1-1 to 1-4, at least one of $Ar_1$ to $Ar_4$ is, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ is:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

21. The electronic apparatus of claim 20, wherein the electronic apparatus comprises a thin film encapsulation layer and is a flexible electronic apparatus.

22. The electronic apparatus of claim 20, wherein the electronic apparatus is a component of displays, light sources, lighting, personal computers, mobile phones, digital cameras, electronic diaries, electronic dictionaries, electronic game machines, medical instruments, fish finders, measuring instruments, meters, projectors, or combinations thereof.

* * * * *